US006871943B2

(12) United States Patent
Ogawa

(10) Patent No.: US 6,871,943 B2
(45) Date of Patent: Mar. 29, 2005

(54) HEAD UNIT AND METHOD OF SETTING THE SAME; DRAWING SYSTEM; METHODS OF MANUFACTURING LIQUID CRYSTAL DISPLAY DEVICE, ORGANIC EL DEVICE, ELECTRON EMITTING DEVICE, PDP DEVICE, ELECTROPHORESIS DISPLAY DEVICE, COLOR FILTER, AND ORGANIC EL; AND METHODS OF FORMING SPACER, METAL WIRING, LENS, RESIST, AND LIGHT DIFFUSER

(75) Inventor: Masahiko Ogawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 148 days.

(21) Appl. No.: 10/319,570

(22) Filed: Dec. 16, 2002

(65) Prior Publication Data
US 2003/0132987 A1 Jul. 17, 2003

(30) Foreign Application Priority Data
Dec. 20, 2001 (JP) ........................................ 2001-388319

(51) Int. Cl.[7] .............................. B41J 2/17; B41J 2/175
(52) U.S. Cl. ........................................ 347/84; 347/85
(58) Field of Search ................................ 347/2, 20, 37, 347/50, 58, 84–87, 95

(56) References Cited

U.S. PATENT DOCUMENTS

| 4,502,059 A | * | 2/1985 | Blessington | 347/68 |
| 6,481,838 B1 | * | 11/2002 | Brugue et al. | 347/85 |
| 6,609,787 B1 | * | 8/2003 | Silverbrook et al. | 347/84 |

FOREIGN PATENT DOCUMENTS

JP          61063455 A  *  4/1986  ............... B41J/3/04

* cited by examiner

Primary Examiner—Stephen D. Meier
Assistant Examiner—An H. Do
(74) Attorney, Agent, or Firm—Oliff & Berridge, PLC

(57) ABSTRACT

A head unit for carrying out operations for connecting and disconnecting cables and tubes to and from a plurality of functional liquid droplet ejection heads has a wiring connection assembly carried on a carriage and having a plurality of wiring connectors to be connected to main cables and a plurality of separate cables having one end thereof connected to the respective functional liquid droplet ejection heads and an opposite end thereof connected to the respective wiring connectors, and a piping connection assembly having a plurality of piping joints to be connected to main pipes and a plurality of separate pipes having one end thereof connected to respective functional liquid droplet ejection heads and opposite end thereof connected to respective piping joints.

35 Claims, 43 Drawing Sheets

F I G. 9
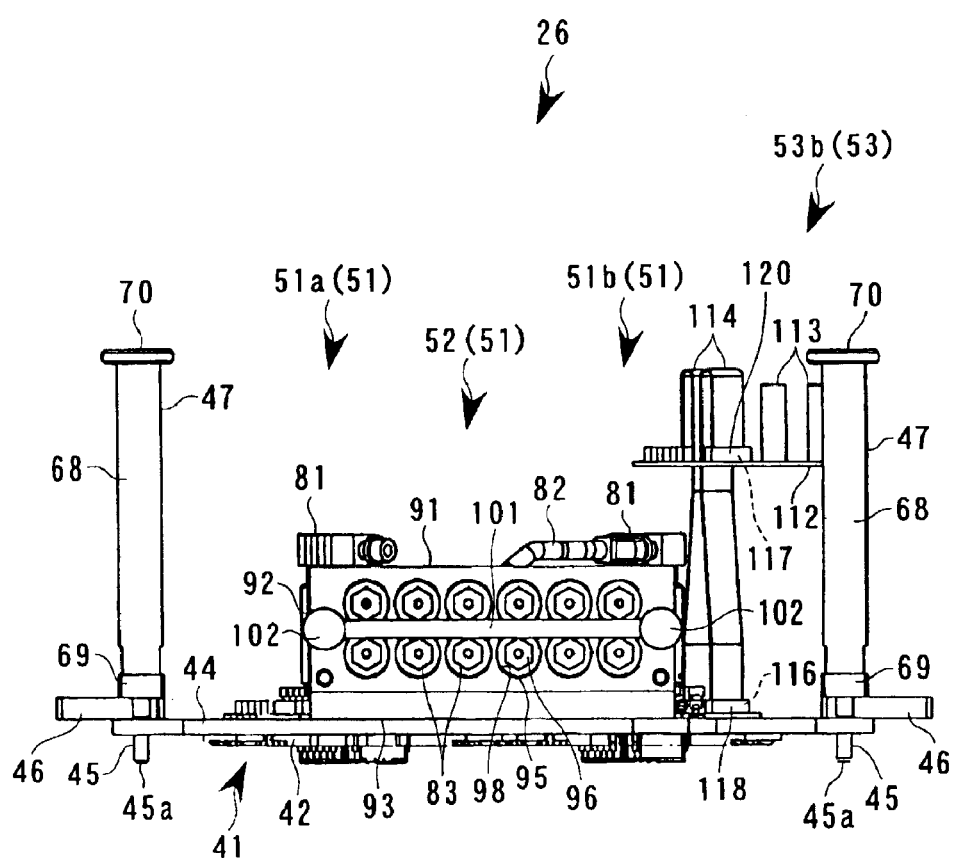

F I G. 1 2
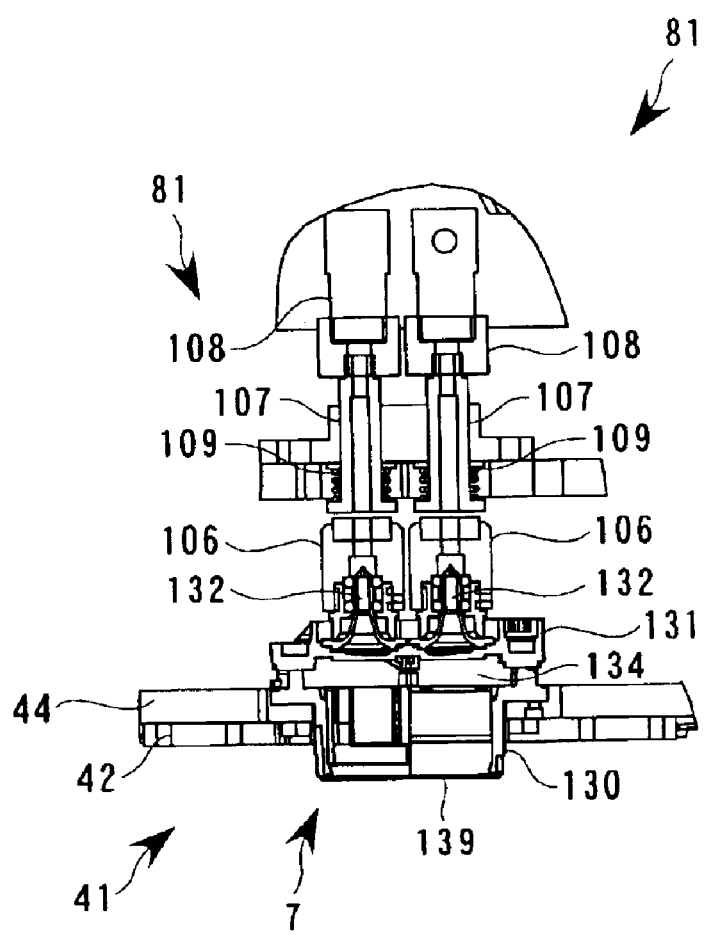

F I G. 15
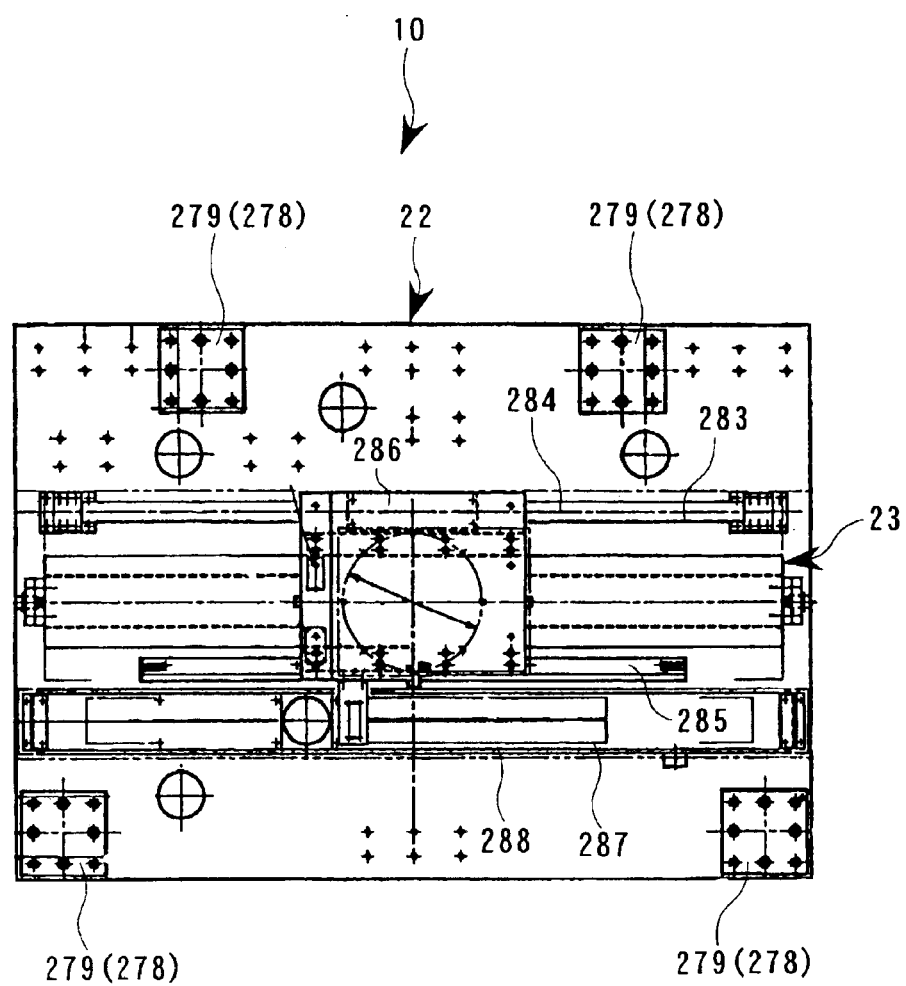

ADVANCING MOVEMENT ⟶
RETURNING MOVEMENT ⟵   X-AXIS DIRECTION

F I G. 3 0
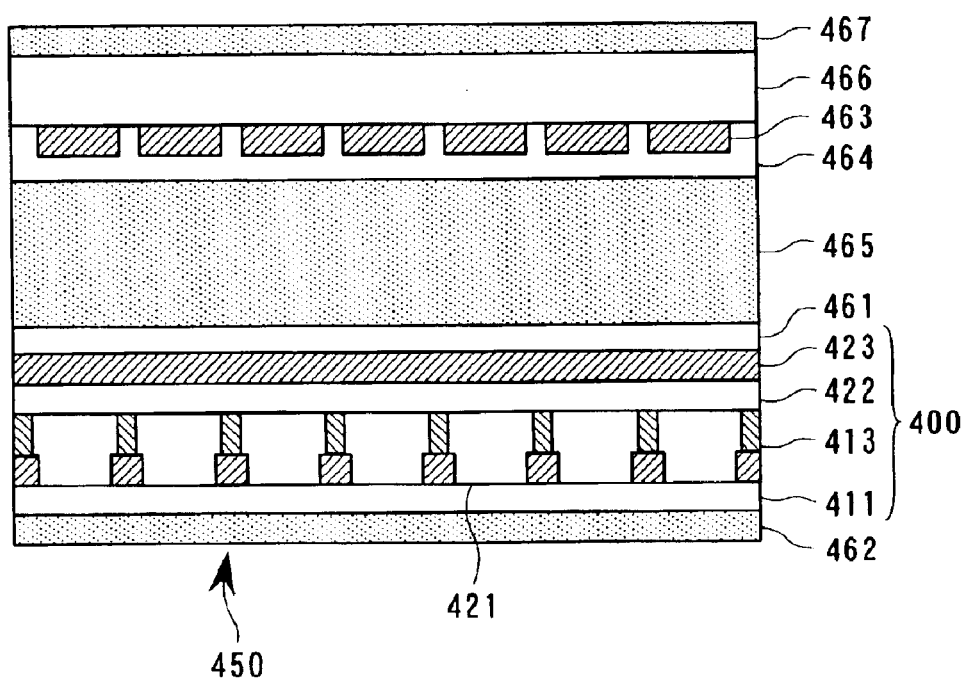

F I G. 3 4
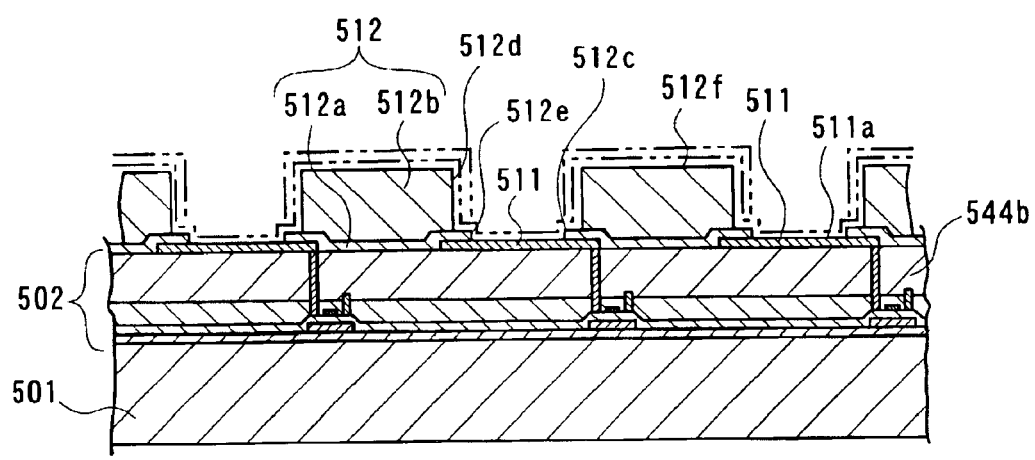

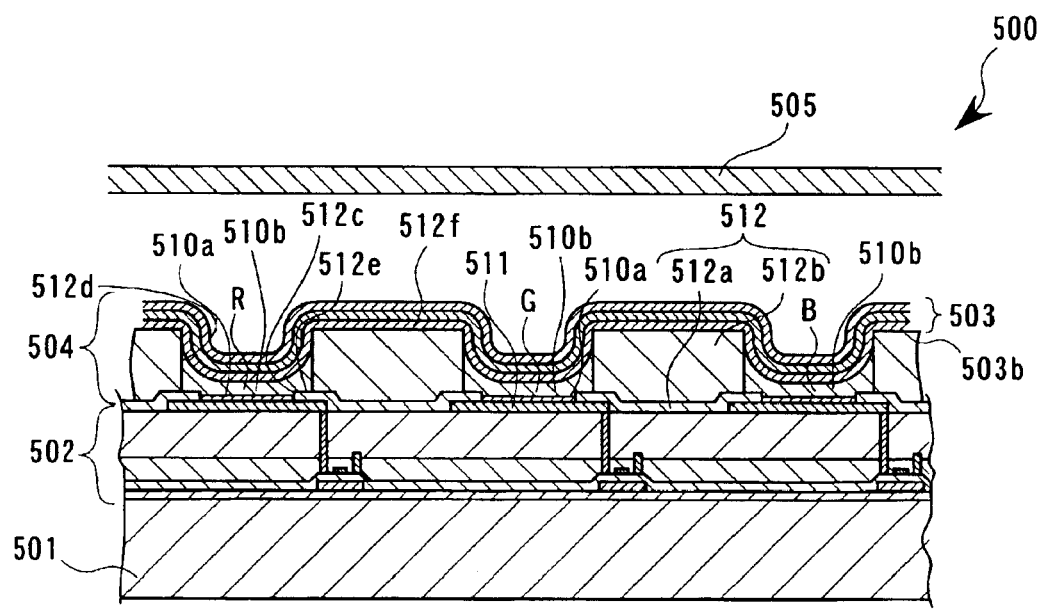
F I G. 4 3

HEAD UNIT AND METHOD OF SETTING THE SAME; DRAWING SYSTEM; METHODS OF MANUFACTURING LIQUID CRYSTAL DISPLAY DEVICE, ORGANIC EL DEVICE, ELECTRON EMITTING DEVICE, PDP DEVICE, ELECTROPHORESIS DISPLAY DEVICE, COLOR FILTER, AND ORGANIC EL; AND METHODS OF FORMING SPACER, METAL WIRING, LENS, RESIST, AND LIGHT DIFFUSER

BACKGROUND OF THE INVENTION

1. Field of the Invention

This invention relates to a head unit for carrying on a carriage a plurality of functional liquid droplet ejection heads as represented by ink jet heads and a method of setting the head unit; a drawing system; a method of manufacturing a liquid crystal display device, a method of manufacturing an organic electroluminescence (EL) device, a method of manufacturing an electron emitting device, a method of manufacturing a plasma display panel (PDP) device, a method of manufacturing an electrophoresis display, a method of manufacturing a color filter, and a method of manufacturing an organic EL; a spacer-forming method, a metal wiring-forming method, a lens-forming method, a resist-forming method, and a light diffuser-forming method.

2. Description of the Related Art

Conventionally, in a large-sized printer or the like, in view of a yield of functional liquid droplet ejection heads, all (one-line) ejection nozzles arranged in the sub-scanning direction are formed not by a single functional liquid droplet ejection head but by a plurality of functional liquid droplet ejection heads. In this case, the plurality of functional liquid droplet ejection heads are carried on a single carriage, and mounted, as a head unit, on a scanning drive system of a printer.

Incidentally, due to capability of accurately and selectively eject very small droplets from a nozzle array thereof, this kind of functional liquid droplet ejection head can be applied to the manufacturing of color filters of liquid crystal display devices, organic EL display devices, and so forth, and there is also an expectation that the same can be applied to apparatuses for manufacturing various electronic devices, optical devices, and so forth.

In view of such an applied technique, a head unit having a large number of functional liquid droplet ejection heads accurately installed on a single carriage is needed, and at the same time, depending on a liquid to be ejected or the like, the life of the functional liquid droplet ejection heads becomes short, which makes it necessary to give consideration to frequent replacement of the heads (head unit).

The replacement of functional liquid droplet ejection heads, to which are connected cables and tubes from the system side, involves operations for connecting and disconnecting these cables and tubes. Especially, in the case of a head unit carrying a large number of functional liquid droplet ejection heads, the same number of operations as the number of functional liquid droplet ejection heads (the number of nozzle arrays, to be exact) is necessitated for connecting and disconnecting the cables and tubes. These connecting and disconnecting operations are not only troublesome but are also subject to possible causes for a short circuit due to the adhesion to a head board of a functional liquid dropped from a tube during connecting operation or, depending on the functional liquid, to causes for corrosion of the board. Further, the system itself requires provision of a working space for the connecting and disconnecting operations.

It is an object of this invention to provide a head unit which makes it possible to properly and efficiently carry out operations for connecting and disconnecting cables and tubes to a plurality of functional liquid droplet ejection heads and a method of setting the head unit; a drawing system; a method of manufacturing a liquid crystal display device, a method of manufacturing an organic EL device, a method manufacturing an electron emitting device, a method of manufacturing a PDP device, a method of manufacturing an electrophoresis display device, a method of manufacturing a color filter, and a method of manufacturing an organic EL; and a spacer-forming method, a metal wiring-forming method, a lens-forming method, a resist-forming method, and a light diffuser-forming method.

SUMMARY OF THE INVENTION

The head unit of this invention has a plurality of functional liquid droplet ejection heads for selectively ejecting an introduced functional liquid from ejection nozzles, and a carriage for carrying the plurality of functional liquid droplet ejection heads, wherein a plurality of main cables connected to a head driver and a plurality of main pipes connected to a functional liquid tank are connected to the respective functional liquid droplet ejection heads. The head unit comprises: a wiring connection assembly carried on the carriage and comprising a plurality of wiring connectors to which the respective main cables are connected, and a plurality of separate cables one end of each being connected to a head board of the respective functional liquid droplet ejection heads and an opposite end of each being connected to the respective wiring connectors; and a piping connection assembly carried on the carriage and comprising a plurality of piping joints to which the respective main pipes are connected, and a plurality of separate pipes one end of each being connected to a functional liquid introducing port of the respective functional liquid droplet ejection heads and an opposite end of each being connected to the respective piping joints.

According to this arrangement, each of the main cables connected to the head driver is connected to each wiring connector of the wiring connection assembly, whereby the main cable is connected to the head board of each functional liquid droplet ejection head through a separate cable of the wiring connection assembly. Similarly, each of the main pipes connected to the functional liquid tank is connected to each piping joint of the piping connection assembly, whereby the main pipe is connected to a functional liquid introducing port of each functional liquid droplet ejection head. Therefore, by arranging the wiring connectors of the wiring connection assembly and the piping joints of the piping connection assembly, while giving consideration to connecting and disconnecting operations and leakage of the functional liquid, it is possible to easily and smoothly carry out operations for connecting and disconnecting the main cables and main pipes without causing any trouble.

In this case, preferably, the plurality of wiring connectors are intensively arranged in at least one location. Similarly, the plurality of piping joints are preferably intensively arranged in at least one location.

According to the above arrangement, the connecting and disconnecting operations for the main cables and main pipes can be intensively carried out in one location, whereby it is possible to efficiently carry out the connecting and disconnecting operations for the main cables and main pipes.

In these cases, preferably, the wiring connection assembly further comprises a junction board on which a wiring pattern is formed for connecting the plurality of separate cables and the plurality of wiring connectors, and to which the wiring connectors are mounted. Also, preferably, the wiring pattern collectively connects a plurality of ones of the plurality of separate cables to the respective wiring connectors.

According to the arrangement, it is possible to stably fix the wiring connectors at a location where they can be easily connected, and to reduce the number of wiring connectors (without changing the number of pins).

In these cases, preferably, the junction board is arranged above the plurality of functional liquid droplet ejection heads through a stand fixed to the carriage.

According to this arrangement, it is possible to arrange the piping connection assembly in a space between the junction board and the functional liquid droplet ejection heads, to prevent interference between the junction board and the piping connection assembly, and to easily secure a working space for the connecting and disconnecting operations for the main cables and main pipes.

In these cases, preferably, each of the separate cables has one end thereof connected to the head board through a head-side connector, and opposite end thereof connected to the junction board through a junction-side connector.

According to this construction, the head-side connector and the junction-side connector of the separate cable make it possible to connect the head board and the junction with ease.

In this case, preferably, each of the separate cables is formed by a flat flexible cable, and the head-side connector and the junction-side connector are arranged in a posture parallel to each other.

According to this construction, since the head-side connector connected to the head board and the junction-side connector connected to the junction board are arranged in a parallel posture, the flat flexible cable is not twisted, which prevents unnecessary force from being applied to the mutual connector portions. Therefore, even when holderless connectors (resistant to noise) are used, it is possible to effectively prevent disconnection or faulty connection of the connectors.

In these cases, preferably, the junction-side connector is mounted on an upper surface of the junction board in a manner directed upward, and each of the separate cables is routed through a hole formed through the junction board.

According to this arrangement, the flat flexible cable can be routed over the shortest distance, and at the same time, the routing of the cable can be made stable by the hole.

In these cases, preferably, the piping connection assembly is connected to the plurality of separate pipes through a plurality of piping adapters connected to the respective functional liquid introducing ports.

According to this arrangement, due to the piping adapters, it is possible to properly connect the functional liquid introducing ports and the separate pipes, and to easily carry out the connecting and disconnecting operations themselves.

In these cases, preferably, the head unit further comprises an adapter holding member for collectively holding the plurality of piping adapters, and the adapter holding member is fixed to the carriage in a state connecting each of the piping adapters to each of the functional liquid introducing ports.

According to this construction, after causing the adapter holding member to collectively hold the plurality of piping adapters, it is possible to collectively connect them to a plurality of functional liquid introducing portions (functional liquid droplet ejection heads), and hence to carry out the connecting and disconnecting operations efficiently. Further, since the adapter holding member is fixed to the carriage, the piping adapters need not be supported on the functional liquid droplet ejection heads, but the plurality of adapters can be stably set and no undue external force is applied to the functional liquid droplet ejection heads.

In this case, preferably, the adapter holding member incorporates springs for urging the respective piping adapters toward the functional liquid introducing ports.

According to this arrangement, each piping adapter can be stably connected to each functional liquid introducing port in a pressure sealing manner, in other words, by one-touch operation.

In these cases, preferably, the head unit further comprises a joint holding member for collectively holding the plurality of piping joints, and the joint holding member is fixed to an end of the carriage.

According to this arrangement, it is possible to stably hold the plurality of piping joints through the joint holding member, and to stably connect and disconnect the main pipes to and from the piping joints.

In this case, preferably, the head unit is set by being slidingly moved in one direction, and the joint holding member is fixed to a rear end of the carriage in the sliding direction, with the plurality of piping joints directed rearward in the sliding direction.

According to this arrangement, it is possible to connect (or disconnect) a plurality of main pipes in succession from the side of the operator as seen in the sliding direction, which contributes to increased efficiency of the connecting and disconnecting operations.

In these cases, preferably, each of the separate pipes branches in a path from the piping joint to the piping adapter.

According to this construction, it is possible to reduce the number of piping joints, and accordingly, to reduce the number of main pipes and the number of joints.

In this case, preferably, the head unit further comprises a pair of handles fixed to the carriage, for being held by hand. Also, preferably, the head unit further comprises a carriage cover covering the wiring connection assembly and the piping connection assembly.

According to this arrangement, it is possible to move the head unit by grasping the pair of handles, and to easily carry the head unit. Further, when the head unit is carried, it is possible to effectively prevent components from being damaged and to thereby protect them.

Another head unit head unit of this invention has a plurality of functional liquid droplet ejection heads for selectively ejecting an introduced functional liquid from ejection nozzles, and a carriage for carrying the plurality of functional liquid droplet ejection heads, wherein a plurality of main cables connected to a head driver and a plurality of main pipes connected to a functional liquid tank are connected to the respective functional liquid droplet ejection heads. The head unit comprises a wiring connection assembly carried on the carriage and comprising a plurality of wiring connectors to which the respective main cables are connected, and a plurality of separate cables one end of each being connected to a head board of the respective functional liquid droplet ejection heads and an opposite end of each being connected to the respective wiring connectors.

Similarly, still another head unit of this invention has a plurality of functional liquid droplet ejection heads for selectively ejecting an introduced functional liquid from ejection nozzles, and a carriage for carrying the plurality of functional liquid droplet ejection heads, wherein a plurality of main cables connected to a head driver and a plurality of main pipes connected to a functional liquid tank are connected to the respective functional liquid droplet ejection heads. The head unit comprises a piping connection assembly carried on the carriage and comprising a plurality of piping joints to which the respective main pipes are connected, and a plurality of separate pipes one end of each being connected to a functional liquid introducing port of the respective functional liquid droplet ejection heads and an opposite end of each being connected to the respective piping joints.

According to these arrangements, each main cable is connected to each wiring connector of the wiring connection assembly, whereby the main cable is connected to the head board of each functional liquid droplet ejection head through a separate cable of the wiring connection assembly. Similarly, each main pipe is connected to each piping joint of the piping connection assembly, whereby the main pipe is connected to a functional liquid introducing port of each functional liquid droplet ejection head. Therefore, by arranging the wiring connectors of the wiring connection assembly and the piping joints of the piping connection assembly, while giving consideration to connecting and disconnecting operations and leakage of the functional liquid, it is possible to easily and smoothly carry out operations for connecting and disconnecting the main cables and main pipes without causing any trouble.

A method of setting a head unit according to this invention is a method of setting the above-described head unit to a drawing system. The method comprises: a temporary setting step for temporarily setting the head unit in front of a setting position in the drawing system; a piping/wiring connection step for connecting the respective main cables to the respective wiring connectors and connecting the respective main pipes to the respective piping joints, after the temporary setting; and a final setting step for advancing the head unit from a temporary setting position into the setting position, thereby finally setting the head unit.

According to this arrangement, since connections of each main cable and each main pipe are carried out in the temporary-setting position in front of the setting position, and hence by securing a sufficient working space for the temporary-setting position, the connecting and disconnecting operations for the main cables and main pipes can be smoothly carried out. At the same time, no working space is necessitated around the setting position. Therefore, it is possible to smoothly mount and remove the head unit without the necessity of the above-described working space around the setting position for the drawing system.

A drawing system according to this invention is a drawing system provided with the above-described head unit, characterized by comprising a temporary-placing rest for temporarily setting the head unit, in front of a setting table on which the head unit is set.

According to this arrangement, in a state in which the head unit is set on the temporary-placing rest, operations for connecting and disconnecting the main cables and main pipes can be carried out, and an operation for setting the head unit from the temporary-placing rest onto the setting table and an operation pulling it out can be smoothly carried out.

A method of manufacturing a liquid crystal display device, according to this invention, is a method of manufacturing a liquid crystal display device, wherein the above-described head unit is used, and a multiplicity of filter elements are formed on a substrate of a color filter, characterized by comprising introducing filter materials of respective colors into a plurality of the functional liquid droplet ejection heads, and forming the multiplicity of filter elements by causing, through the head unit, the functional liquid droplet ejection heads to scan relative to the substrate and selectively eject the filter materials.

A method of manufacturing an organic EL device, according to this invention, is a method of manufacturing an organic EL device, wherein the above-described head unit is used, and EL light-emitting layers are formed on a multiplicity of pixels on a substrate, characterized by comprising introducing light-emitting materials of respective colors into a plurality of the functional liquid droplet ejection heads, and forming the multiplicity of the EL light-emitting layers by causing, through the head unit, the functional liquid droplet ejection heads to scan relative to the substrate and selectively eject the light-emitting materials.

A method of manufacturing an electron emitting device, according to this invention, is a method of manufacturing an electron emitting device, wherein the above-described head unit is used, and a multiplicity of phosphors are formed on electrodes, characterized by comprising introducing fluorescent materials into a plurality of the functional liquid droplet ejection heads, and forming the multiplicity of phosphors by causing, through the head unit, the functional liquid droplet ejection heads to scan relative to the electrodes and selectively eject the fluorescent materials.

A method of manufacturing a PDP device, according to this invention, is a method of manufacturing a PDP device, wherein the above-described head unit is used, and phosphors are formed in a multiplicity of respective concave portions of a back substrate, characterized by comprising introducing fluorescent materials into a plurality of the functional liquid droplet ejection heads, and forming the multiplicity of the phosphors by causing, through the head unit, the functional liquid droplet ejection heads to scan relative to the back substrate and selectively eject the fluorescent materials.

A method of manufacturing an electrophoresis display device, according to this invention, is a method of manufacturing an electrophoresis display device, wherein the above-described head unit is used, and migration elements are formed in a multiplicity of concave portions of electrodes, characterized by comprising introducing migration element materials into a plurality of the functional liquid droplet ejection heads, and forming the multiplicity of the migration elements by causing, through the head unit, the functional liquid droplet ejection heads to scan relative to the electrodes and selectively eject the migration element materials.

As described above, by applying the above-described head unit to the method of manufacturing a liquid crystal display device, the method of manufacturing an EL device, the method of manufacturing an electron emitting device, the method of manufacturing a PDP device, and the method of manufacturing an electrophoresis display device, it is possible to selectively supply filter materials and light-emitting materials necessary for the devices, at appropriate positions in appropriate amounts. Further, exclusively-used liquid droplet ejection heads can be promptly supplied through the head unit. It should be noted that, in general, scanning by the liquid droplet ejection heads includes main scanning and sub-scanning, but when so-called one line is formed by a single liquid droplet ejection head, only sub-scanning is carried out. Further, the electron emitting device is a concept including a field emission display (FED) device.

A method of manufacturing a color filter, according to this invention, is a method of manufacturing a color filter comprising a multiplicity of filter elements arranged on a substrate, by using the above-described head unit, characterized by comprising introducing filter materials into a plurality of the functional liquid droplet ejection heads, and forming the multiplicity of filter elements by causing, through the head unit, the functional liquid droplet ejection heads to scan relative to the substrate and selectively eject the filter materials.

In this case, preferably, an overcoating layer covering the multiplicity of filter elements is formed, and the method further includes, subsequent to forming of the filter elements, introducing a transparent coating material into the plurality of the functional liquid droplet ejection heads, and forming the overcoating layer by causing, through the head unit, the functional liquid droplet ejection heads to scan relative to the substrate and selectively eject the coating material.

A method of manufacturing an organic EL, according to this invention, is a method of manufacturing an organic EL comprising a multiplicity of pixels, including EL light-emitting layers, arranged on a substrate, by using the above-described head unit, characterized by comprising introducing light-emitting materials of respective colors into a plurality of the functional liquid droplet ejection heads, and forming the multiplicity of the EL light-emitting layers by causing, through the head unit, the functional liquid droplet ejection heads to scan relative to the substrate and selectively eject the light-emitting materials.

In this case, preferably, a multiplicity of pixel electrodes are formed between the multiplicity of the EL light-emitting layers and the substrate in a manner associated with the EL light-emitting layers, respectively, and the method further comprises introducing a liquid-state electrode material into a plurality of the functional liquid droplet ejection heads, and forming the multiplicity of pixel electrodes, by causing, through the head unit, the functional liquid droplet ejection heads to scan relative to the substrate and selectively eject the liquid-state electrode material.

In this case, preferably, opposed electrodes are formed in a manner covering the multiplicity of the EL light-emitting layers, and the method further comprises, subsequent to forming of the EL light-emitting layers, introducing a liquid-state electrode material into a plurality of the functional liquid droplet ejection heads, and forming the opposed electrodes, by causing, through the head unit, the functional liquid droplet ejection heads to scan relative to the substrate and selectively eject the electrode material in the liquid form.

A spacer-forming method according to this invention is a method of forming a multiplicity of particulate spacers to form very small cell gaps between two substrates, by using the above-described head unit, characterized by comprising introducing a particle material for forming the spacers into a plurality of the functional liquid droplet ejection heads, and causing, through the head unit, the functional liquid droplet ejection heads to scan relative to at least one of the two substrates and selectively eject the particle material, thereby forming the spacers on the substrate.

A metal wiring-forming method according to this invention is a method of forming metal wiring on a substrate, by using the above-described head unit, characterized by comprising introducing a liquid-state metal material into a plurality of the functional liquid droplet ejection heads, and forming the metal wiring by causing, through the head unit, the functional liquid droplet ejection heads to scan relative to the substrate and selectively eject the metal material.

A lens-forming method according to this invention is a method of forming a multiplicity of microlenses on a substrate, by using the above-described head unit, characterized by comprising introducing a lens material into a plurality of the functional liquid droplet ejection heads, and forming the multiplicity of microlenses by causing, through the head unit, the functional liquid droplet ejection heads to scan relative to the substrate and selectively eject the lens material.

A resist-forming method according to this invention is a method of forming a resist having a desired shape on a substrate, by using the above-described head unit, characterized by comprising introducing a resist material into the functional liquid droplet ejection head, and forming the resist by causing a plurality of the functional liquid droplet ejection heads to scan relative to the substrate and selectively eject the resist material.

A light diffuser-forming method according to this invention is a method of forming a multiplicity of light diffusers on a substrate, by using the above-described head unit, characterized by comprising introducing a light diffusing material into a plurality of the functional liquid droplet ejection heads, and forming the multiplicity of light diffusers by causing, through the head unit, the functional liquid droplet ejection heads to scan relative to the substrate and selectively eject the light diffusing material.

As described above, by applying the above-described head unit to the method of manufacturing a color filter, the method of manufacturing an organic EL, the spacer-forming method, the metal wiring-forming method, the lens-forming method, the resist-forming method, and the light diffuser-forming method, it is possible to selectively supply filter materials and light-emitting materials necessary for the electronic devices and the optical devices, at appropriate positions in appropriate amounts. Further, exclusively-used liquid droplet ejection heads can be promptly supplied through the head unit.

BRIEF DESCRIPTION OF THE DRAWINGS

FIG. 9 is a front view of the head unit of the liquid droplet ejection device;

FIG. 12 is a cross-sectional view of a piping adapter of the head unit according to the modified example and therearound;

FIG. 15 is a plan view of the stone surface plate of the liquid droplet ejection device and therearound;

FIGS. 28A and 28B are enlarged partial views of a color filter manufactured by a method of manufacturing a color filter, in which FIG. 28A is a plan view, and FIG. 28B is a cross-sectional view taken on line B—B of FIG. 28A;

FIG. 30 is a cross-sectional view showing a liquid crystal display device manufactured by the method of manufacturing a color filter;

FIG. 34 is a cross-sectional view of the plasma treatment process (liquid repellence-imparting process) in the method of manufacturing an organic EL device;

FIG. 43 is a cross-sectional view of a sealing process in the method of manufacturing an organic EL device.

DETAILED DESCRIPTION OF PREFERRED EMBODIMENTS

Figure 1:
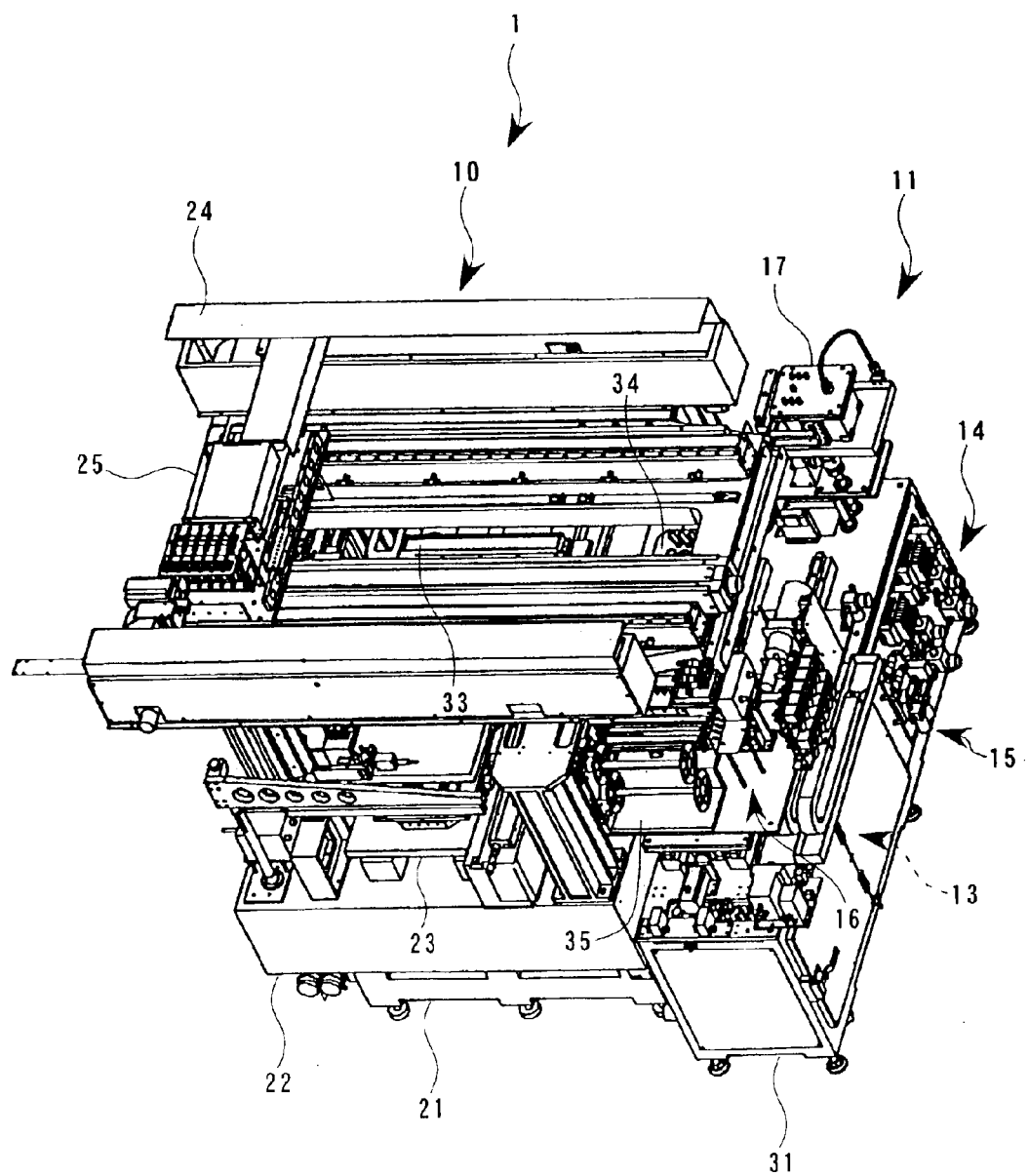
FIG. 1 is a perspective view of the appearance of a drawing system according to an embodiment of the invention.

The invention will now be described in detail about the embodiment of this invention with reference to the attached drawings. An ink jet head (functional liquid droplet ejection head) of an ink jet printer is capable of accurately ejecting very small ink droplets in the form of dots, and hence, there is an expectation that the ink jet head can be applied to various fields of manufacturing component parts, e.g., by using special inks, photosensitive or light-emitting resins, etc. as functional liquids (liquids to be ejected). Further, in such an applied technique, a highly viscous functional liquid or the like is expected which have a large influence on the durability of the functional liquid droplet ejection head, and it is necessary that a head unit having a plurality of functional liquid droplet ejection heads accurately integrated in a carriage can be easily mounted on the system or replaced.

A head unit according to this embodiment and a drawing system having the head unit installed thereon, are applied, for instance, to a manufacturing system for manufacturing so-called flat displays, such as liquid display devices and organic electroluminescence (EL) devices. The manufacturing system ejects functional liquid droplets e.g. of a filter material or a light-emitting material from a plurality of functional liquid droplet ejection heads thereof (by the ink jet method), thereby forming filter elements of red (R), green (G), and blue (B) colors in the liquid crystal display device, and the EL light-emitting layers and positive hole injection layers of pixels in the organic EL device.

In this embodiment, a drawing system incorporated e.g. in a manufacturing system for manufacturing an organic EL device will be described by way of example together with the head unit and the method of setting the head unit. Further, a description will also be given of a case in which this head unit is applied to another method of manufacturing a so-called flat display.

As shown in FIG. 1 to FIG. 4, the drawing system 1 includes a liquid droplet ejection device 10, and an accessory unit 11 arranged adjacent to the liquid droplet ejection device 10. The accessory unit 11 includes a functional liquid feed/collection device 13 for feeding a light-emitting functional material (light-emitting material: functional liquid) to the liquid droplet ejection device 10 and collecting functional liquid which has become useless, an air-feeding device 14 for feeding compressed air to components for driving or control thereof, a vacuum suction device 15 for suctioning the air, a maintenance device 16 for maintenance of functional liquid droplet ejection heads 7, and so forth.

And, these liquid droplet ejection device 10 and accessory unit 11, are contained in a chamber (chamber room), not shown, of a clean room type. A sequence of the manufacturing operations by the liquid droplet ejection device 10, including an ejection operation by the functional liquid droplet ejection heads 7, are carried out in the atmosphere of inert gas (nitrogen gas).

The liquid droplet ejection device 10 includes a base 21, a stone surface plate 22 set on the base 21, an X-axis table 23 and a Y-axis table 24 orthogonal to the X-axis table 23, set on the stone surface plate 22, a main carriage 25 arranged in a manner suspended from the Y-axis table 24, and a head unit 26 mounted on the main carriage 25. The head unit 26 has a plurality of the functional liquid droplet ejection heads 7 mounted thereon through a sub-carriage (carriage) 41, as will be described in detail hereinafter. Further, the liquid droplet ejection device 10 is configured such that a substrate (workpiece) W is set on a suction table 281 of the X-axis table 23 in a manner associated with the plurality of functional liquid droplet ejection heads 7.

The liquid droplet ejection device 10 according to this embodiment is configured such that the substrate W is moved in synchronism with the driving of the functional liquid droplet ejection heads 7 (for selective ejection of functional liquid droplets). The so-called main scanning of the functional liquid droplet ejection heads 7 is performed in accordance with both of advancing and returning motions of the X-axis table 23 in an X-axis direction. Further, in a manner associated with this, so-called sub-scanning is performed in accordance with advancing and returning motions of the functional liquid droplet ejection heads 7 by the Y-axis table 24 in a Y-axis direction. It should be noted that the above main scanning may be effected only by an advancing motion (or a returning motion) of the heads 7 in the X-axis direction.

Figure 2:
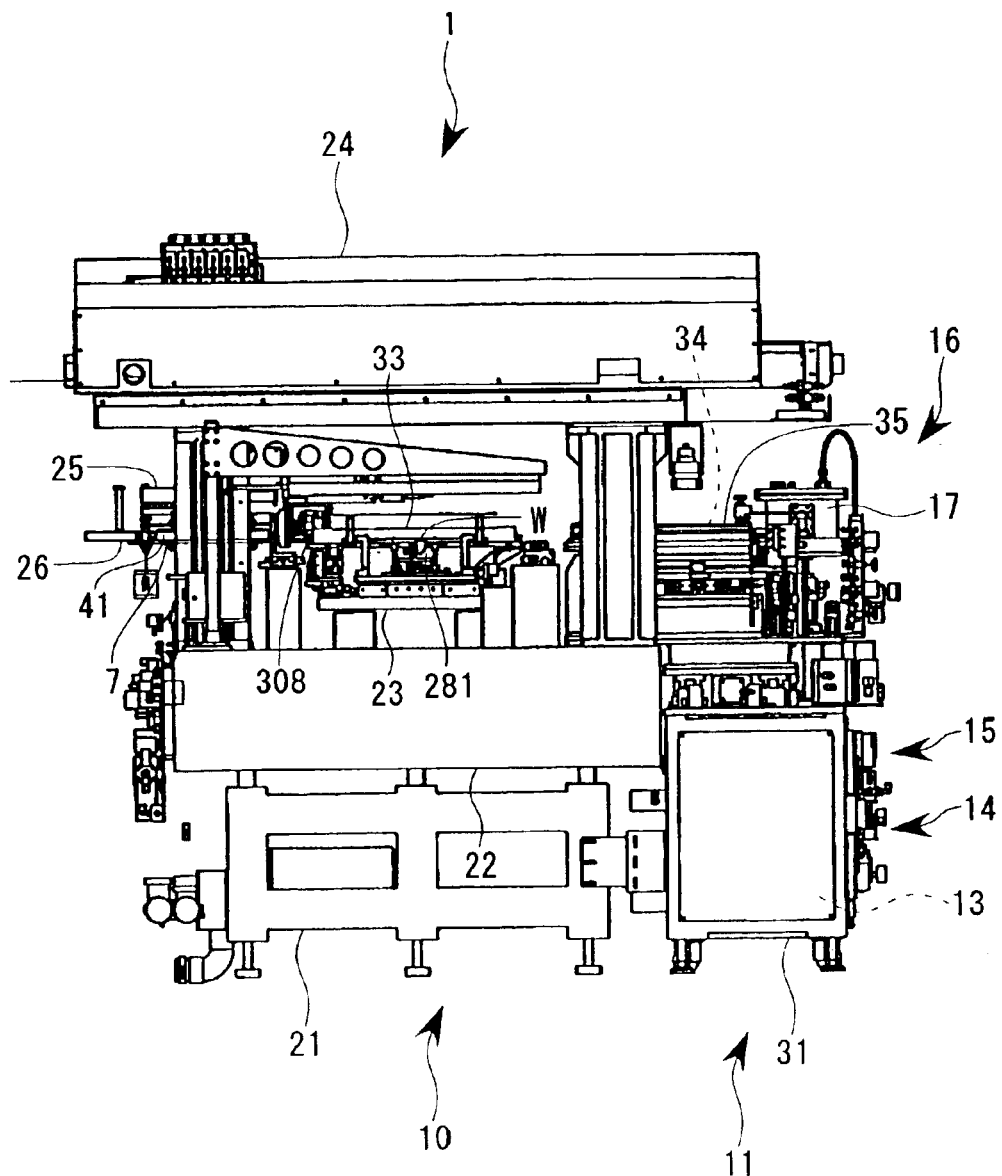
FIG. 2 is a front view of the appearance of the drawing system.
Figure 3:
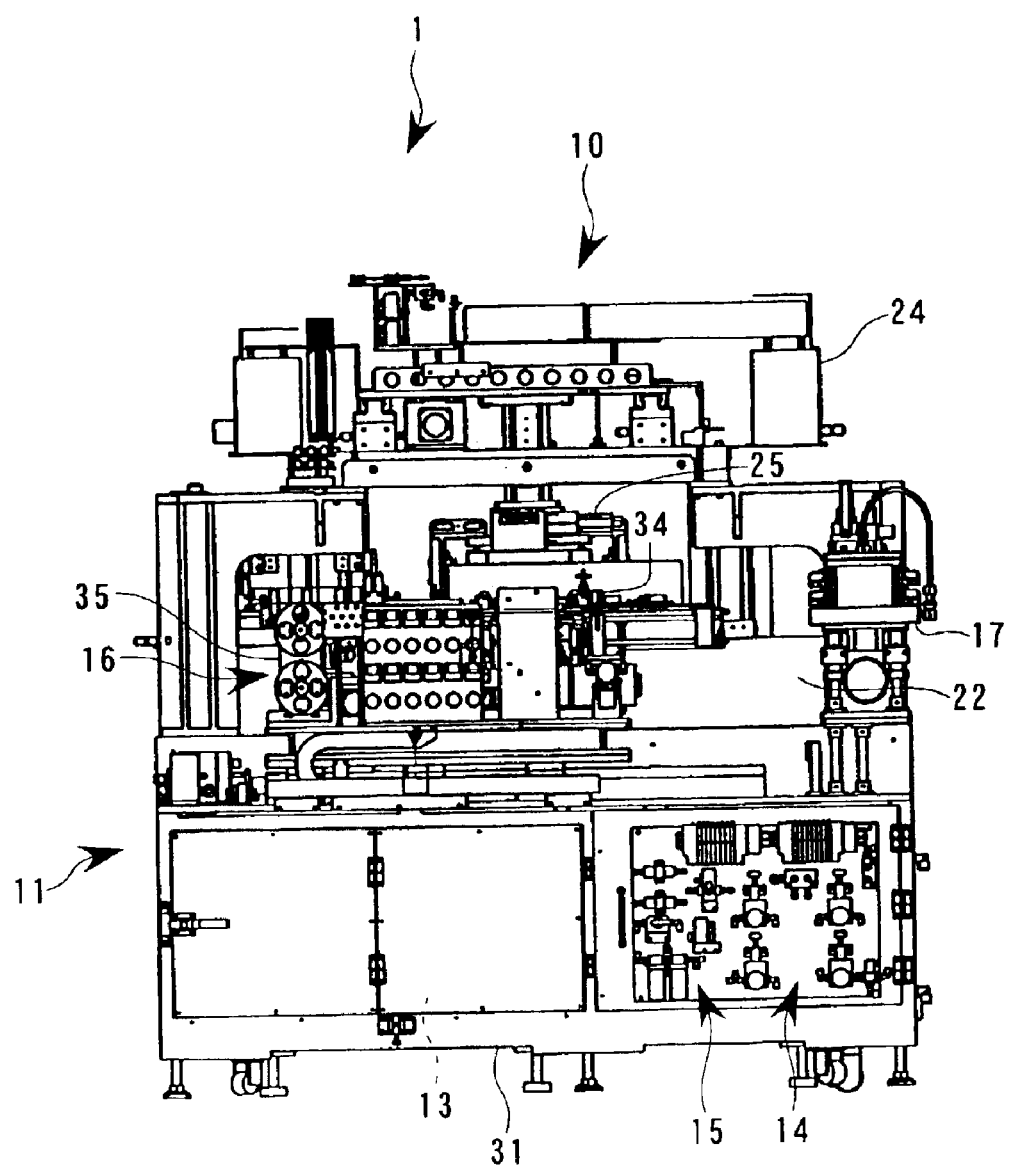
FIG. 3 is a side view of the appearance of the drawing system.
Figure 4:
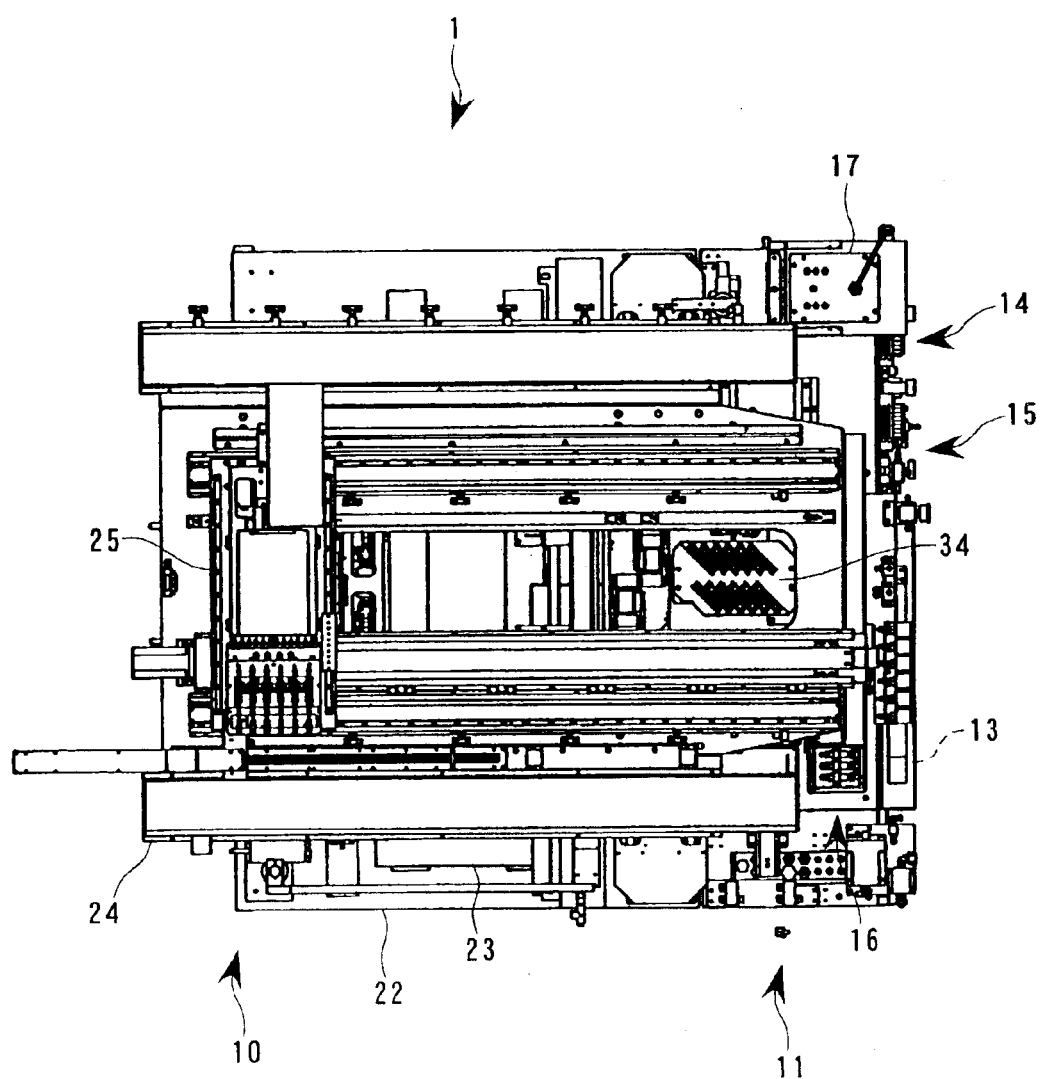
FIG. 4 is a plan view of the appearance of the drawing system.

On the other hand, a home position of the head unit 26 is set to a left end position as viewed in FIGS. 2 and 4, and from the left hand of the liquid droplet ejection device 10, the head unit 26 is carried in or replaced (details will be described hereinafter). Further, a substrate transport device, not shown, faces toward a front side as viewed in the figures, and the substrate W is carried in or out from this front side of the device 10. Further, on a right side of the device 10, main component devices of the accessory unit 11 are integrally arranged therealong.

The accessory unit 11 includes a common base 31 of a cabinet type arranged adjacent to the base 21 and the stone surface plate 22, the air-feeding device 14 and the vacuum suction device 15 received within one half of the common base 31, the functional liquid feed/collection device 13 main components of which are received within one-half of the common base 31, and the maintenance device 16 main components of which are received on the common base 31. It should be noted that reference numeral 17 in the figures designate intermediate tanks of the functional liquid feed/collection device 13, interposed in functional liquid flow passages between main tanks (not shown) and the head unit 26.

The maintenance device 16 includes a flushing unit 3 for receiving regular flushing (non-printing ejection of functional liquid from all the nozzles) of the functional liquid droplet ejection heads 7, a cleaning unit 34 for sucking and storing of functional liquid from the functional liquid droplet ejection heads 7, and a wiping unit 35 for wiping the nozzle-forming surfaces of the functional liquid droplet ejection heads 7. The cleaning unit 34 and the wiping unit 35 are arranged on the common base 31, and the flushing unit 33 is mounted on the X-axis table 23 at a location close to the substrate W.

Figure 5:
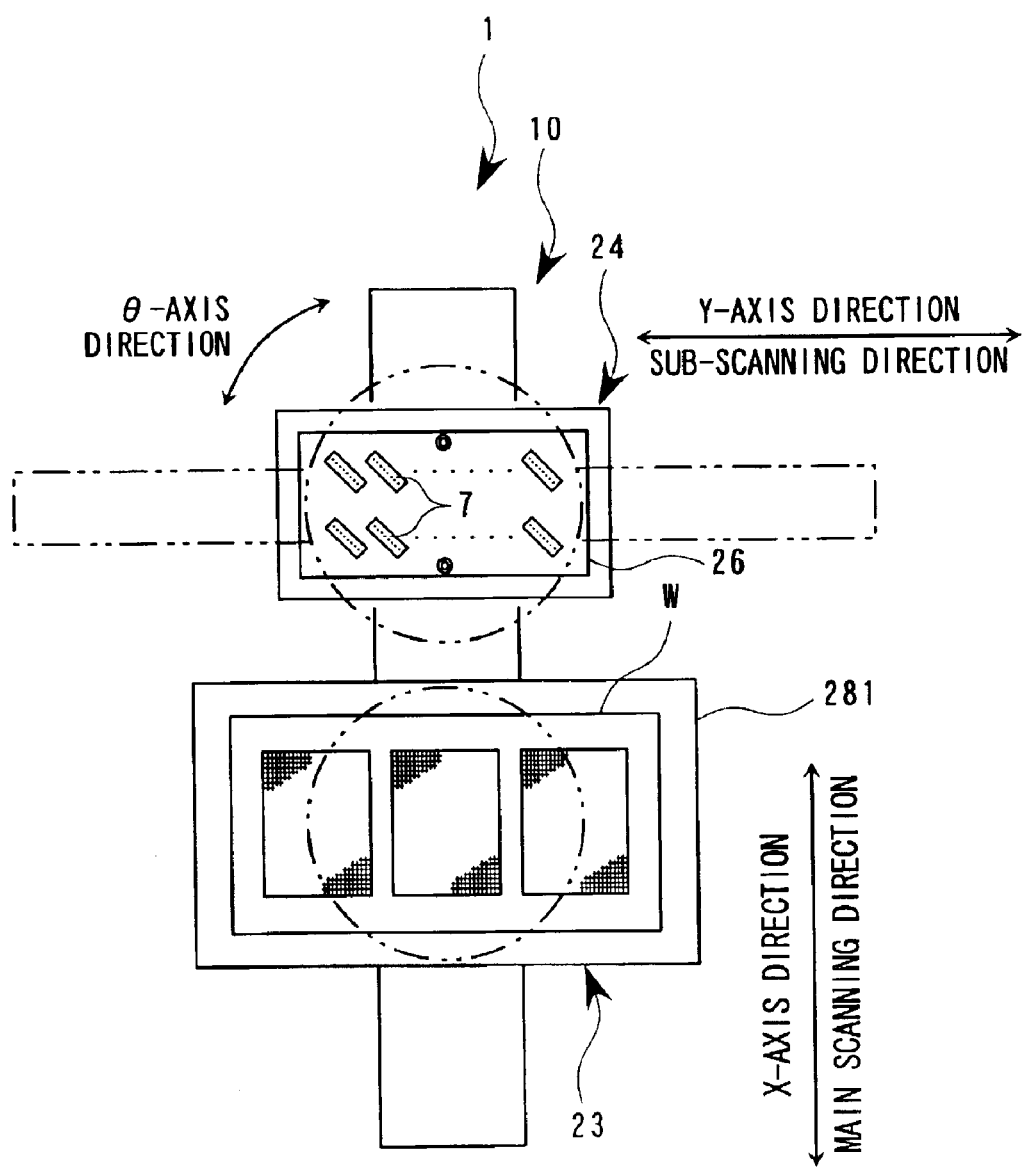
FIG. 5 is a schematic view of a liquid droplet ejection device of the drawing system.

Now, a sequence of operations carried out by the drawing system 1 operating in the atmosphere of nitrogen gas will be described briefly with reference to a schematic view of FIG. 5. First, as a preparation stage, the head unit 26 for a substrate to be worked is brought into the liquid droplet ejection device 10 and set on the main carriage 25. After the head unit 26 is set on the main carriage 25, the Y-axis table 24 moves the head unit 26 to the position of a head-sensing camera, not shown, and the head-sensing camera recognizes a position of the head unit 26. Here, θ correction of the head unit 26 is carried out based on a result of the recognition, and at the same time the position of the head unit 26 in the X-axis and Y-axis directions is corrected, by correcting data of the position. After the position correction, the head unit (main carriage 25) 26 is returned to a home position thereof.

On the other hand, when a substrate W (each substrate introduced, in this case) is introduced onto the suction table 281 of the X-axis table 23, primary substrate-sensing cameras 290 recognize a position of the substrate W at this position (passing position). Here, θ correction of the substrate W is carried out based on a result of the recognition, and at the same time the position of the substrate W in the X-axis and Y-axis directions is corrected by correcting data thereof. After the position correction, the substrate (suction table 281) W is returned to a home position thereof. It should be noted that when the initial adjustment of the X-axis and Y-axis tables 23, 24 (so-called initial alignment) is carried out, an alignment mask is introduced onto the suction table 281, and initial adjustment (position recognition) is carried out by using secondary substrate-sensing cameras 308, referred to hereinafter.

Once the preparation has thus been completed, in an actual liquid droplet ejection operation, first, the X-axis table 23 is driven for causing the substrate W to reciprocate in the main scanning direction and at the same time the plurality of functional liquid droplet ejection heads 7 are driven to perform selective ejection of functional liquid droplets onto the substrate W. After the substrate W is returned, now, the Y-axis table 24 is driven to move the head unit 26 in the sub-scanning direction by one pitch, and again the substrate W is caused to reciprocate in the main scanning direction, and the plurality of functional liquid droplet ejection heads 7 are driven. By carrying out the above operations several times, liquid droplet ejection is performed on the substrate W from edge to edge (entire range thereof).

On the other hand, in parallel with the above operations, functional liquid droplets are continuously fed from the functional liquid feed/collection device 13 to the head unit 26 (functional liquid droplet ejection heads 7) of the liquid droplet ejection device 10 by using the air-feeding device 14 as a pressure supply source, and suction of air is carried out by the vacuum suction device 15 to attract the substrate W to the suction table 281. Further, immediately before execution of the liquid droplet ejection operation, the head unit 26 is brought to the cleaning unit 34 and the wiping unit 35 for suction of functional liquid from all the ejection nozzles 138 of the functional liquid droplet ejection heads 7, and subsequent wiping of the nozzle-forming surfaces 139 of the heads 7. Further, during liquid droplet ejection operation, the head unit 26 is brought to the flushing unit 33 to carry out flushing of the heads 7 as required.

Although in this embodiment, the substrate W onto which the head unit 26 ejects liquid droplets is moved relative to the head unit 26 in the main scanning direction, the head unit 26 may be configured to be moved in the main scanning direction. Further, the device may be configured such that the head unit 26 is immovable, and the substrate W is moved in the main scanning direction and the sub-scanning direction.

Next, each of component device of the liquid droplet ejection device 10 will be described in detail, and for purposes of ease of understanding, a detailed description will be given of the head unit 26 in the first place.

Figure 6:
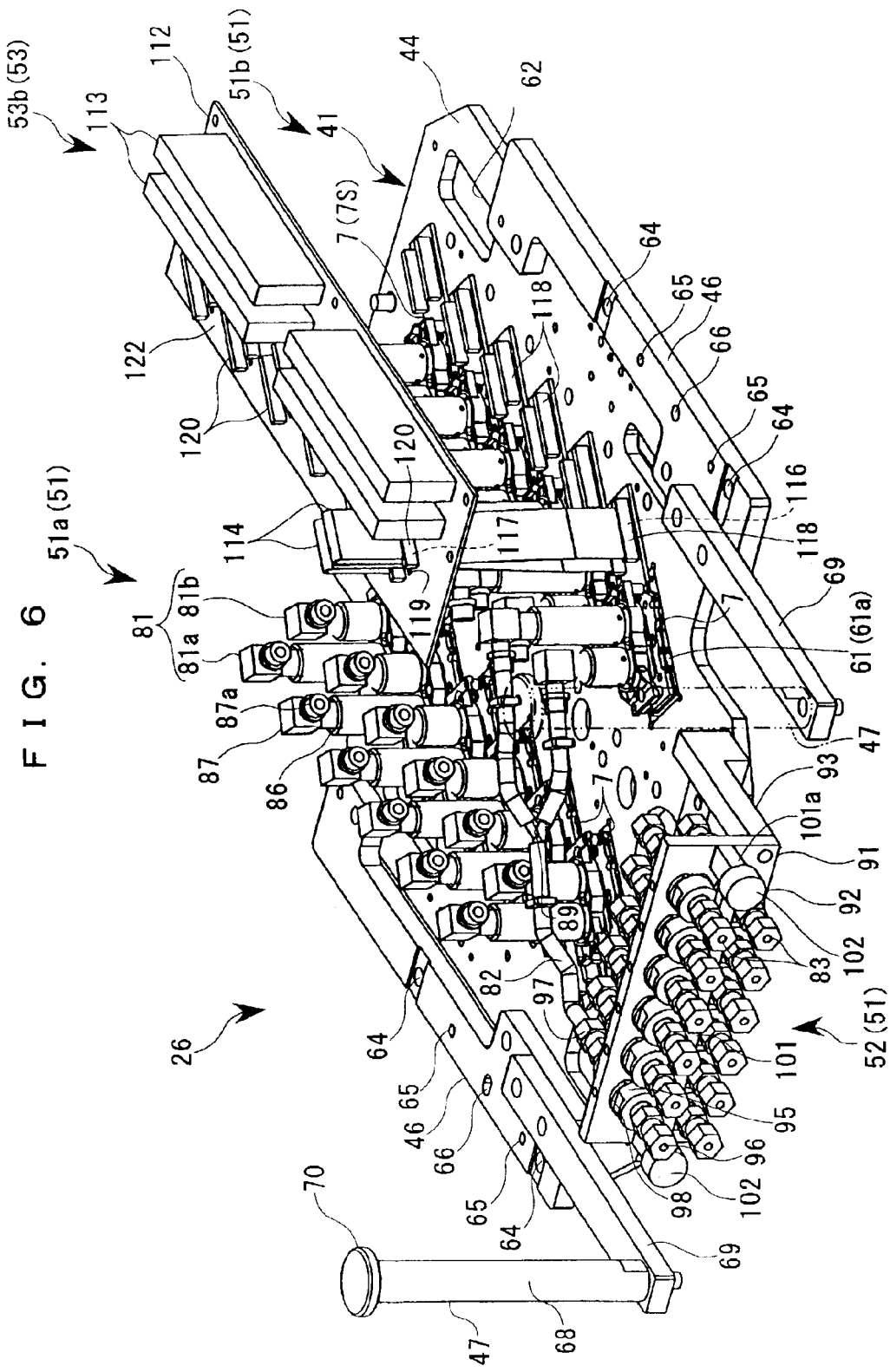
FIG. 6 is a perspective view of the whole of a head unit removed of a junction board cover of the liquid droplet ejection device.
Figure 7:
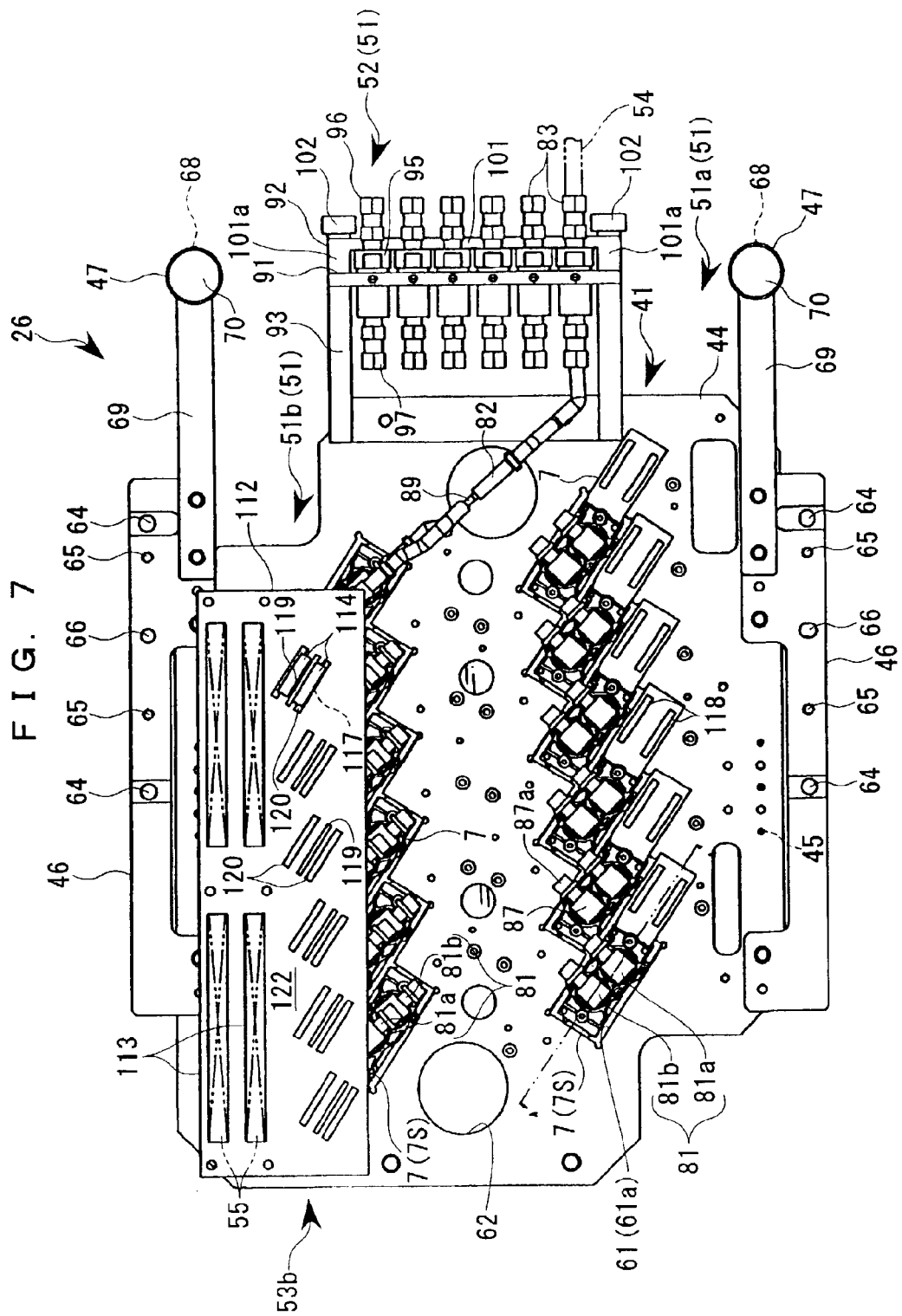
FIG. 7 is a plan view of the head unit of the liquid droplet ejection device.
Figure 8:
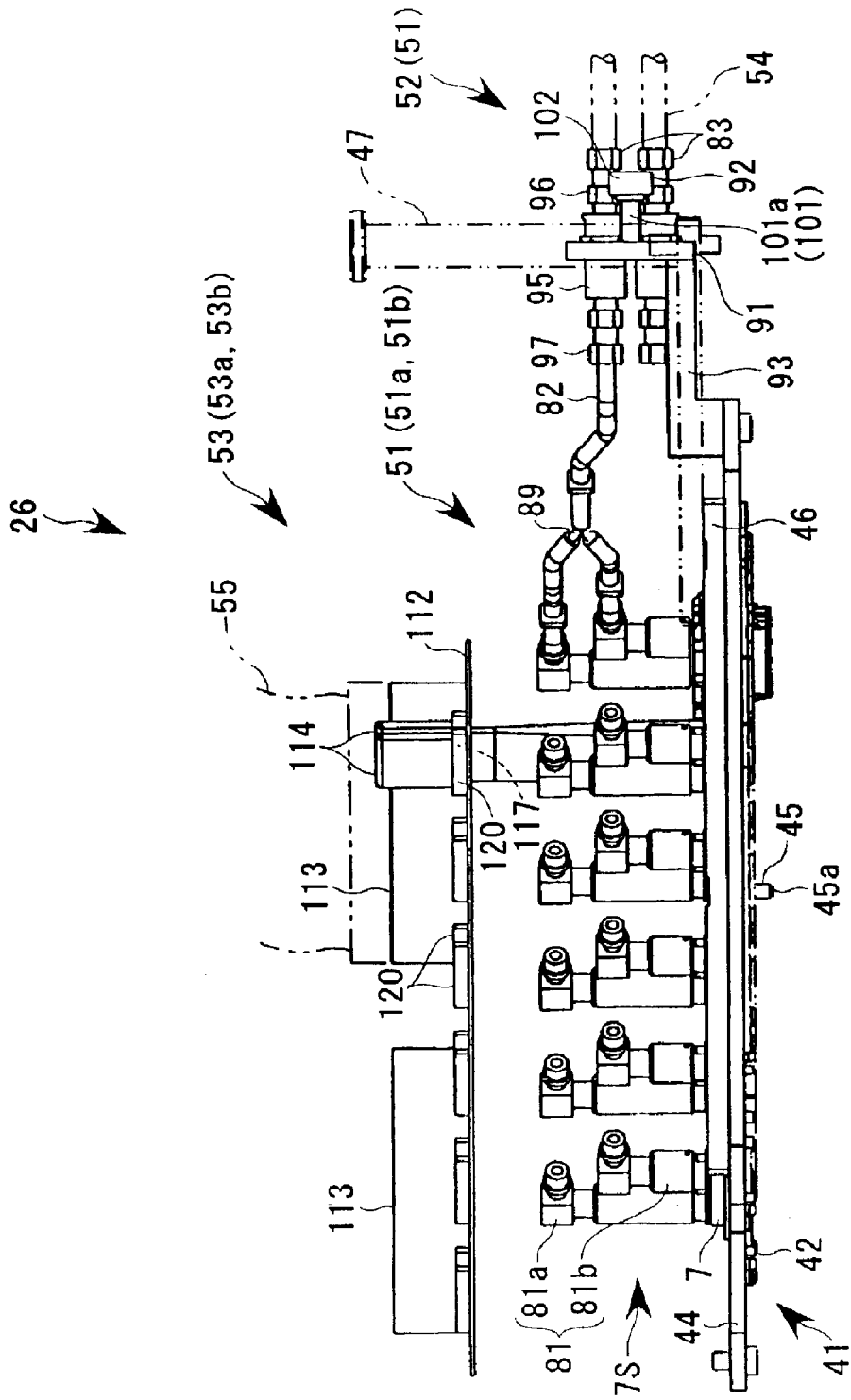
FIG. 8 is a side view of the head unit of the liquid droplet ejection device.

FIGS. 6 and 9 are views showing the construction of the head unit 26. As shown in the figures, the head unit 26 includes the sub-carriage 41, the plurality of (twelve) functional liquid droplet ejection heads 7 carried by the sub-carriage 41, and a plurality of (twelve) head-holding members 42 for individually mounting the functional liquid droplet ejection heads 7 on the sub-carriage 41. The twelve functional liquid droplet ejection heads 7 are grouped into two arrays, i.e. left and right arrays each consisting of six heads, and arranged at a predetermined angle relative to the main scanning direction.

The six functional liquid droplet ejection heads 7 of each array are laid out in a manner displaced from each other with respect to the sub-scanning direction such that all the ejection nozzles 138 (described hereinafter) of the twelve heads 7 are continuous with each other (partially overlap) in the sub-scanning direction. More specifically, the head layout according to this embodiment is configured such that two arrays each consisting of six functional liquid droplet ejection heads 7 at the angle in the same direction are laid out on the sub-carriage 41 and at the same time, the functional liquid droplet ejection heads 7 on the opposite arrays are arranged in a manner rotated through 180 degrees with respect to each other between the arrays.

However, the above layout pattern is only one example of many possible patterns. For instance, it is possible to lay out adjacent functional liquid droplet ejection heads 7, 7 in each head array at 90 degrees relative to each other (such that the adjacent heads form the shape of a Japanese katakana letter of "/\"), or alternatively two functional liquid droplet ejection heads 7, 7 adjacent to each other between the head arrays at 90 degrees relative to each other (such that the two inter-array heads form the shape of the Japanese katakana letter of "/\"). In any of the above cases, it is only required that dots formed by liquid droplets ejected from all the ejection nozzles 138 of the twelve heads are continuous with each other in the sub-scanning direction.

Further, if the functional liquid droplet ejection heads 7 are dedicated component parts for substrates W of various types, respectively, the heads 7 need not be set at the angle, but are only required to be set in a staggered layout or a stepped layout. Further, so long as nozzle arrays (lines of dots) having a predetermined length can be formed, they may be arranged on a single functional liquid droplet ejection head 7 or on a plurality of functional liquid droplet ejection heads 7. In short, the number of the functional liquid droplet ejection heads 7, the number of the head arrays thereof, and further the array pattern can be set as desired.

The sub-carriage 41 is made up of a main body plate 44 having a substantially rectangular shape, partially cut out, a pair of left and right reference pins 45, 45 arranged at an intermediate location in the direction along the long side of the main body plate 44, a pair of left and right supporting members 46, 46 attached to opposite long-side portions of the main body plate 44, a pair of left and right handles 47, 47 arranged at the respective supporting members 46. The left and right handles 47, 47 provide portions held by hand when the head unit 26 is carried onto the liquid droplet ejection device 10. Further, the left and right supporting members 47, 47 provide portions for fixing the sub-carriage 41 to a setting portion of the liquid droplet ejection device 10.

Further, on the sub-carriage 41, at a location above the two groups 7S of the functional liquid droplet ejection head groups, a piping connection assembly 51 and a wiring connection assembly 53 are arranged for connection to these functional liquid droplet ejection heads 7. The piping connection assembly 51 is made up of a left piping assembly 51a, a right piping assembly 51b, and a joint unit 52, and is connected to main tubes (main pipes 54 communicating with the functional liquid feed/collection device 13. Similarly, the wiring connection assembly 53 is made up of a left wiring assembly 53a and a right wiring assembly 53b, and is connected to main cables 55 of a control system. It should be noted that in FIGS. 6 to 9, the left wiring assembly 53a on one (left) side is omitted from illustration.

The main body plate 44 is made of a thick plate, such as stainless steel, and is formed, at left and right locations, with a pair of mounting holes 61, 61 each for fitting the six functional liquid droplet ejection heads 7 therein, and at suitable locations, with a plurality of cavities 62 for reducing the weight of the plate 44. Each mounting hole 61 is a sequence of hole portions 61a to which the six functional liquid droplet ejection heads 7 are fitted, and the axes of which are at a small angle with respect to the axis of the main body plate 44 in a manner conforming to the layout of the six functional liquid droplet ejection heads (functional liquid droplet ejection head group 7S) 7.

Each supporting member 46 is made e.g. of a thick stainless steel plate, and is formed with two fixing holes (loose holes) 64, 64 and two bolt holes 65, 65, for fixing the member 46, and a pin hole 66 between these fixing holes 64, 64 and the bolt holes 65, 65, for having a dowel pin inserted therein. Although details are described hereinafter, when the head unit 26 is set to the liquid droplet ejection device 10, the supporting member is positioned by using the pin hole 66 and fixed by screwing through the two bolt holes 65, 65.

The pair of left and right reference pins 45, 45 provide reference positions with reference to which the sub-carriage 41 is subjected to positioning (position recognition) in the directions of the X axis, Y axis, and θ axis based on the image recognition, and are mounted on the underside of the main body plate 44 in a manner protruding therefrom. Each reference pin 45 is formed to have a columnar shape, with a reference mark formed on an end face thereof. In this case, the end face 45a of each reference pin 45 is mirror-finished, and in the central position of the end face 45a, a small hole having a diameter of approximately 0.3 mm is formed.

The reference pin 45 thus formed is press-fitted into a mounting hole portion formed in the sub-carriage (main body plate 44) 41 in a manner striking therein with the end face 45a directed downward. The reference pin 45 press-fitted into the sub-carriage 41 protrudes from the underside of the main body plate 44 such that it has substantially the same height as that of the functional liquid droplet ejection heads 7 protruded from the sub-carriage 41 (see FIG. 9).

The left and right handles 47, 47 are for carrying the head unit 26 having a weight (about 7 kgs) by hand, and each handle 47 is made up of a handle body 68 providing a portion to be gripped, and an arm 69 extending from a lower end of the handle body 68 at right angles thereto, the handle body 68 and the arm 69 forming an L shape. The handle body 68 has an upper end formed as a large-diameter portion 70 for prevention of slippage. The peripheral surface of the handle body 68 is knurled for prevention of slippage.

The arm 69 extends horizontally, and has the extended end thereof screwed to the supporting member 46 of the sub-carriage such that it is seated thereon. In short, each handle 47 is removably attached to the sub-carriage 41. Thus, the left and right handles 47, 47 are provided in an erected manner at locations extending off an longitudinal end of the sub-carriage (main body plate 44) 41, i.e. at locations remote from the functional liquid droplet ejection heads 7.

The left and right piping assemblies 51a, 51b include six sets of piping adapters 81 connected to the six functional liquid droplet ejection heads 7 from above in a manner erected thereon, and a plurality of separate or individual tubes (separate or individual pipes) 82 connecting each piping adapter 81 and the joint unit 52. The joint unit 52 has twelve piping joints 83 each having one end thereof connected to a main tube 54, and the other end thereof connected to a separate tube 82.

Figure 10:
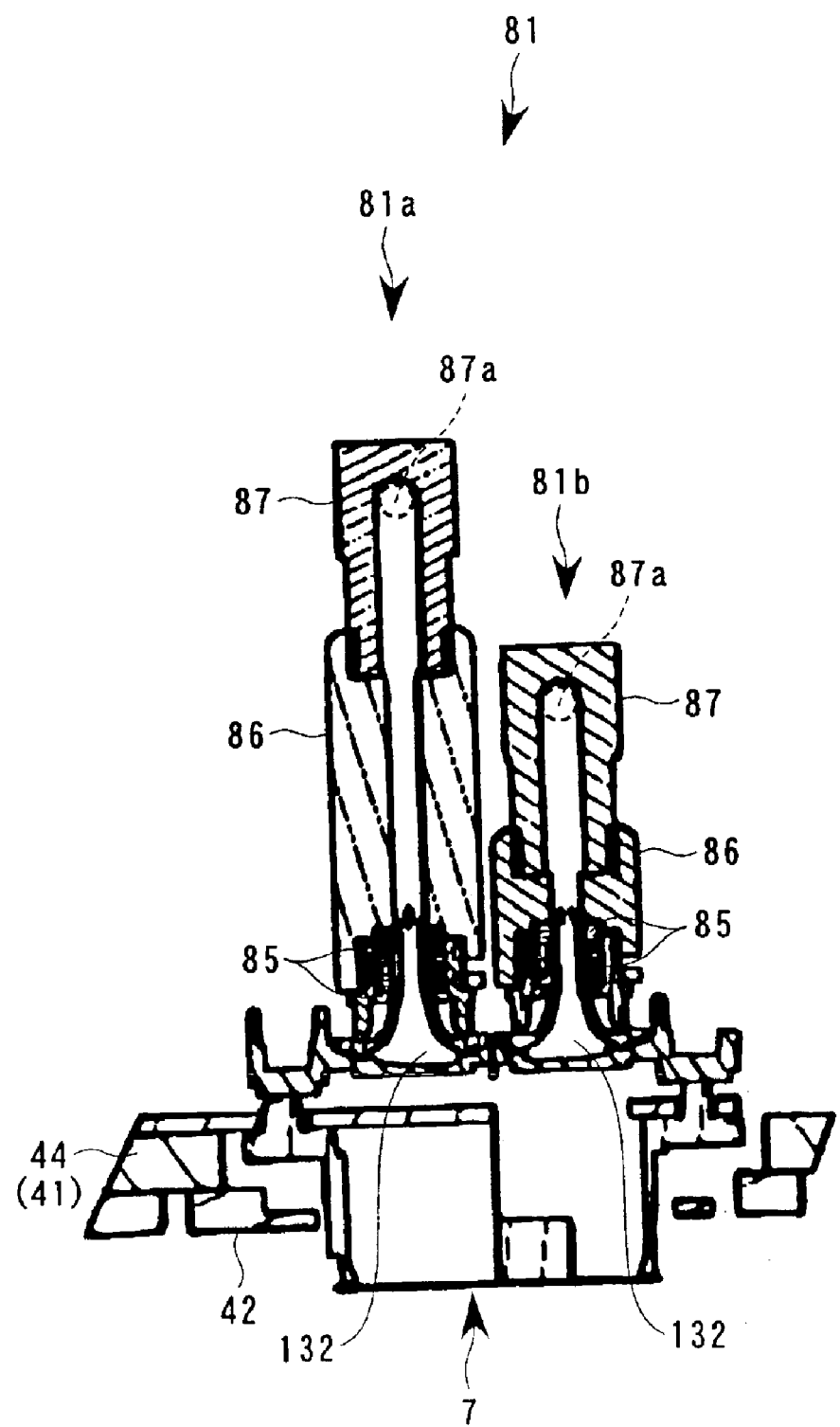
FIG. 10 is a cross-sectional view of a piping adapter of the head unit and thereraround.

Each set of piping adapters 81 is, as shown in FIG. 10, made up of a high piping adapter 81a having a large height and a low piping adapter 81b having a small height, and connected, from above, to respective connection needles 132, 132, in dual arrangement, of the functional liquid droplet ejection head 7, referred to hereinafter. The high piping adapter 81a and the low piping adapter 81b are both made up of adapter bodies 86 hermetically connected to the connection needles 132, 132 through two O rings 85, 85 at respective upper and lower locations, and connection devices 87 mounted on the upper portions of the adapters 86 in a hermetic and oscillating manner.

The adapter body 86 of the high piping adapter 81a is configured to be long and the adapter body 86 of the low piping adapter 81b is configured to be short, such that the connection devices 87, 87 having the same configuration are positioned at respective upper and lower locations for prevention of interference between the connection devices (connection ports thereof) 87, 87. Further, the connection devices 87 have the connection ports 87a thereof arranged in an manner directed obliquely inward toward the join unit 52, and the separate tubes 82 are connected to the connection ports 87a, respectively. It should be noted that the separate tube extending from the each piping joint 83 of the joint unit 52 is bifurcated at an intermediate portion by a Y-shaped joint 89, and connected to each set of the high piping adapter 81a and the low piping adapter 81b (one set is illustrated).

The joint unit 52 is, as shown in FIGS. 6 to 9, located between the pair of handles 47, 47, and has the twelve piping joints 83, a supporting plate 91 supporting these piping joints 83, a disconnection-preventing member 92 for preventing the unintended disconnection of the piping joints 83 from the supporting plate 91, and a bracket 93 for fixing the supporting plate 91 to the end of the sub-carriage 41. In other words, a joint holding member as recited in claims is made up of the supporting plate 91, the disconnection-preventing member 92, and the bracket 93.

The bracket 93 has a root portion thereof fixed to the top of an upper surface of the end of the sub-carriage 41, and extends horizontally such that the piping joints 83 supported by the supporting plate 91 are positioned between the two handles 47, 47. The twelve piping joints 83 are arranged on the supporting plate 91 facing horizontally in an upright position, in two upper and lower rows each having six piping joints 83.

Each piping joint 83 is a joint of a union type, and is made up of a stepped body portion 95, and an inlet-side connection port 96 and an outlet-side connection port 97 respectively connected to the front and rear of the body portion 95. In this case, the piping joint 83 is fixed to the supporting plate 91, by fitting the stepped body portion 95 into the mounting hole 98 formed through the supporting plate 91 from the handle 47 side, and in this state, causing an end of the body portion 95 to be retained by the disconnection-preventing member 92.

The disconnection-preventing member 92 is made up of a disconnection-preventing piece 101 arranged between the two rows of groups of the piping joints 83 and having a pair of legs 101a, and a pair of fixing screws 102, 102 respectively extending through the legs 101a to be fixedly screwed into the supporting plate 91. The disconnection-preventing piece 101 collectively retains the upper and lower rows each having six piping joints 83. It should be noted that out of the inlet-side connection port 96 and the outlet-side connection port 97 of each piping joint 83, at least the inlet-side connection port 96 to which is connected the main tube 54 is preferably formed by a one-touch joint.

The piping connection assembly 51 thus constructed enables efficient and easy connection (connection and disconnection) of a plurality of the main tubes 54 from the system side, since the plurality of piping joints 83 connected to the functional liquid droplet ejection heads 7 are intensively arranged on the front side toward the handles 47. Further, in operations for connecting and disconnecting the main tubes 54, even if a functional liquid may leak, the liquid does not get adhered to a head board 133, referred to hereinafter, or the sub-carriage 41, which makes it possible to prevent a short-circuit in the head board 133, corrosion of the sub-carriage 41, and so forth.

It should be noted that the twelve piping joints 83 may be arranged side by side in a line, or in a staggered manner. Further, they may be arranged in a vertical array. Moreover, a plurality of the main tubes 54 may be put together (formed into a unit), and collectively connected to the joint unit 52.

On the other hand, the left and right wiring assemblies 53a, 53b, each include three bent supporting members 111, 111, 111 erected at left and right ends of the sub-carriage (see FIG. 11), a junction board 112 fixed to the upper ends of the bent supporting members 111, four wiring connectors 113 erected on the junction board 112, and a total of six sets of flexible flat cables (separate cables) 114, each set having two cables, for connecting between the junction board 112 and the six functional liquid droplet ejection heads 7. In this case, the junction board 112 is positioned above the functional liquid droplet ejection head group 7S, i.e. above the piping adapters 81, and arranged horizontally.

The two flexible flat cables 114 forming one set each have a head-side connector 116 and a junction-side connector 117 at respective ends, and the head-side connectors 116 are connected respectively to a pair of receiving connectors 118, 118, in dual arrangement, of the head board 133 of each functional liquid droplet ejection head 7. Further, the two flexible flat cables 114 extend through a slit 119 formed through the junction board 112 to the upper side of the junction board 112, and is folded back to have the respective junction-side connectors 117 thereof connected to receiving connectors 120 of the junction board 112 located on opposite sides of the slit 119. In this case, the head-side connectors 116 and the junction-side connectors 117 are arranged at the same angle as the head board 133, thereby preventing the flexible flat cables 114 from being twisted.

The junction board 112 has a plurality of the receiving connectors 120 arranged on an inner half in the direction along the short side, and the four wiring connectors 113 arranged in two rows on an outer half in the direction along the short side. Then, on the surface of the junction board 112, there is formed a wiring pattern integrating a total of twelve receiving connectors 120 into the four wiring connectors 113. In other words, one wiring connector 113 has connector pins for three receiving connectors 120. In this case, each wiring connector 113 is fixed to the junction board 112 in a manner directed upward, thereby allowing the main cable 55 to be connected thereto (connected and disconnected).

The wiring connection assembly 53 constructed as above enables efficient and easy connection (connection and disconnection) of a plurality of the main cables 55 from the system side, since the plurality of wiring connectors 113 connected to the functional liquid droplet ejection heads 7 are intensively arranged at the two left and right locations. Further, the junction board 112 formed with the wiring pattern 122 enables reduction of the number of wiring connectors 113.

It should be noted that the junction board 112 may be extended to the location of the joint unit 52, and a total of eight wiring connectors 113 may be arranged in rows above the joint unit 52. This makes it possible to carry out connection of the main cables 55 more efficiently. Further, a junction board cover 125, referred to hereinafter, can be held low.

Figure 11:
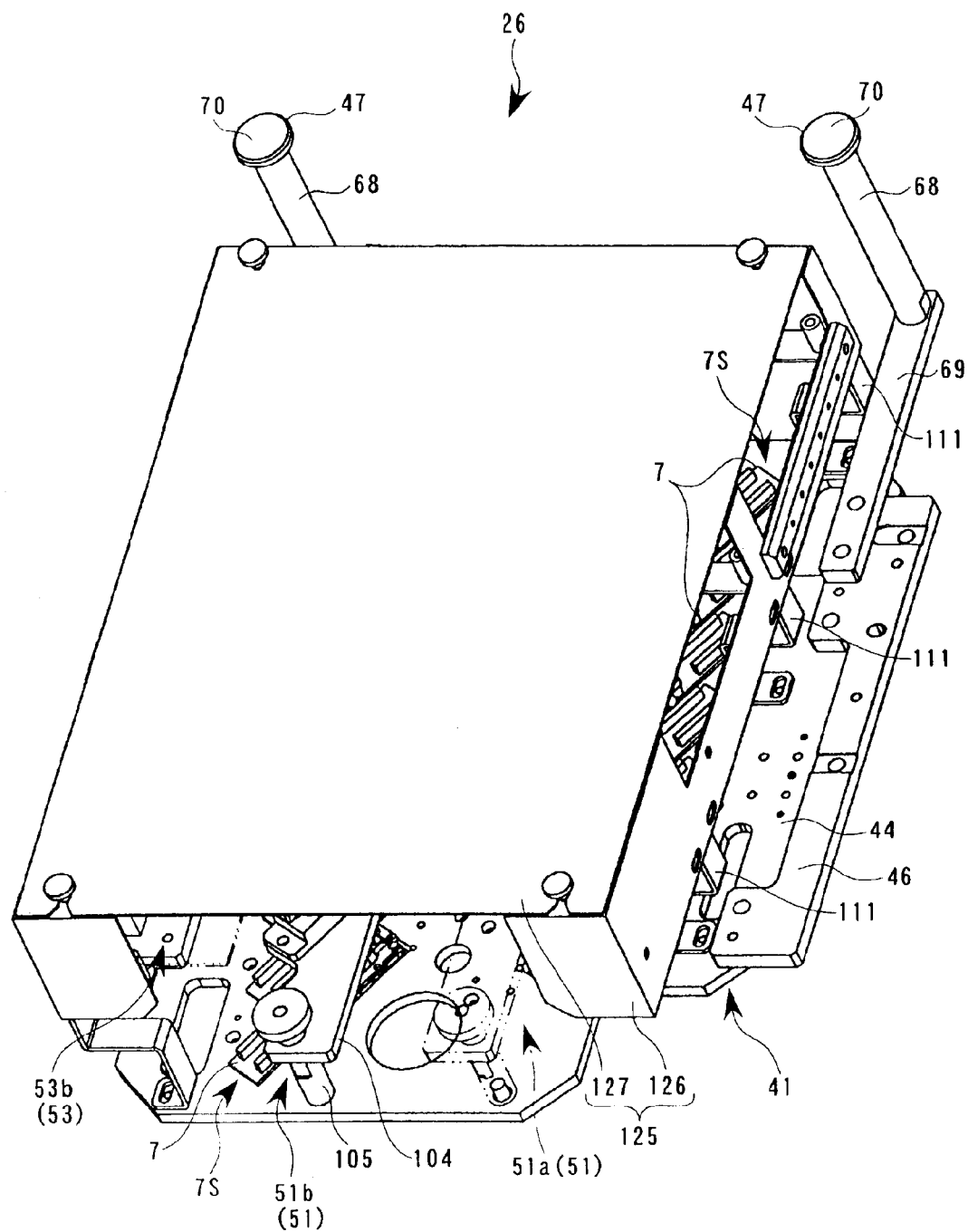
FIG. 11 is a perspective view of a head unit according to a modified example of the embodiment of this invention.

On the other hand, as shown in FIG. 11, the head unit 26 is further provided with the junction board cover (carriage cover) 125 such that the cover 125 covers the wiring connection assembly 53 and the piping connection assembly 51. The junction board cover 125 is made up of a pair of side covers 126, 126 covering from the side face of the wiring connection assembly 53 to immediately above of the same, and a top cover 127 extending between the pair of side covers 126, 126. Of these, the top cover 127 is mounted after the head unit 26 is set on the liquid droplet ejection device 10.

Further, in FIG. 11, a piping connection assembly 51 as a variation of the above embodiment is provided. In the left and right piping assemblies 51a, 51b shown herein, six sets of piping adapters 81 are held by a retaining plate (adapter holding member) 104, and the retaining plate 104 has both ends thereof screwed to opposite ends in the direction along the long side of the sub-carriage 41 through a pair of spacers 105, 105.

In this case, the piping adapter 81 is, as shown in FIG. 12, made up of a pair of piping connection members 106, 106 connected to connection needles 132, 132, in dual arrangement, of the functional liquid droplet ejection head 7, a pair of adapter bodies 107, 107 pressing on the piping connection members 106, and a pair of connection devices 108, 108 mounted on the respective tops of the adapter bodies 107. Between each adapter body 107 and the retaining plate 104, there is incorporated a coil spring 109 for urging the adapter body 107 downward. While effecting the fitting connection of the piping connection members 106 to the functional liquid droplet ejection heads 7, the retaining plate 104 holding the adapter bodies 107 is screwed to the two spacers 105, 105, whereby the six sets of adapter bodies 107, 107 are connected to the functional liquid droplet ejection heads in an urged state through the piping connection members 106, 106.

In this construction, by the use of the retaining plate 106, six sets of piping adapters 81 are collectively connected to the functional liquid droplet ejection heads 7, which makes it possible to easily integrate the piping adapters 81 into the head unit 26. In this case, preferably, the connection to the functional liquid droplet ejection heads is carried out after having the separate tubes 82 connected to the piping adapters 81 in advance. It should be noted that on the head unit 26 of this embodiment, only one of the piping connection assembly 51 and the wiring connection assembly 53 may be provided.

Next, the functional liquid droplet ejection head 7 will be described with reference to FIG. 13. This functional liquid droplet ejection head 7 is a so-called dual type, and is made up of a liquid introducing section 131 having the connection pins 132, 132, in dual arrangement, the head boards 133, in dual arrangement, connected to the side of the liquid introducing section 131, pump sections 134, in dual arrangement, connected downward to the liquid introducing section 131, and a nozzle-forming plate 135 connected to the pump section 134. Each connection needle 132 of the liquid introducing section 131 has the piping connection member 106 connected thereto, while each of the receiving connectors 118 of the head board 133 has the flexible flat cable 114 connected thereto. On the other hand, the pump section 134 and the nozzle-forming plate 135 form a head body 130 having a rectangular shape and protruding from the back of the sub-carriage 41.

The nozzle-forming plate 135 is formed with two arrays of nozzles 137, 137 in parallel with each other, and each nozzle array 137 is formed by 180 ejection nozzles 138 aligned at the same pitch (schematically illustrated in the figure). In other words, the nozzle-forming surface 139 of the head body 130 has two nozzle arrays 137, 137 arranged in bilateral symmetry with the center line therebetween. The functional liquid droplet ejection head 7 thus constructed is fixedly screwed to the head holding member 42 with its head body 130 extending through the mounting hole 61 so as to be protruded from the back of the sub-carriage 41, and further, the head holding member 42 is fixed to the sub-carriage 41.

Figure 13:
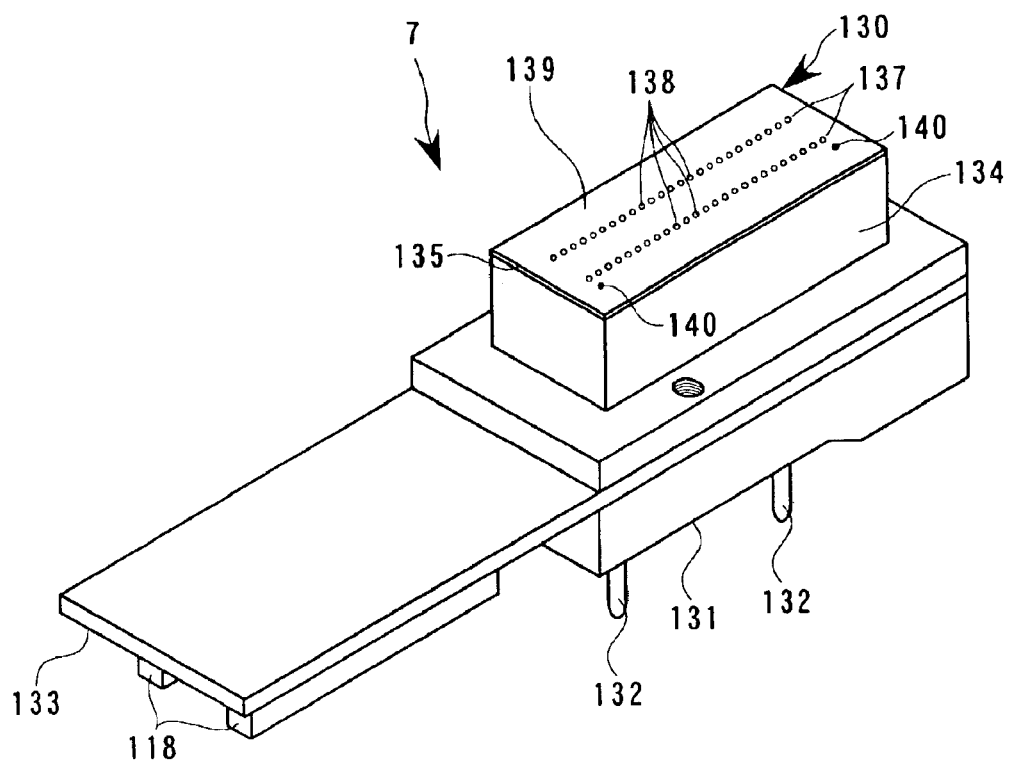
FIG. 13 is a perspective view of the appearance of a functional liquid droplet ejection head of the liquid droplet ejection device.

It should be noted that reference marks 140, 140 in FIG. 13 designate two nozzle reference marks for recognizing the position of the functional liquid-ejecting head 7. The nozzle reference marks 140 are formed in the vicinity of two outermost ones of the ejection nozzles 138, 138, e.g. by laser etching. The two nozzle reference marks 140, 140 are position-guaranteed with respect to the two ejection nozzles 138, 138, and when image recognition of the two ejection nozzles 138, 138 is unstable, the image recognition is carried out by using the two nozzle reference marks 140, 140.

Next, each component device of the liquid droplet ejection device 10 will be described.

FIGS. 14 to 17 represent the base 21 and the stone surface plate 22 on which the X-axis table is mounted. As shown in these figures, the base 21 is constructed by assembling angle members and the like into a rectangular shape, and has a plurality of (nine) supporting legs 271 with adjusting bolts, arranged on the bottom in a distributed manner. On the top of the base 21, there are mounted a plurality of (eight) fixing members 272, two per side of the base 21, in a manner hanging over laterally, for fixing the stone surface plate 22 during motion, such as transport.

Each fixing member 272 is formed into an L-shape, like a bracket, and has a base end thereof fixed to the side of an upper portion of the base 21 and a front end thereof brought into abutment with the side of a lower portion of the stone surface plate 22 through an adjusting bolt 273. The stone surface plate 22 is placed on the base 21 in a non-fastened condition, and when the base 22 is transported, by using the fixing members 272, the stone surface plate 22 is fixed to the base 21 in a manner immovable in the X-axis direction and the Y-axis direction (front-rear and left-right directions).

The stone surface plate 22 supports the X-axis table 23 and the Y-axis table for accurately moving the functional liquid droplet ejection heads 7 such that they do not incur a loss in accuracy due to environmental conditions, vibrations or the like, and is made of plain stone material having a rectangular shape in plan view. On the bottom of the stone surface plate 22, there are provided three main supporting legs 275 and six auxiliary supporting legs 276 each with an adjusting bolt, for supporting the stone surface plate 22 on the base 21. The three main supporting legs 275 support the stone surface plate 22 at three points, for ensuring the parallelism (including levelness) of the surface of the stone surface plate 22, and the six auxiliary supporting legs 276 support portions of the stone surface plate outside the three main supporting legs 275 to suppress bending thereof.

Figure 17:
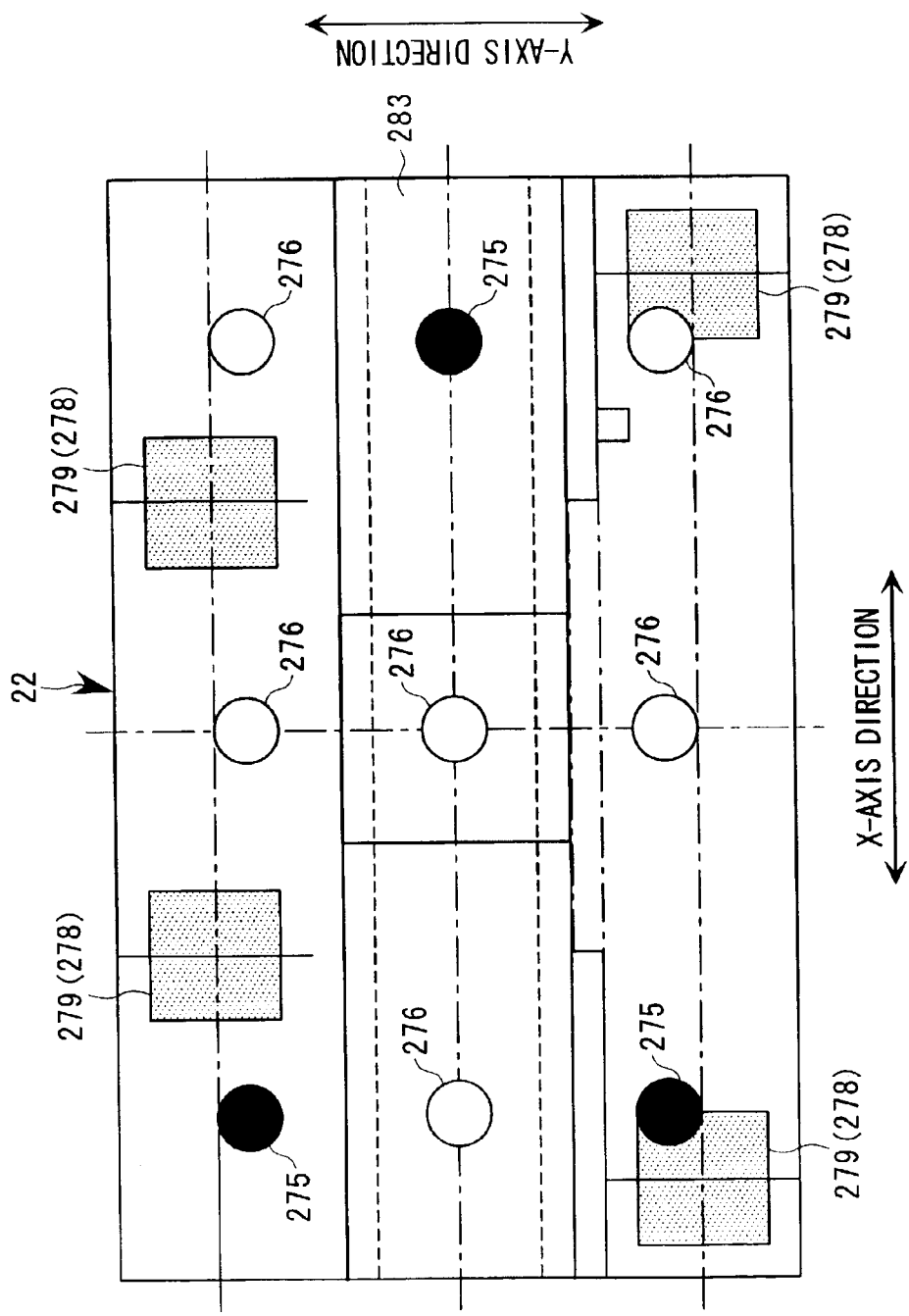
FIG. 17 is a schematic view illustrating a manner of support of the stone surface board of the liquid droplet ejection device.

To this end, as schematically shown in FIG. 17, the three main supporting legs 275, 275, 275 are arranged in the form of an isosceles triangle and the two main supporting legs 275 defining a base of the triangle are arranged such that they are located toward a substrate-introducing side of the stone surface plate 22 (left side in FIG. 17 and front side in FIG. 1). Further, the six auxiliary legs 276, 276, 276, 276, 276, 276 are arranged uniformly and in a distributed manner, such that the legs including the three main legs 275, 275, 275 are in a 3-by-3 matrix.

In this case, on the stone surface plate 22, the X-axis table 23 is arranged such that the axis of the X-axis table 23 coincides with a center line of the stone surface plate 22 along its long side, and the Y-axis table is arranged such that the axis of the Y-axis table coincides with a central axis along the short side of the stone surface plate 22. To this end, the X-axis table 23 is directly fixed to the stone surface plate 22, while the Y-axis table 24 has its four supporting columns 278 fixed to the stone surface plate 22 through respective spacer blocks 279. This arranges the Y-axis table 24 above the X-axis table 23 in a manner straddling the same and orthogonal thereto.

Figure 14:
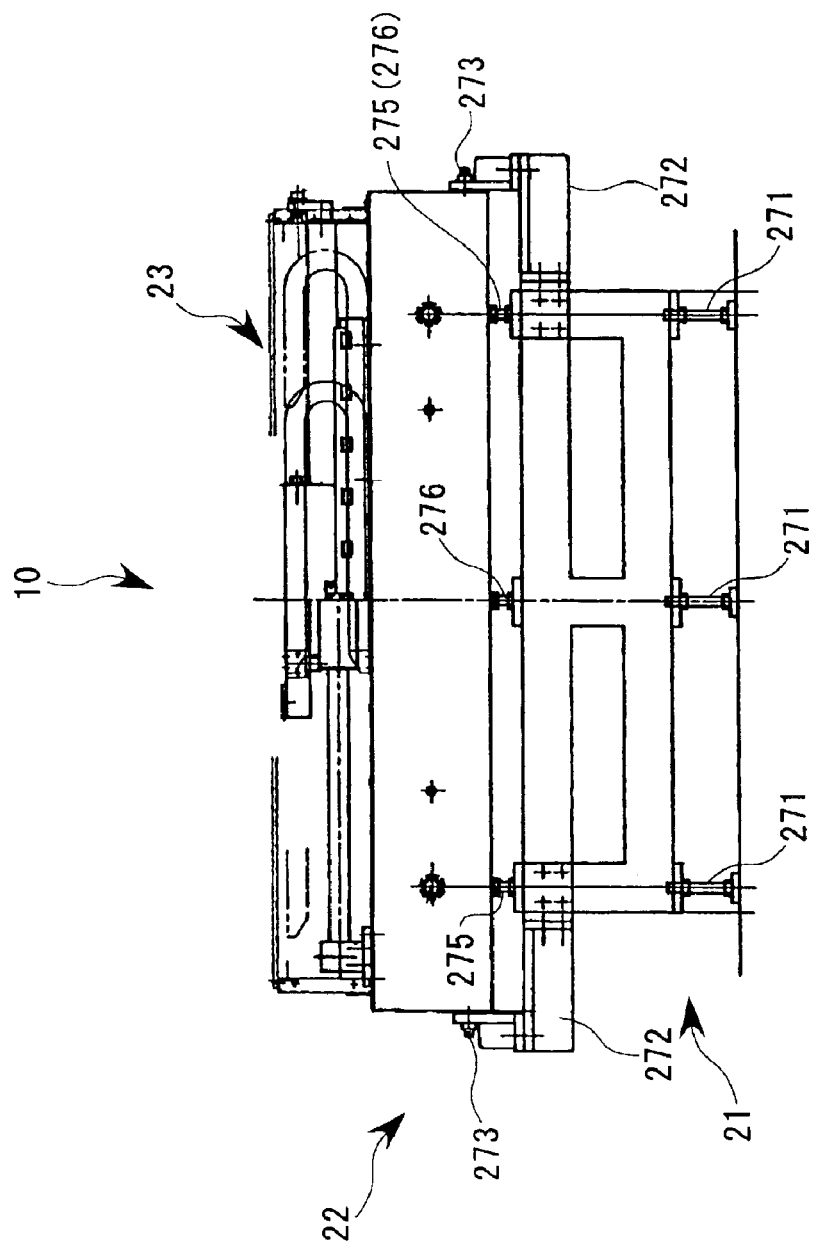
FIG. 14 is a side view of a stone surface plate of a liquid droplet ejection device and therearound.
Figure 16:
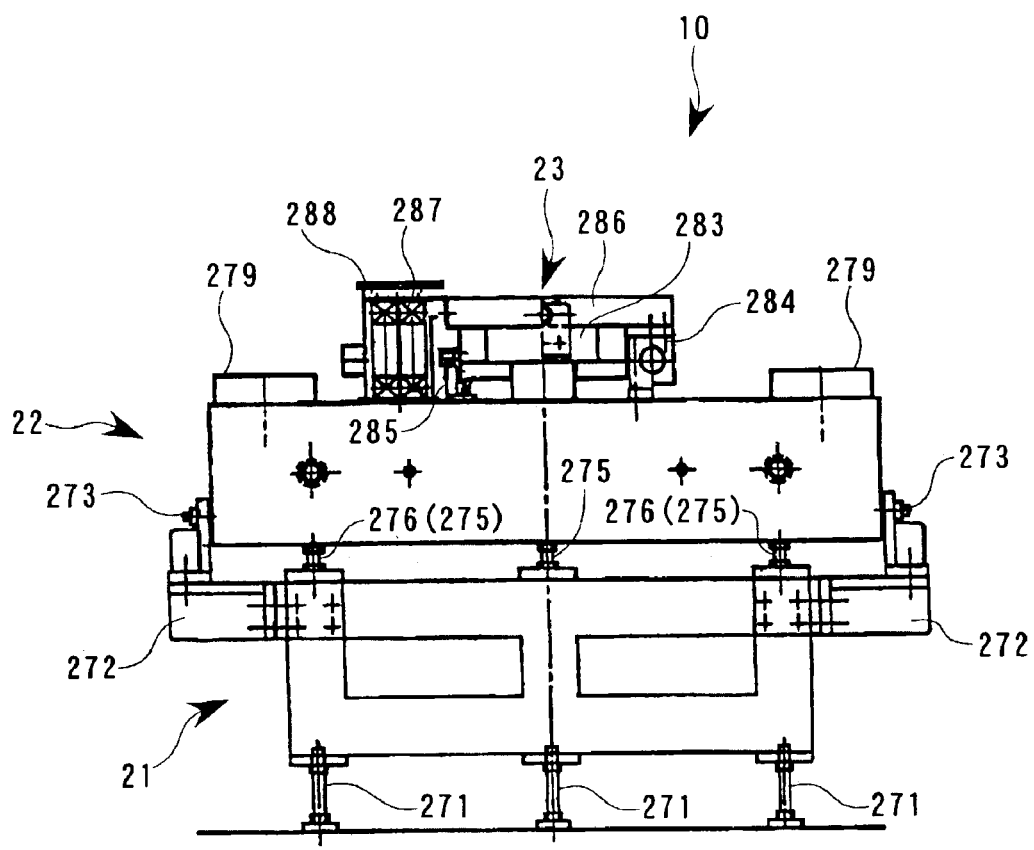
FIG. 16 is a front view of the stone surface plate of the liquid droplet ejection device and therearound.
Figure 18:
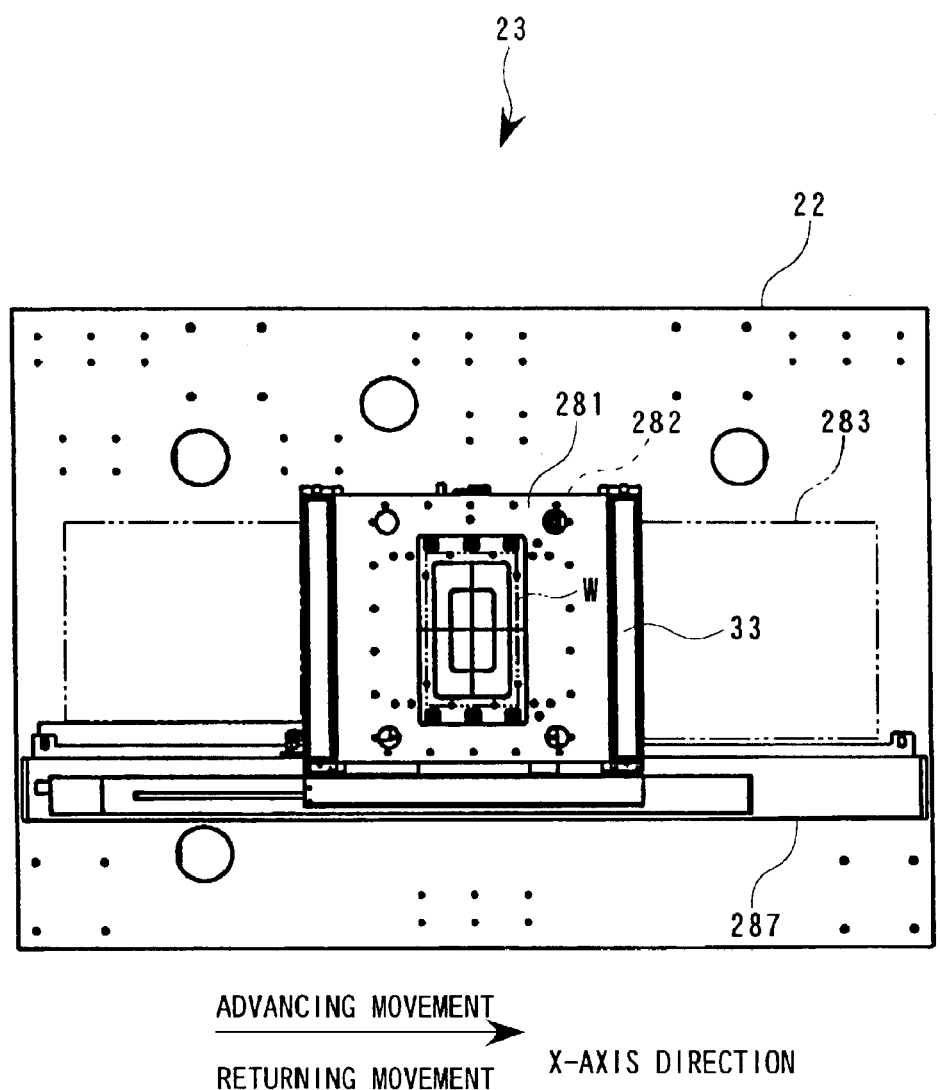
FIG. 18 is a plan view of an X-axis table of the liquid droplet ejection device.
Figure 19:
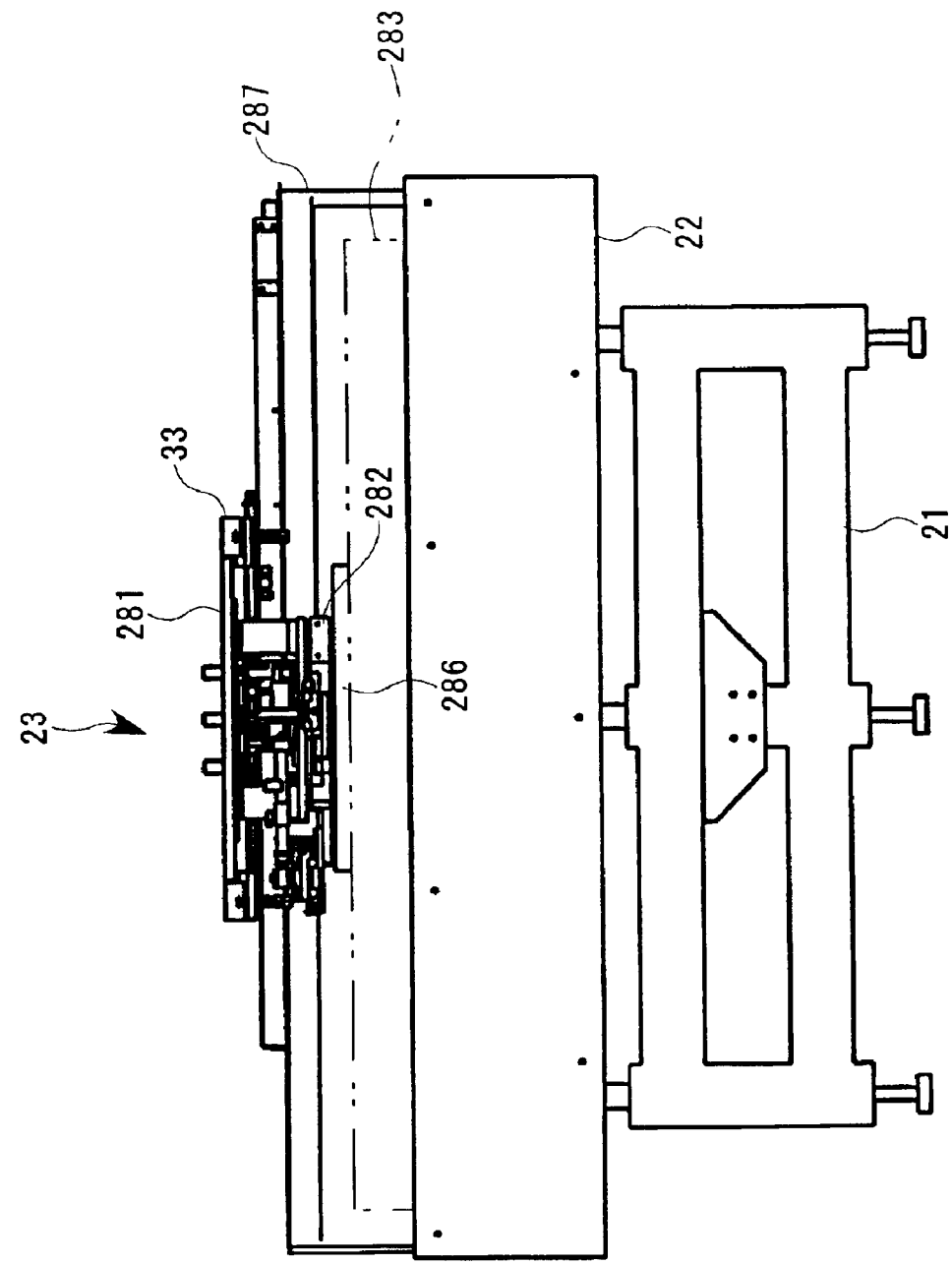
FIG. 19 is a side view of an X-table of the liquid droplet ejection device.
Figure 20:
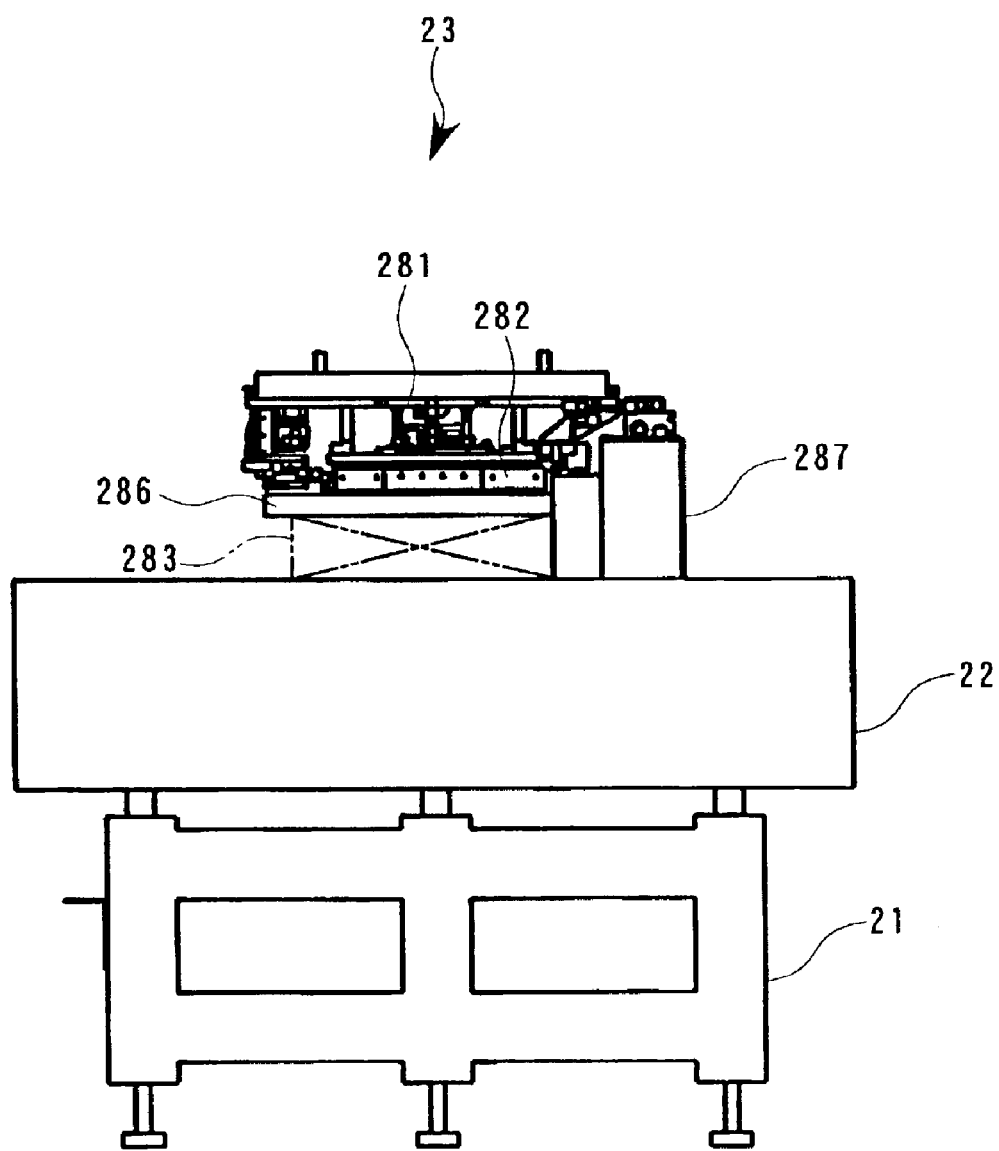
FIG. 20 is a front view of the X-table of the liquid droplet ejection device.

As shown in FIGS. 14 to 16 (X-axis moving system) and FIGS. 18 to 20 (θ moving system), the X-axis table 23 extends in the direction along the long side of the stone surface table 22, and is made up of the suction table 281 for setting the substrate W by attraction by suction of air, a θ table 282 supporting the suction table 281 (see FIGS. 18 to 20), an X-axis air slider 283 which has a slide base 286 holding the θ table 282 and supports the θ table 282 in a manner slidable in the X-axis direction, an X-axis linear motor 284 for moving the substrate W on the suction table 281 in the X-axis direction through the θ table 282, and an X-axis linear scale 285 arranged adjacent to the X-axis air slider 283 (see FIGS. 14 to 16).

The X-axis linear motor 284 is located on a side of the X-axis air slider 283 through which the head unit 26 is carried in, while the X-axis linear scale 285 is located on a side of the X-axis air slider 283 toward the accessory unit 11. These X-axis linear motor 284 and X-axis linear scale 285 are arranged in parallel with each other. The X-axis linear motor 284, the X-axis air slider 283, and the X-axis linear scale 285 are directly supported on the stone surface plate 22. The suction table 281 has a vacuum tube (not shown) leading to the above vacuum suction device 15, connected thereto, and attracts the substrate W set by suction of air such that the substrate W maintains flatness.

Further, on a side of the X-axis linear scale 285 toward the accessory unit 11, an X-axis cable bearer 287 is arranged on the stone surface plate 22, in parallel with the X-axis cable bearer 287, in a state received in a box 288. The X-axis cable bearer 287 accommodates the vacuum tube for the suction table 281, cables for the θ table 282, etc., such that they follow the motion of the suction table 281 and the θ table 282 (see FIGS. 15 and 16).

In the X-axis table 23 constructed as above, by being driven by the X-axis linear motor 284, the suction table 281 having the substrate W attracted thereto and the θ table 282 are moved in the X-axis direction by using the X-axis air slider 283 as a guide. In the reciprocating motion in the X-axis direction, the functional liquid droplet ejection heads 7 relatively perform the main scanning by the advancing motion from the substrate-introducing side toward the inside of the X-axis table. Further, based on a result of recognition by the primary substrate-sensing cameras 290, referred to hereinafter, θ correction of the substrate W (angle correction within the horizontal plane) is carried out by the θ table 282.

Figure 21:
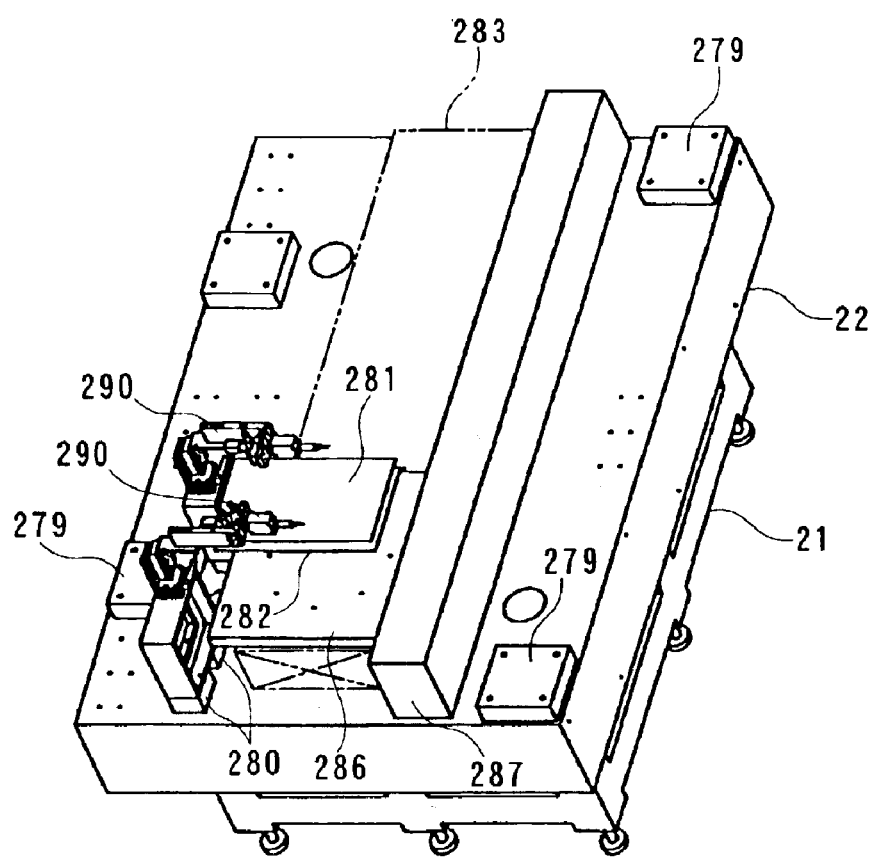
FIG. 21 is a perspective view of primary substrate-sensing cameras of the liquid droplet ejection device and therearound.

FIG. 21 represents the primary substrate-sensing cameras. As shown in the figure, immediately above the suction table 281, a pair of the primary substrate-sensing cameras 290, 290 are arranged in a manner facing toward the inlet position (passing position) through which the substrate W is introduced. The pair of primary substrate-sensing cameras 290, 290 are configured to recognize two reference positions (not shown) of the substrate W simultaneously by image recognition.

Figure 22:
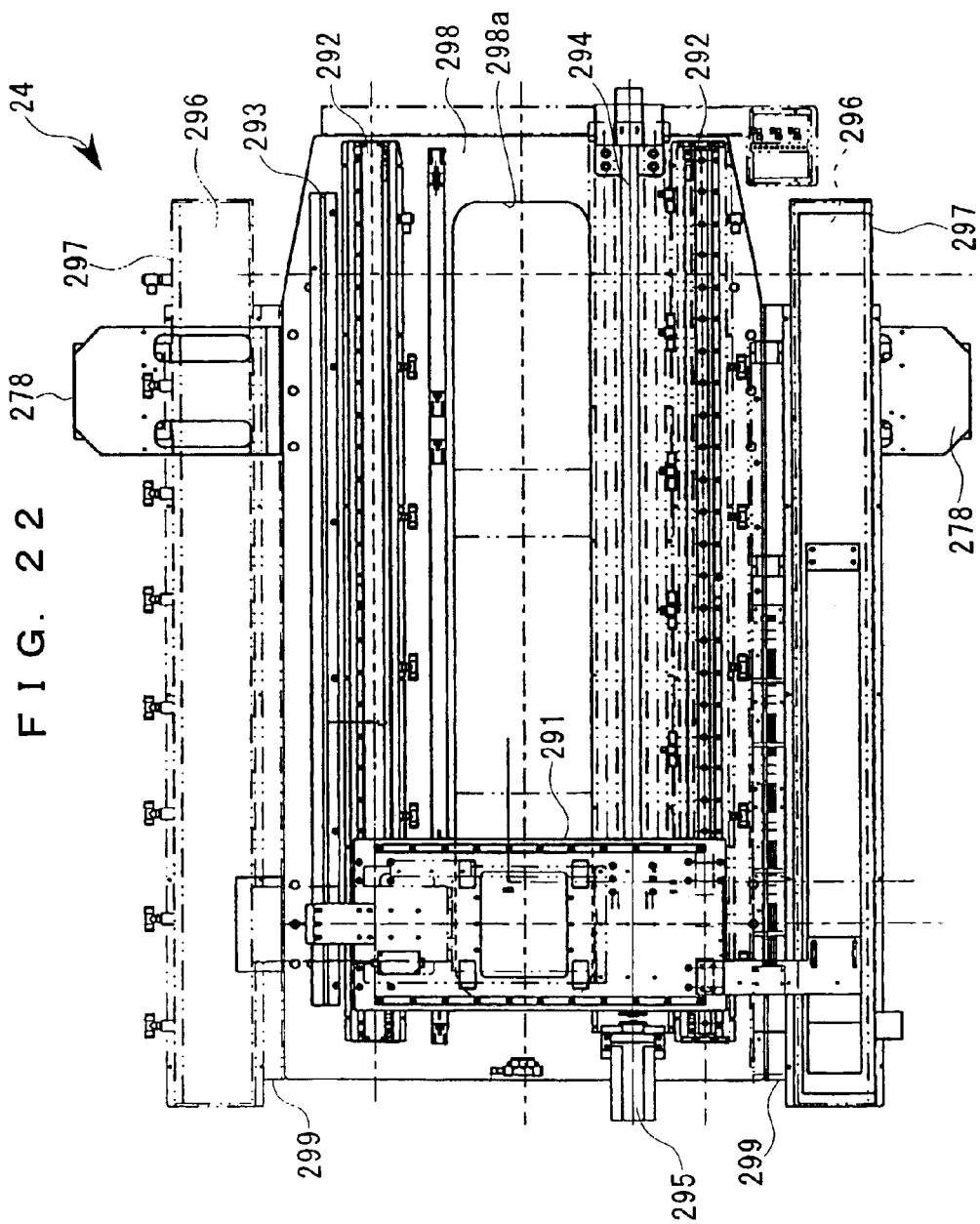
FIG. 22 is a plan view of a Y-axis table of the liquid droplet ejection device.
Figure 23:
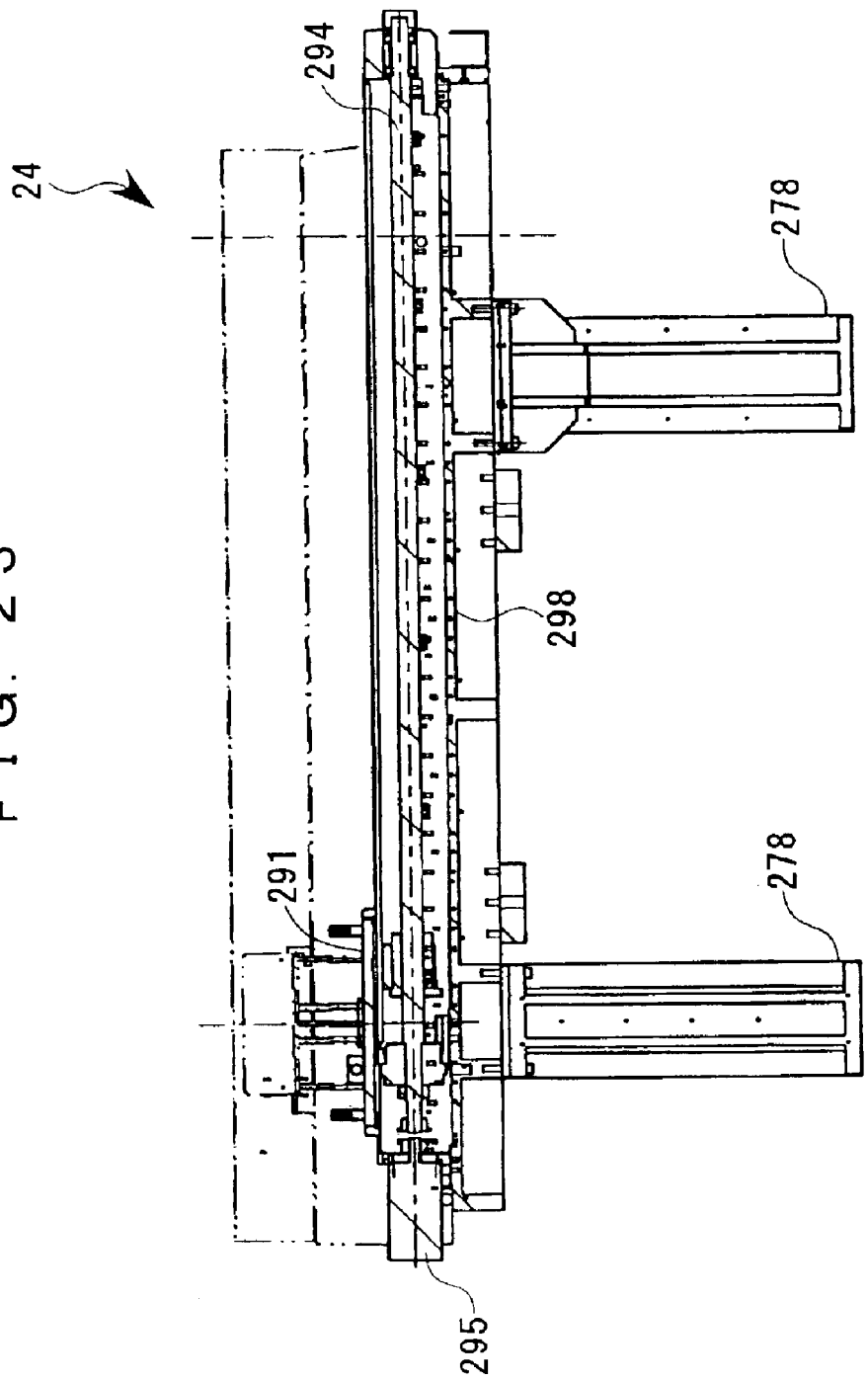
FIG. 23 is a side view of the Y-axis table of the liquid droplet ejection device.
Figure 24:
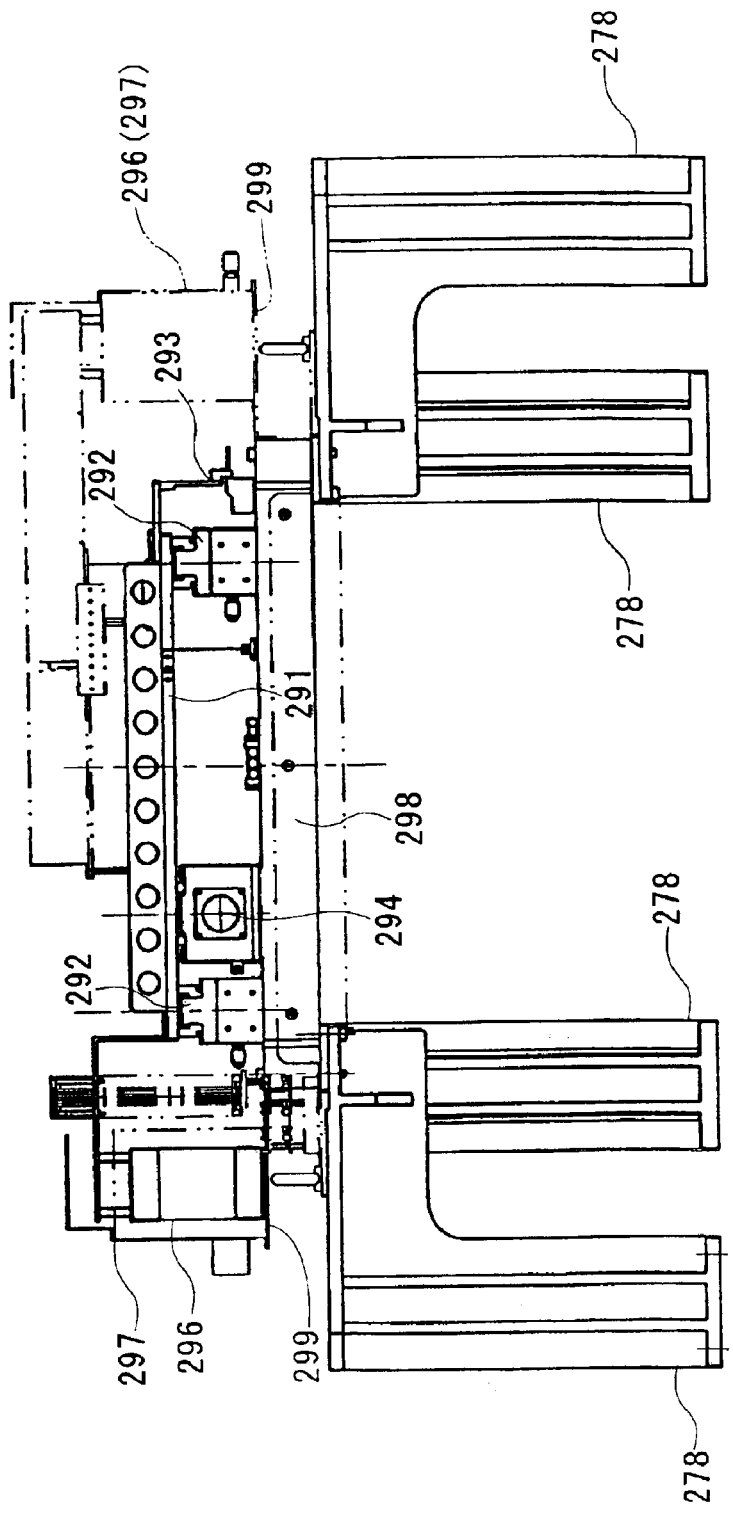
FIG. 24 is a front view of the Y-axis table of the liquid droplet ejection device.

As shown in FIGS. 22, 23, and 24, the Y-axis table 24, which extends in the direction along the short side of the stone surface plate 22, is made up of a bridge plate 291 suspending therefrom the main carriage 25 described above, a pair of Y-axis sliders 292, 292 supporting the bridge plate 291 at opposite ends such that the bridge plate 291 is slidable in the Y-axis direction, a Y-axis linear scale 293 arranged adjacent to the Y-axis slider 292, a Y-axis ball screw 294 for moving the bridge plate 291 in the Y-axis direction by using the pair of Y-axis sliders 292, 292 as guides, and a Y-axis motor 295 for causing normal and inverse rotations of the Y-axis ball screw 294. Further, at respective locations on opposite sides of the pair of Y-axis sliders 292, 292, a pair of Y-axis cable bearers 296, 296 are arranged in a state received in boxes 297, 297.

The Y-axis motor 295 is formed by a servo motor, and when the Y-axis motor 295 performs normal and reverse rotations, the bridge plate 292 is moved in the Y-axis direction through the Y-axis ball screw 294 which extends through the bridge plate 292 in a screwed manner, by using the pair of Y-axis sliders 292, 292 as guides. That is, as the bridge plate 291 is moved in the Y-axis direction, the main carriage 25 is moved in the Y-axis direction. In the reciprocating motion in the Y-axis direction of the main carriage (head unit 26) 25, the functional liquid droplet ejection heads 7 perform the sub-scanning by the advancing motion from the home position side toward the accessory unit 11.

On the other hand, on the four supporting columns 278, a bearer plate 298 having a rectangular opening 298a formed in a portion of motion path of the main carriage 25 is supported, and the pair of Y-axis sliders 292, 292 and the Y-axis ball screw 294 are arranged on the bearer plate 298 in parallel with each other such that they avoid the rectangular opening 298a. Further, the pair of Y-axis cable bearers 296, 296 are arranged on a pair of supporting plates 299, 299 outwardly hanging over from the bearer plate 298, together with the boxes 297, 297.

The Y-axis cable bearer 296 on the substrate-introducing side mainly contains cables connected to the head unit 26, while the Y-axis cable bearer 296 on the opposite side mainly contains tubes for the functional liquid connected to the head unit 26 (none of which are shown). And, these cables and tubes are connected to a plurality of the functional liquid droplet ejection heads 7 of the head unit 26 through the bridge plate 291.

Figure 25:
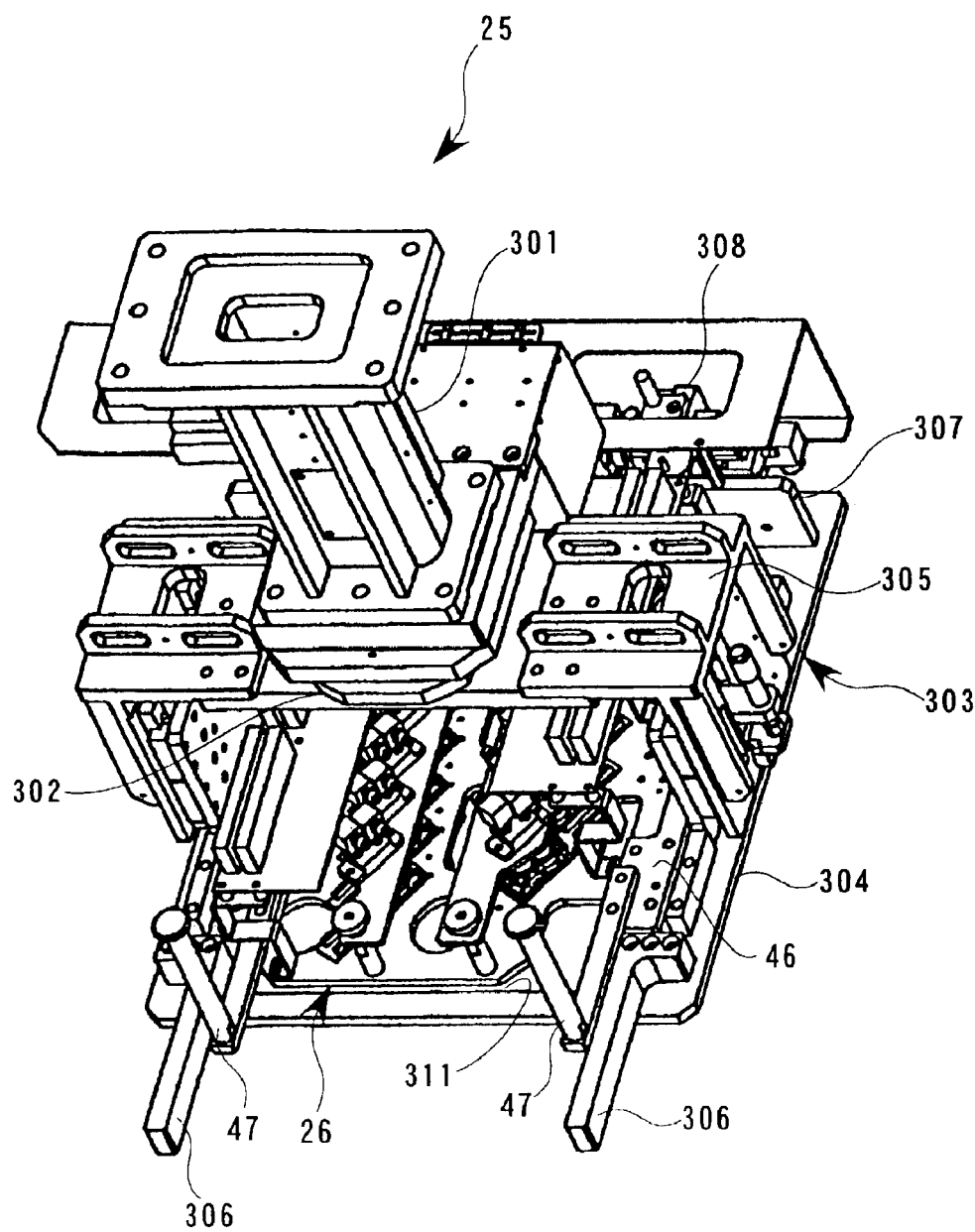
FIG. 25 is a perspective view of a main carriage of the Y-axis table.
Figure 26:
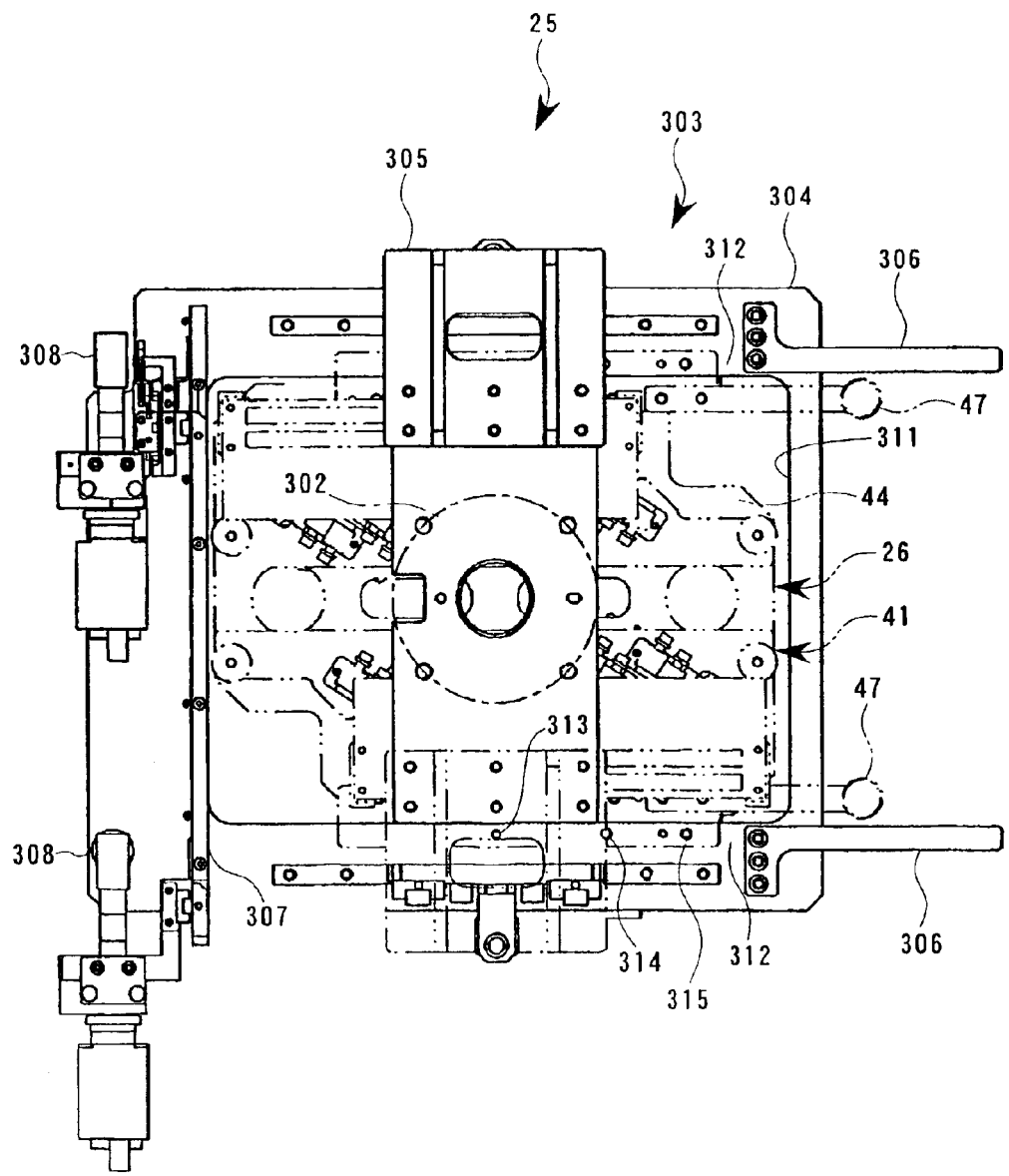
FIG. 26 is a plan view of the main carriage of the Y-axis table.

As shown in FIGS. 25 and 26, the main carriage 25 is made up of a suspension member 301 fixed to the bridge plate 291 from below and having the appearance of "I shape", a θ table 302 attached to the underside of the suspension member 301, and a carriage body 303 attached to the underside of the θ table 302 in a manner suspended therefrom. And, the suspension member 301 faces toward the rectangular opening 298a of the bearer plate 298 described above.

The carriage body 303 includes a base plate 304 on which the head unit 26 is seated, an arch member 305 supporting the base plate 304 such that the base plate 304 is suspended therefrom, a pair of temporary-placing angles 306, 306 provided in a manner protruding from one end of the base plate 304, and a stopper plate 307 arranged at the other end of the base plate 304. Further, outside the stopper plate 307, the pair of secondary substrate-sensing cameras 308 are arranged for recognizing the substrate W.

The base plate 304 is formed with a rectangular opening 311 in which the main body plate 44 of the head unit 26 is loosely fitted, and left and right opening edge portions 312 defining the rectangular opening 311 are formed with two through holes 313, 313 and the dowel pin 314 which correspond to the two bolt holes 65, 65 and the pin hole 66 formed in the supporting members 46, 46 of the head unit 26. In this case, the width of the rectangular opening 311 and the width of the main body plate 44 are approximately equal to each other, and the head unit 26 to be set from a lateral side is inserted with the left and right sides thereof being guided by the left and right sides of the rectangular opening 311.

The temporary-placing angles 306 each have a sufficient thickness (height), and a base portion thereof, which is bent outward into an "L" shape, is fixed to the end portions of the base plate 304 in a manner placed thereon. Further, the spacing dimension between the two temporary-placing angles 306, 306 corresponds to the spacing dimension between the two supporting members 46, 46 of the head unit 26. Therefore, the head unit 26 is temporarily placed by having the two supporting members 46, 46 thereof seated on the two temporary-placing angles 306, 306, and at the same time, insertion of the same into the base plate 304 is guided by the two temporary-placing angles 306, 306. Further, in this state, the head body 130 of each functional liquid droplet ejection head 7 is sufficiently floated above the base plate 304, whereby interference of the head body 130 with the base plate 304 is prevented.

Figure 27A:
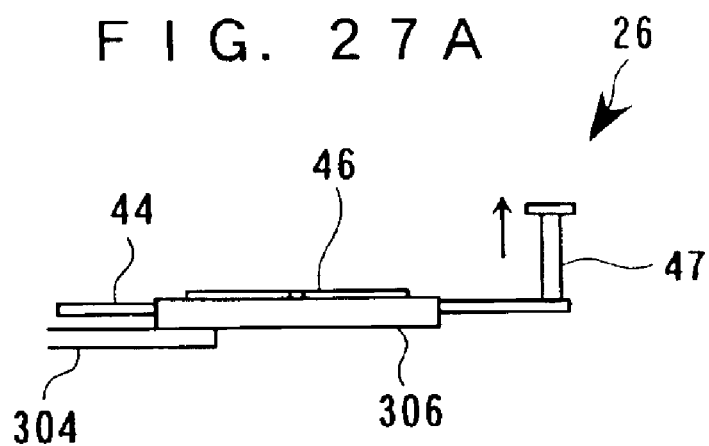
FIGS. 27A to 27C are explanatory views illustrating a manner of setting the head unit.
Figure 27B:
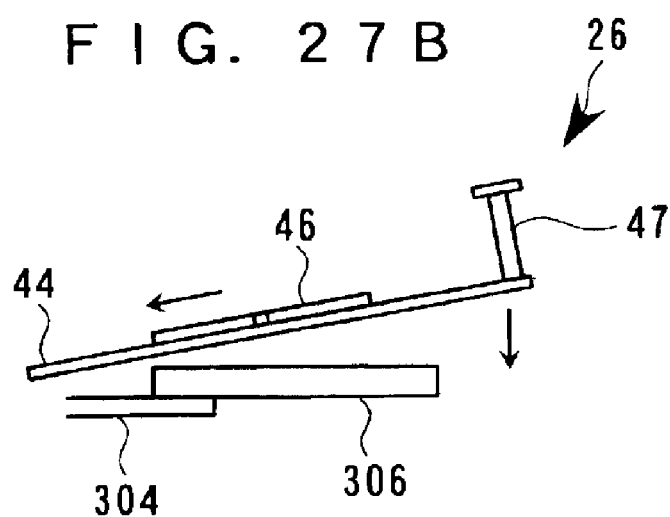
Figure 27C:
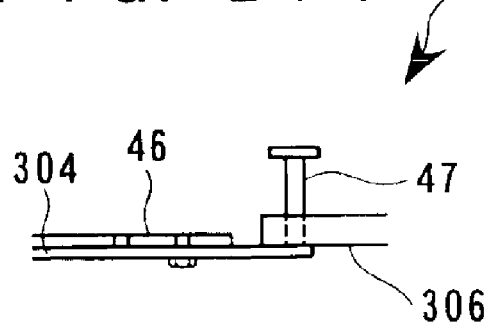

As shown in FIGS. 27A to 27C, when the head unit 26 is set to the base plate 304 of the main carriage 25, first, the head unit 26 is carried in by holding the two handles 47, 47 thereof by hand and placed on the two temporary-placing angles 306, 306 (temporary placement). Here, although not specifically illustrated, the main tubes 54 of the liquid droplet ejection device 10 arranged on the arch member 305 are connected to the piping connection assembly 51 on the head unit 206 and at the same time the main cables 55 are connected to the wiring connection assembly 53 (FIG. 27A).

When the connecting operations are completed, the handles 47, 47 are grasped again, and the head unit 26 is pushed in forward by using the two temporary-placing angles 306, 306 as the guides, and further, tilted such that the leading end portion of the head unit 26 is lowered (FIG. 27B). As the head unit 26 is tilted, the leading end of the main body plate 44 is inserted into the rectangular opening 311, and at the same time, the leading ends of the two supporting members 46, 46 reaches the two opening edge portions 312, 312. After the supporting members 46, 46 reach the opening edge portions 312, 312, the supporting members 46, 46 are lifted off the angles 306, 306, and now, using the leading ends of the supporting members 46, 46 as the center, the head unit 26 is pushed further inward while causing the same to slide on the opening edge portions 312.

Then, when the leading ends of the head unit 26 abut the stopper plate 307, the rear of the head unit 26 is slowly lowered to be seated on the base plate 304 such that the dowel pins 314 on the opening edge portions 312, 312 are fitted in the pin holes 66 of the supporting members 46, 46. Here, the supporting members 46, 46 are fixedly screwed to the base plate 304, thereby completing the operations (FIG. 27C).

Thus, the head unit 26 is temporarily placed on the temporary-placing angles 306 of the main carriage 25, and in this state, required piping and wiring connections are carried out, and therefore, operations for these connections are easy to perform, and the head unit 26 after the connecting operations can be properly set in a narrow space. Further, since the head unit 26 is set by sliding the same from the temporary-placing angles 306 to the base plate 304 one step lower, the head unit 26 can be set on the main carriage 25 in a softly landed manner, whereby the head unit 26, heavy in weight, can be smoothly set without a shock.

By the way, the apparatus for assembling a head unit and the head unit 1 assembled thereby can be applied not only to the drawing system B but also to methods of manufacturing various flat displays and methods of manufacturing electronic devices and optical devices. Therefore, manufacturing methods employing the head unit 1 will be described by taking as examples a method of manufacturing a liquid crystal display device and a method of manufacturing an organic EL device.

Figure 28A:
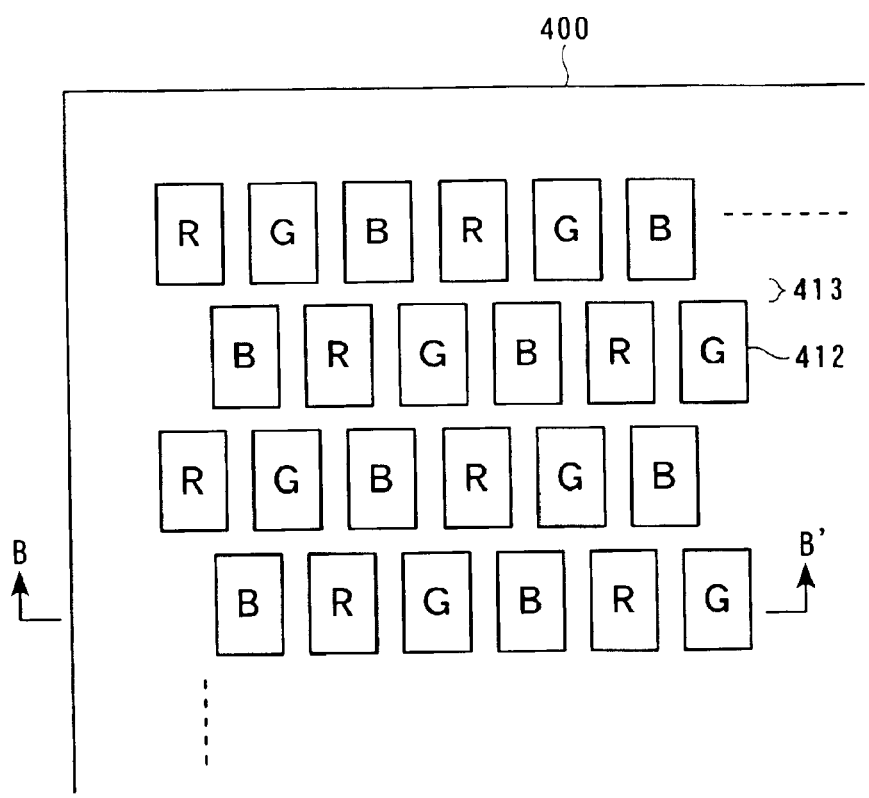
Figure 28B:
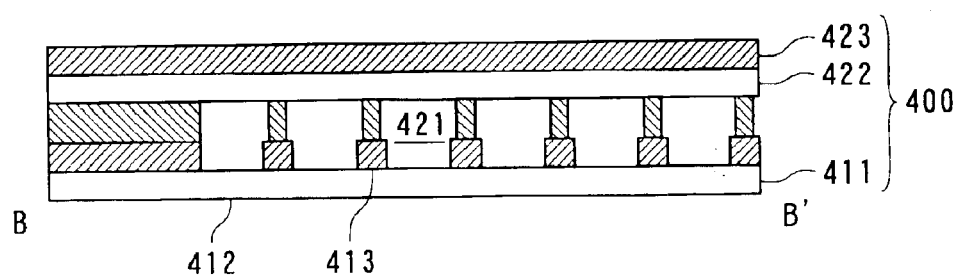

FIGS. 28A and 28B are enlarged partial views of a color filter for a liquid crystal display device. FIG. 28A is a plan view of the color filter, and FIG. 28B is a cross-sectional view of the same taken on line B—B of FIG. 28A. Hatching for showing cross-sectional portions is partially omitted.

As shown in FIG. 28A, the color filter 400 includes pixels (filter elements) 412 arrayed in the form of a matrix, and pixels are separated by partitions 413 arranged in the boundaries. To each pixel 412 is introduced one of inks (filter materials) of red (R), green (G), and blue (B). Although in this example, a so-called mosaic layout is employed to lay out the pixels of red, green and blue, this is not limitative, but any of other suitable layouts, such as the stripe layout and, and the delta layout, may be employed.

As shown in FIG. 28B, the color filter 400 includes a transparent substrate 411 and the light-shielding partitions 413. Portions where no partitions 413 are formed on the substrate 411 (where the partitions 413 are eliminated) form the above pixels 412. Inks of the colors introduced into the pixels 412 form a colored layer 421. There are formed an overcoating layer 422 and an electrode layer 423 on upper surfaces of the partitions 413 and the colored layer 421.

Figure 29:
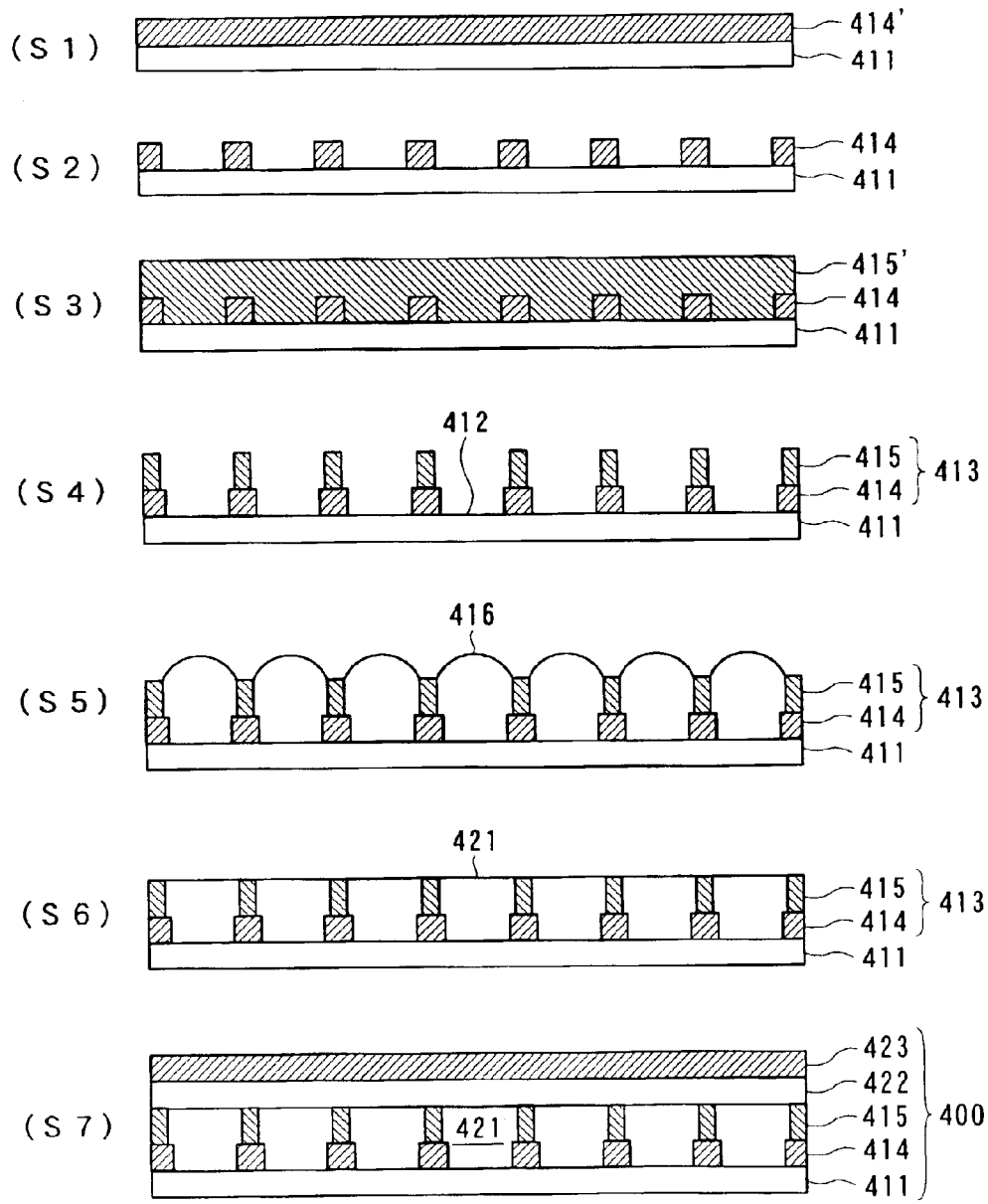
FIG. 29 are cross-sectional views schematically illustrating a color filter-manufacturing method.

FIG. 29 provides cross-sectional views useful in explaining a process of manufacturing a color filter by the color filter-manufacturing method according to this embodiment of the invention. In the figure, hatching for showing cross-sectional portions is partially omitted.

The surface of the transparent substrate 411 formed of non-alkali glass having a film thickness of 0.7 mm, a length of 38 cm, and a width of 30 cm is cleaned with a cleaning liquid prepared by adding 1 wt % of hydrogen peroxide to heated concentrated sulfuric acid. Then, after being rinsed in pure water, the surface is dried by air to obtain a clean surface. On this surface, a chromium film having an average thickness of 0.2 $\mu$m is formed by a sputtering method, thereby obtaining a metal layer 414' (FIG. 29: S1).

The substrate is dried at 80° C. for five minutes on a hot plate, and after that a photoresist layer, not shown, is formed on the surface of the metal layer 414' by spin coating. A matrix film having a required matrix pattern drawn thereon is brought into intimate contact with the surface of the substrate, and exposed to ultraviolet rays. Then, the substrate with the matrix film is immersed in an alkaline developer containing 8 wt % of potassium hydroxide, and a photoresist of an unexposed part is removed to pattern the photoresist layer. Subsequently, the exposed metal layer is removed with an etching liquid mainly composed of hydrochloric acid. As described above, it is possible to obtain a light-shielding layer (black matrix) 414 having a predetermined matrix pattern (FIG. 29: S2). The light-shielding layer 414 has a film thickness of approximately 0.2 $\mu$m, and a trace width of approximately 22 $\mu$m.

The above substrate is further coated with a negative-type transparent acrylic photosensitive resin composition 415' also by the spin coating method (FIG. 29: S3). After being pre-baked at 100° C. for 20 minutes, the substrate coated with the resin composition 415' is exposed to ultraviolet rays by using the matrix film having the predetermined matrix pattern drawn thereon. The resin of unexposed portions of the resin composition 415' is developed with an alkaline developer, and spin-dried after rinsing in pure water. The resin portion of the resin composition 415' is sufficiently cured by performing an after-baking treatment as a final drying treatment at 200° C. for 30 minutes, to form a bank layer 415, whereby the partition 413 made up of the light-shielding layer 414 and the bank layer 415 is formed (FIG. 29: S4). The bank layer 415 has an average film thickness of 2.7 $\mu$m, and a bank width of approximately 14 $\mu$m.

So as to improve the ink wettability to a colored layer-forming area (especially, an exposed surface of the glass substrate 411) divided by the obtained light-shielding layer 414 and bank layer 415, dry etching, that is, a plasma treatment is carried out. More specifically, a high voltage is applied to a mixed gas produced by adding 20% of oxygen to helium, to form an etching spot in a plasma atmosphere. Then, the substrate is passed underneath the etching spot for etching.

Then, the above respective inks of R (red), G (green), and B (black) are introduced by the ink jet method into the pixels 412 formed by dividing the colored layer-forming area by the partition 413 (FIG. 29: S5). Precision heads making use of piezoelectric effects are used as the functional liquid droplet ejection heads (ink jet heads). Ten very small ink droplets are selectively ejected to each colored layer-forming area. The driving frequency of each head 3 is set to 14.4 kHz, that is, the time intervals of ejection of ink droplets are set to 69.5$\mu$ seconds. The distance between the head 3 and a target of each ink is set to 0.3 mm. To attain a desired flying speed of the ink from the head to the colored layer-forming area as a target, and to prevent deflection of ink droplets in flying direction and occurrence of broken and strayed ink droplets, called satellites, not only the physical properties of the inks but also the waveform (of applied voltage or the like) for driving piezoelectric elements of the heads is important. Therefore, a waveform having conditions set in advance is programmed, whereby ink droplets of the red, green, and blue colors are simultaneously applied to the substrate to thereby coat the same with the inks in a predetermined color layout pattern.

As the ink (filter material), there is employed one which is obtained in the following manner. Namey, after an inorganic pigment is dispersed e.g. in polyurethane resin polygomer, cyclohexanone and butyl acetate as low-boiling solvents and butyl carbitol acetate as a high-boiling solvent are added to the dispersion, and further 0.01 wt % of nonionic surfactant is added to the resulting solution as a dispersant, to form ink having a viscosity of 6 to 8 centipoise.

Next, the ink applied to the substrate is dried. First, the substrate is left as it is for 3 hours in a natural atmosphere to set an ink layer 416, then heated for 40 minutes on the hot plate of 80° C., and finally heated at 200° C. for 30 minutes in an oven, for curing the ink layer 416, whereby the colored layer 421 can be obtained (FIG. 29: S6).

The overcoating layer 422 having a flat surface is formed on the substrate by applying a transparent acrylic resin coating material on the substrate by spin coating. Further, an electrode layer 423 made of indium tin oxide (ITO) is formed in a required pattern on an upper surface of the overcoating layer 422 to obtain a color filter 400 (FIG. 29: S7). It should be noted that the overcoating layer 422 may be formed by the ink jet method of ejecting ink droplets by the functional liquid droplet ejection heads (ink jet heads).

FIG. 30 is a cross-sectional view of a color liquid crystal display device as an example of an electro-optic device (flat display) manufactured by the manufacturing method according to this invention. Hatching for showing cross-sectional portions is partially omitted.

The color liquid crystal display device 450 is produced by combining the color filter 400 with a substrate 466 opposed thereto and sealing a liquid crystal composition 465 therebetween. One substrate 466 of the liquid crystal display device 450 has an inner surface thereof formed with thin film transistor (TFT) elements, not shown, and pixel electrodes 463, in the form of a matrix. Further, the color filter 400 is arranged as the other substrate such that the sections of red, green, and blue of the colored layer 421 are arranged at respective locations opposed to the pixel electrodes 463.

Respective surfaces of the substrate 466 and the color filter 400, opposed to each other, are formed with alignment layers 461, 464. The alignment layers 461, 464 are subjected to rubbing treatment and liquid crystal molecules can be arranged in a fixed direction. Further, the substrate 466 and the color filter 400 have polarizing plates 462, 467 bonded to respective outer surfaces thereof. A combination of a fluorescent light (not shown) and a diffuser plate is generally used as a backlight, and the liquid crystal composition 465 is caused to serve as an optical shutter for changing the transmittance of backlight radiation, for display.

It should be noted that the electro-optic device according to this invention is not limited to the above color liquid crystal display device, but various types of electro-optic means, such as a small-sized television which uses a thin-model Braun tube, a liquid crystal shutter, or the like, an EL display device, a plasma display, a cathode ray tube (CRT) display, and a field emission display (FED) panel, can be employed as the electro-optic device.

Next, the organic EL device (organic EL display device), and the manufacturing method for manufacturing the same will be described with reference to FIGS. 31 to 43.

FIGS. 31 to 43 show a manufacturing process for manufacturing the organic EL device including organic EL elements, and the construction of the organic EL device being produced according to the manufacturing process. The manufacturing process includes a bank portion forming process, a plasma treatment process, a light-emitting element forming process formed by a positive hole injection/transport layer forming process and a light-emitting layer forming process, an opposed electrode forming process, and a sealing process.

In the bank portion forming process, an inorganic bank layer 512a and an organic bank layer 512b are deposited sequentially at each predetermined location on a circuit element portion 502 preformed on a substrate 501, and an electrode 511 (also referred to as an "pixel electrode"), whereby a bank portion 512 formed with openings 512g is formed. As described above, the bank portion forming process includes a process for forming the inorganic bank layer 512a on part of the electrode 511, and a process for forming the organic bank layer 512b on the inorganic bank layer.

Figure 31:
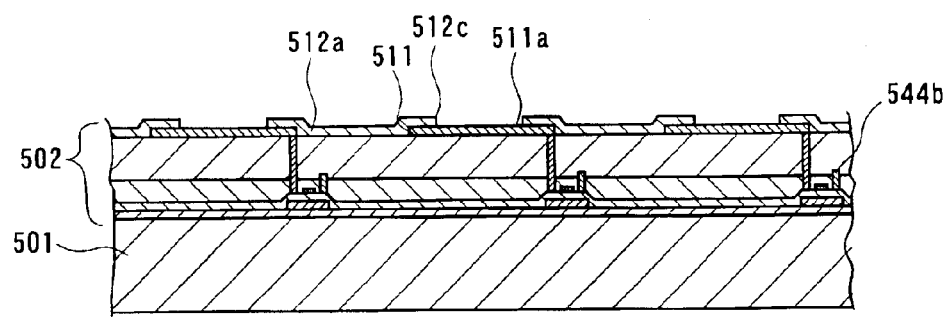
FIG. 31 is a cross-sectional view of a process for producing bank portions (inorganic banks) by a method of manufacturing an organic EL device.

First, as shown in FIG. 31, in the process for forming the inorganic bank layer 512a, the inorganic bank layer 512a is formed on a second interlayer-insulating film 544b of the circuit element portion 502, and the pixel electrode 511. The inorganic bank layer 512a is produced by forming an inorganic film made of $SiO_2$, $TiO_2$, or the like, on all the surfaces of an interlayer-insulating layer 514 and the pixel electrodes 511, by a chemical vapor deposition (CVD) method, the coating method, the sputtering method, a vapor deposition method, or the like.

Next, the inorganic film is patterned by etching to thereby form lower openings 512c at locations corresponding to locations where electrode surfaces 511a of the electrodes 511 are formed. At this time, it is necessary to form the inorganic bank layer 512a such that it overlaps peripheral portions of the electrodes 511. By forming the inorganic bank layer 512a in a manner overlapping the peripheral portions (parts) of the electrodes 511, as described above, it is possible to control the light-emitting areas of a light-emitting layer 510.

Figure 32:
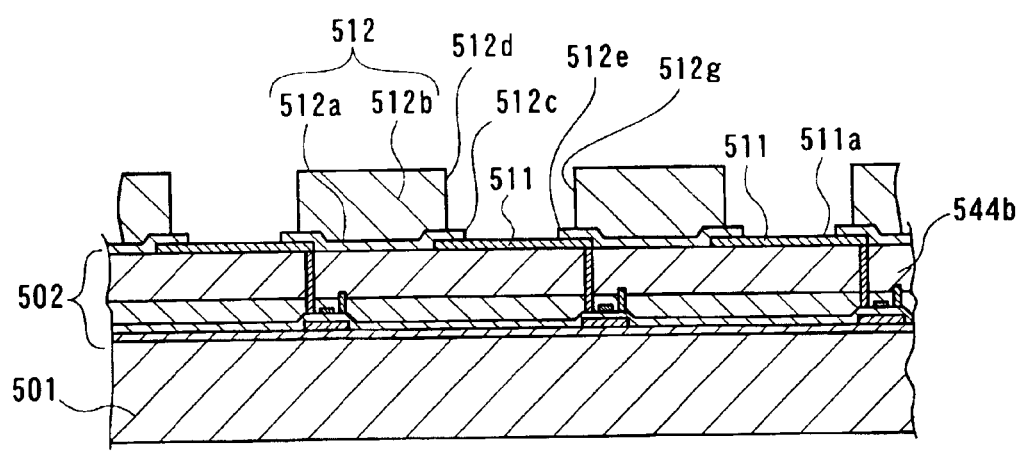
FIG. 32 is a cross-sectional view of a process for producing bank portions (organic banks) by the method of manufacturing an organic EL device.

Next, as shown in FIG. 32, in the process for forming the organic bank layer 512b, the organic bank layer 512b is formed on the inorganic bank layer 512a. The organic bank layer 512b is etched e.g. by a photo-lithographic technology to form upper openings 512d. The upper openings 512d are arranged at respective locations corresponding to the electrode surfaces 511a and the lower openings 512c.

As shown in FIG. 32, preferably, the upper opening 512d is formed to be wider than the lower opening 512c, and narrower than the electrode surface 511a. As a result, a first laminated portion 512e surrounding the lower opening 512c of the inorganic bank layer 512a is arranged in a manner such that it is further extended toward the center of the electrode 511 than the organic bank layer 512b. Thus, the upper opening 512d and the lower opening 512c are formed to communicate with each other, whereby an opening 512g is formed which extends through the inorganic bank layer 512a and the organic bank layer 512b.

Next, in the plasma treatment process, a region exhibiting ink affinity and a region exhibiting ink repellence are formed on a surface of each bank portion 512 and on the electrode surface 511a of each pixel electrode 511. This plasma treatment process is largely classified into a preheating process, an ink affinity-imparting process for imparting the ink affinity to an upper surface (512f) of the bank portion 512, wall surfaces of the opening 512g, and the electrode surface 511a of the pixel electrode 511, an ink repellence-imparting process for imparting the ink repellence to the upper surface 512f of the organic bank layer 512b, and wall surfaces of the upper opening 512d, and a cooling process.

First, in the preheating process, the substrate 501 including the bank portions 512 is heated to a predetermined temperature. The heating is carried out by attaching a heater to a stage on which the substrate 501 is placed and heating the substrate 501 together with the stage by the heater. More specifically, it is preferable to preheat the substrate 501 at a temperature within a range of 70 to 80° C., for instance.

Figure 33:
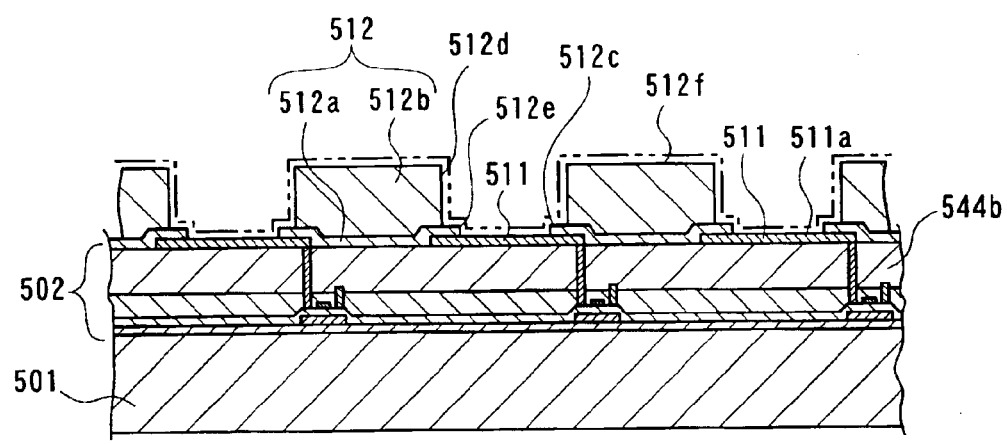
FIG. 33 is a cross-sectional view of a plasma treatment process (liquid affinity-imparting process) in the method of manufacturing an organic EL device.

Then, in the ink affinity-imparting process, a plasma treatment ($O_2$ plasma treatment) is carried out by using oxygen as a process gas in the air atmosphere. As shown in FIG. 33, by this $O_2$ plasma treatment, the ink affinity-imparting treatment is effected on the electrode surface 511a of each pixel electrode 511, the first laminated portions 512e of the inorganic bank layer 512a, and the wall surfaces of each upper opening 512d and the upper surfaces 512f of the organic bank layer 512b. The ink affinity-imparting treatment introduces hydroxyl groups into the above respective surfaces, thereby imparting the ink affinity thereto. In FIG. 33, portions having been subjected to the ink affinity-imparting treatment are indicated by one-dot-chain lines.

Next, in the ink repellence-imparting process, a plasma treatment ($CF_4$ plasma treatment) is carried out by using tetrafluoromethane as a process gas in the air atmosphere. As shown in FIG. 34, by this $CF_4$ plasma treatment, the ink repellence-imparting treatment is effected on the wall surfaces of the upper openings 512d, and the upper surfaces 512f of the organic bank layer 512b. The ink repellence-imparting treatment introduces fluorine groups into the above respective surfaces, thereby imparting the ink repellence thereto. In FIG. 34, regions exhibiting the ink repellence are indicated by two-dot chain lines.

Next, in the cooling process, the temperature of the substrate 501 heated for the plasma treatments is lowered to a room temperature or a controlled temperature for an ink jet process (liquid droplet ejection process). By lowering the temperature of the substrate 501 subjected to the plasma treatments to the room temperature or a predetermined temperature (controlled temperature for execution of the ink jet process), it is possible to execute the subsequent positive hole injection/transport layer forming process at a constant temperature.

Next, in the light-emitting element forming process, a light-emitting element is formed by forming a positive hole injection/transport layer and a light-emitting layer on each pixel electrode 511. The light-emitting element forming process includes four processes: a first liquid droplet ejection process for ejecting a first composition required for forming the positive hole injection/transport layer, onto the pixel electrodes, the positive hole injection/transport layer forming process for drying the ejected first composition to form the positive hole injection/transport layer on the pixel electrodes, a second liquid droplet ejection process for ejecting a second composition required for forming the light-emitting layer, onto the positive hole injection/ transport layer, and the light-emitting layer forming process for drying the ejected second composition to form the light-emitting layer on the positive hole injection/transport layer.

First, in the first liquid droplet ejection process, the first composition containing a hole injection/transport layer forming material is ejected onto the electrode surfaces 511a by the ink jet method (liquid droplet ejection method). It should be noted that the first liquid droplet ejection process and the following processes are preferably carried out in the inert gas atmosphere, such as a nitrogen gas atmosphere, an argon gas atmosphere or the like, which contains no water nor oxygen. (Further, when the positive hole injection/transport layer is formed only on the pixel electrodes, no positive hole injection/transport layer is formed adjacent to the organic bank layer).

Figure 35:
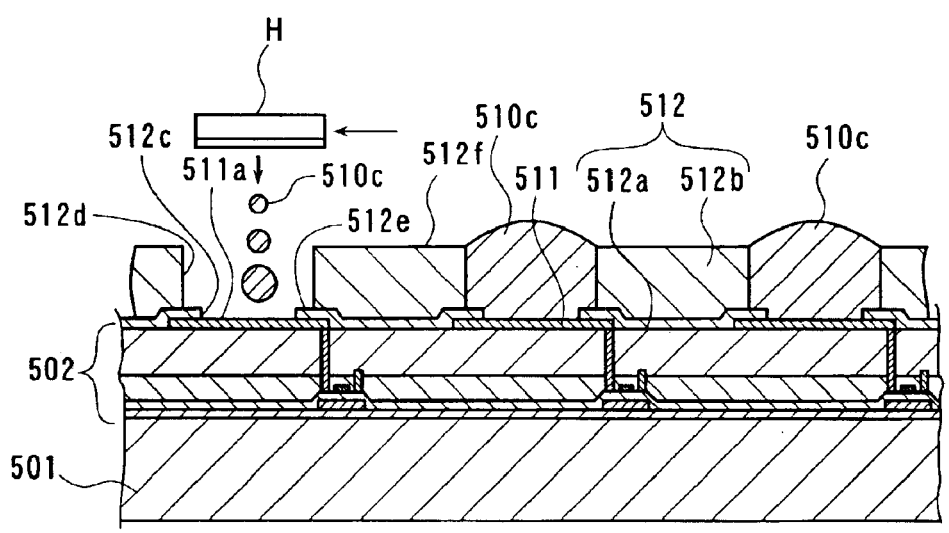
FIG. 35 is a cross-sectional view of a positive hole injection/transport layer forming process (liquid droplet ejection) in the method of manufacturing an organic EL device.

As shown in FIG. 35, the first composition containing the hole injection/transport layer forming material is filled in an ink jet head (functional liquid droplet ejection head 7) H, the nozzles of the ink jet head H are caused to face toward the electrode surfaces 511a located in the lower openings 512c, and droplets 510c, each in a controlled amount, of the first composition are ejected from the nozzles onto the electrode surfaces 511a, while moving the ink jet head H and the substrate 501 relative to each other.

As the first composition employed in this process, there may be used, for instance, a composition obtained by dissolving a mixture of a polythiophene derivative, such as polyethylenedioxythiophene (PEDOT), and polystyrenesulfonic acid (PSS), in a polar solvent. As the polar solvent, there may be mentioned, for instance, isopropyl alcohol (IPA), normal butanol, γ-butylolactone, N-methylpyrrolidone (NMP), 1, 3-dimethyl-2-imidazolidinone (DMI) and derivatives thereof, and glycol ethers, such as carbitol acetate and butyl carbitol acetate. It should be noted that the same material may be used for the respective light-emitting layers 510b of R, G, and B as the hole injection/transport layer forming material, or alternatively different materials may be used therefor.

As shown in FIG. 35, the ejected droplets 510c of the first composition spread over the electrode surface 511a and the first laminated portion 512e having been subjected to the ink affinity-imparting treatment, and fill the lower and upper openings 512c, 512d. The amount of the first composition ejected onto the electrode surface 511a is determined depending e.g. on the sizes of the lower and upper openings 512c, 512d, the thickness of the positive hole injection/transport layer to be formed, and the concentration of the hole injection/transport layer forming material in the first composition. Further, the droplets 510c of the first composition may be ejected onto the same electrode surface 511a not only by a single operation but also a plurality of separate operations.

Figure 36:
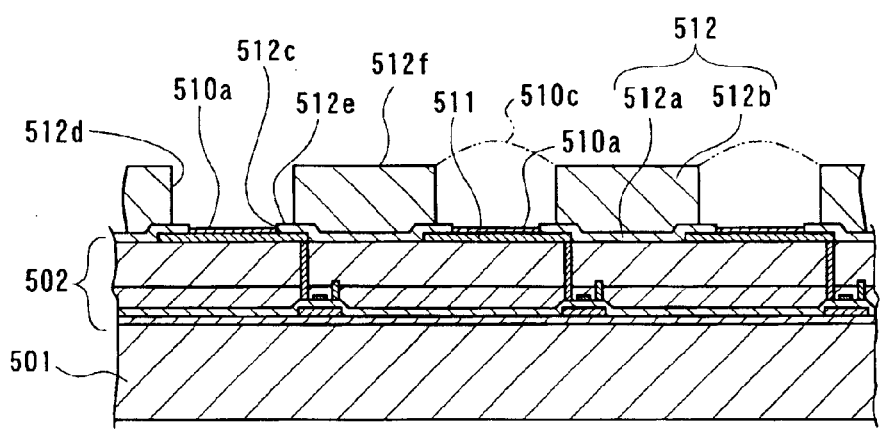
FIG. 36 is a cross-sectional view of the positive hole injection/transport layer forming process (drying) in the method of manufacturing an organic EL device.

Next, as shown in FIG. 36, in the positive hole injection/transport layer forming process, the first composition ejected is subjected to drying and heating treatments for evaporating the polar solvent contained in the first composition, whereby a positive hole injection/transport layer 510a is formed on the electrode surfaces 511a. When the drying treatment is performed, there occurs evaporation of the polar solvent contained in the droplets 510c of the first composition, at a location close to the inorganic bank layer 512a and the organic bank layer 512b, and in accordance with the evaporation, the hole injection/transport layer forming material is concentrated for precipitation.

As shown in FIG. 36, the above drying treatment also causes evaporation of the polar solvent on the electrode surfaces 511a, whereby flat portions 510a of the hole injection/transport layer forming material are formed on the electrode surfaces 511a. Since the evaporating speed of the polar solvent is approximately uniform on the electrode surfaces 511a, the hole injection/transport hole injection/transport layer forming material is approximately uniformly concentrated on the electrode surfaces 511a to thereby form the flat portions 510a having a uniform thickness.

Next, in the second liquid droplet ejection process, the second composition containing a light-emitting layer forming material is ejected onto the positive hole injection/transport layer 510a by the ink jet method (liquid droplet ejection method). In the second liquid droplet ejection process, to prevent re-dissolution of the positive hole injection/transport layer 510a, a nonpolar solvent insoluble with respect to the positive hole injection/transport layer 510a is employed as a solvent for solving the second composition used in forming the light-emitting layer.

However, the positive hole injection/transport layer 510a has a low affinity for a nonpolar solvent, and hence even if the second composition containing the nonpolar solvent is ejected onto the positive hole injection/transport layer 510a, there is a fear that the positive hole injection/transport layer 510a and the light-emitting layer 510b cannot be brought into intimate contact with each other, or the light-emitting layer 510b cannot be uniformly coated on the positive hole injection/transport layer 510a. Therefore, to increase the affinity of the surface of the positive hole injection/transport layer 510a to the nonpolar solvent and the light-emitting layer forming material, it is preferable to carry out a surface modification process before the light-emitting layer is formed.

Therefore, first, the surface modification process will be described hereinafter. In this process, a surface modification solvent, which is the same solvent or the same type of solvent as the nonpolar solvent for solving the first composition used in forming the light-emitting layer, is coated on the positive hole injection/transport layer 510a by the ink jet method (liquid droplet ejection method), the spin coating method, or a dipping method, and then dried.

Figure 37:
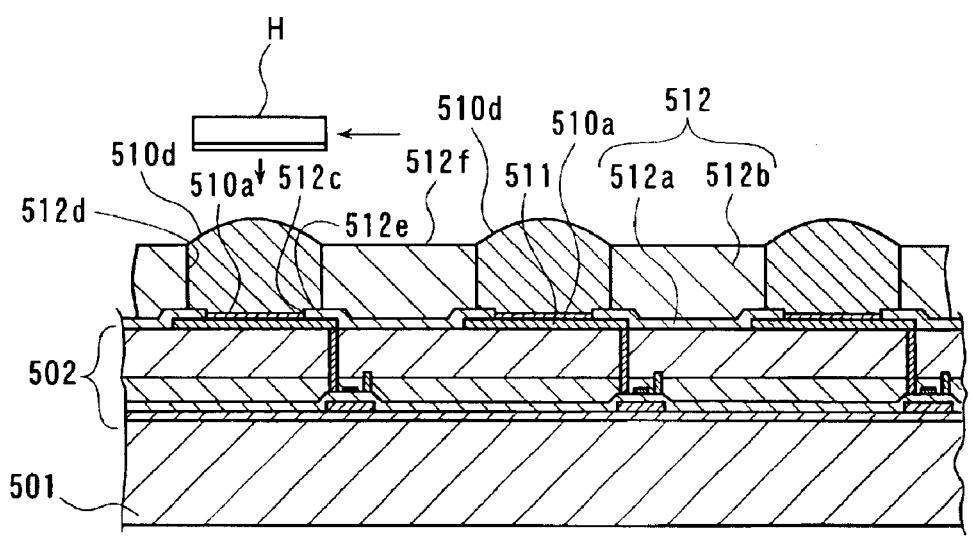
FIG. 37 is a cross-sectional view of a surface modification process (liquid droplet ejection) in the method of manufacturing an organic EL device.
Figure 38:
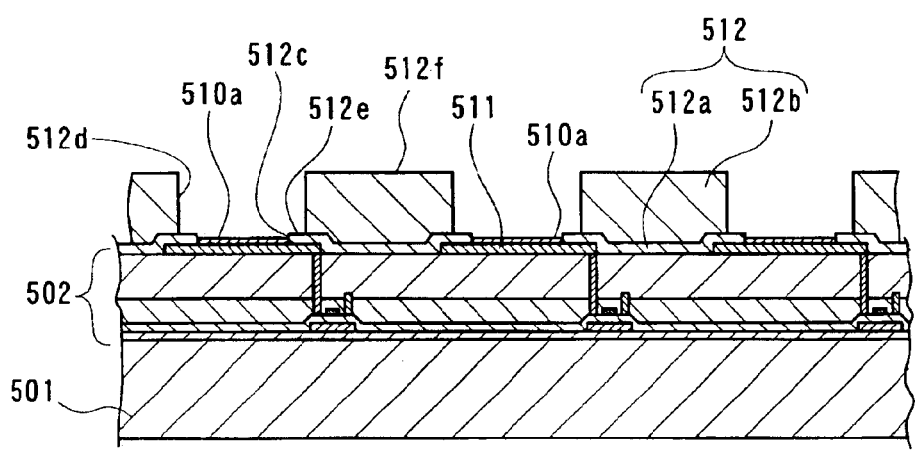
FIG. 38 is a cross-sectional view of the surface modification process (drying) in the method of manufacturing an organic EL device.

For instance, as shown in FIG. 37, coating by the ink jet method is carried out by filling the surface modification solvent in the ink jet head H, causing the nozzles of the head H to face toward the substrate (i.e. substrate formed with the positive hole injection/transport layer 510a), and ejecting the surface modification solvent 510d onto the positive hole injection/transport layer 510a from the nozzles, while moving the head H and the substrate 501 relative to each other. After that, as shown in FIG. 38, the surface modification solvent 510d is dried.

Figure 39:
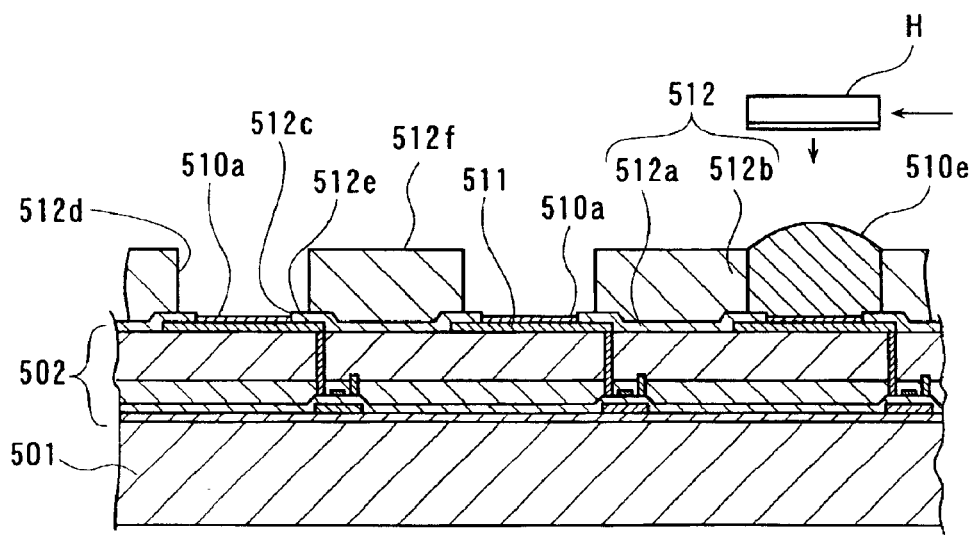
FIG. 39 is a cross-sectional view of a B light-emitting layer forming process (liquid droplet ejection) in the method of manufacturing an organic EL device.

Next, in the second liquid droplet ejection process, the second composition containing the light-emitting layer forming material is ejected onto the positive hole injection/transport layer 510a by the ink jet method (liquid droplet ejection method). As shown in FIG. 39, the second composition containing a blue (B) light-emitting layer forming material is filled in the ink jet head H, the nozzles of the head H are caused to face toward the positive hole injection/transport layer 510a located within the lower and upper openings 512c, 512d, and droplets 510e, each in a controlled amount, of the second composition are ejected the nozzles while moving the ink jet head H and the substrate 501 relative to each other whereby the droplets 510e of the second composition are ejected onto the positive hole injection/transport layer 510a.

As the light-emitting layer forming material, there may be used a polyfluorene-based polymer derivative, a (poly)

paraphenylenevinylene derivative, a polyphenylene derivatives, polyvinyl carbazole, a polythiophene derivative, a perylene-based dye, a coumarin-based dye, a rhodamine-based dye, or a material obtained by doping any of the above polymer compounds with an organic EL material. For instance, the above polymer compounds can be used by doping the same with rubrene, perylene, 9,10-diphenylanthracene, tetraphenyl butadiene, Nile red, coumarin 6, quinacridone, or the like.

As nonpolar solvents, it is preferable to use solvents insoluble to the positive hole injection/transport layer 510a, such as cyclohexylbenzene, dihydrobenzofuran, trimethylbenzene, tetramethylbenzene, and the like. By using any of the above nonpolar solvents for solving the second composition of the light-emitting layer 510b, it is possible to coat the second composition on the positive hole injection/transport layer 510a without re-dissolving the same.

As shown in FIG. 39, the ejected second composition 510e spread over the positive hole injection/transport layer 510a to fill the lower and upper openings 512c, 512d. The second composition 510e may be ejected onto the same positive hole injection/transport layer 510a not by a single operation but by a plurality of separate operations. In this case, the same amount of the second composition 510e may be ejected each time, or alternatively a different amount of the second composition 510e may be ejected each time.

Figure 40:
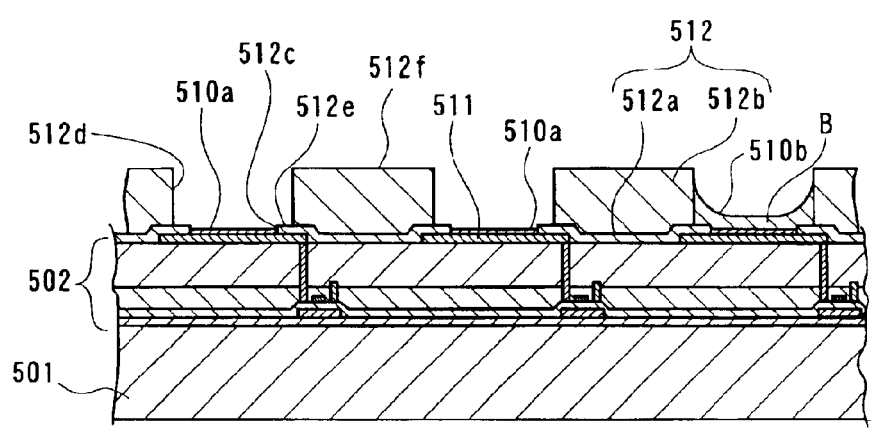
FIG. 40 is a cross-sectional view of the B light-emitting layer forming process (drying) in method of manufacturing an organic EL device.

Next, in the light-emitting layer forming process, after the second composition is ejected, it is subjected to drying and heating treatments to form the light-emitting layer 510b on the positive hole injection/transport layer 510a. The drying treatment causes the nonpolar solvent contained in the ejected second composition to be evaporated, whereby a blue (B) light-emitting layer 510b, is formed, as shown in FIG. 40.

Figure 41:
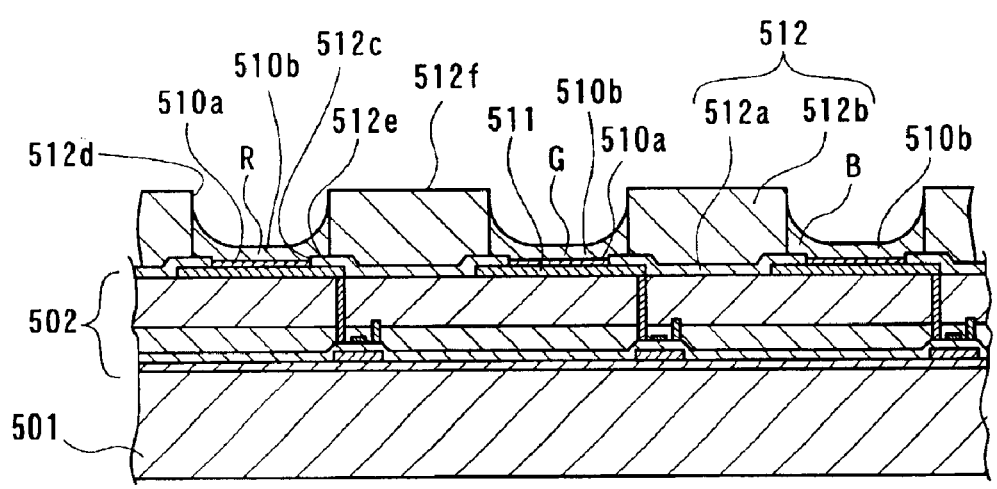
FIG. 41 is a cross-sectional view of a process for forming R.G.B light-emitting layers in the method of manufacturing an organic EL device.

Successively, as shown in FIG. 41, similarly to the case of the blue (B) light-emitting layer 510b, a red (R) light-emitting layer 510b is formed, and finally a green (G) light-emitting layer 510b is formed. It should be noted that the order of forming of the light-emitting layers 510b is not limited to the mentioned order, but the layers may be formed in any order. For instance, it is possible to determine the order of forming them depending on the materials used for forming them.

Figure 42:
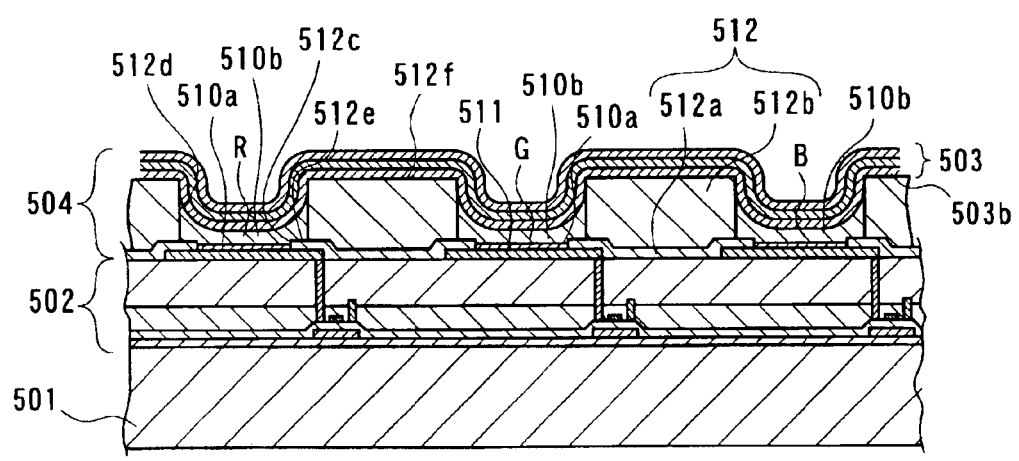
FIG. 42 is a cross-sectional view of an opposed electrode forming process in the method of manufacturing an organic EL device.

Next, as shown in FIG. 42, in the opposed electrode forming process, a cathode (opposed electrode) 503 is formed on all the surfaces of the light-emitting layer 510b and the organic bank layer 512b. It should be noted that the cathode 503 may be formed by depositing a plurality of layers of materials. For instance, preferably, a layer of a material having a lower work function is formed toward the light-emitting layer, and it is possible to use e.g. Ca, Ba, or the like. Further, it may be preferable to form a thin LiF film on a lower layer depending on the material. Further, preferably, a material having a higher work function is used on an upper side (sealing side) than on a lower side. It is preferable to form the above cathodes (cathode layers) 503 e.g. by the vapor deposition method, the sputtering method, or a CVD method. Especially, it is preferable to form them by the vapor deposition method since damage to the light-emitting layers 510b by heat can be prevented.

Further, a lithium fluoride cathode layer may be formed only on the light-emitting layer 510b. Further, it may be formed only on the blue (B) light-emitting layer 510b. In this case, the other layers, that is, the red (R) light-emitting layer 510b and the green (G) light-emitting layer 510b are adjacent to an upper cathode layer 503b made of LiF. Further, it is preferable to form an Al layer, an Ag layer or the like on the upper surface of the cathode 12 by the vapor deposition method, the sputtering method, the CVD method or the like. Furthermore, on the cathode 503, there may be formed a protective layer made of $SiO_2$, SiN, or the like, for prevention of oxidation.

Finally, in the sealing process shown in FIG. 43, a sealing substrate 505 is deposited upon an organic EL element 504 in the atmosphere of inert gas, such as nitrogen gas, argon gas, helium gas, or the like. It is preferable to carry out the sealing process in the above inert gas atmosphere. It is not preferable to carry out the sealing process in the air atmosphere, since when the sealing process is performed in the air atmosphere, if the cathode 503 has a defect, such as a pin hole, formed therein, there is a fear that water, oxygen, or the like enters the cathode 503 from the defect to oxidize the cathode 503. Finally, the cathodes 503 are connected to the wiring of a flexible board, and the wiring of the circuit element portion 502 is connected to a driving IC, whereby an organic EL device 500 according to this embodiment is obtained.

It should be noted that in forming the pixel electrode 511 and the cathode (opposed electrode) 503, the ink jet method using the ink jet heads H may be employed. More specifically, electrode materials in a liquid form are introduced into the ink jet heads H, respectively, and the pixel electrodes 511 and cathodes 503 are formed, respectively, by ejecting the electrode materials from the respective heads H (this method includes a drying process).

Similarly, the head unit according to this embodiment can be applied to a method of manufacturing an electron emitting device, a method of manufacturing a plasma display panel (PDP) device, and a method of manufacturing an electrophoresis display device.

In the method of manufacturing an electron emitting device, fluorescent materials for forming phosphors that emit fluorescent light of the colors R, G, and B are introduced into a plurality of liquid droplet ejection heads, and while moving the plurality of heads through the head unit, for main scanning and sub-scanning, the fluorescent materials are selectively ejected from the heads to thereby form a lot of phosphors on electrodes. It should be noted that the electron emitting device is a generic concept including a field emission display (FED).

In the method of manufacturing a PDP device, fluorescent materials for forming phosphors that emit fluorescent light of the colors R, G, and B are introduced into a plurality of liquid droplet ejection heads, and while moving the plurality of heads through the head unit, for main scanning and sub-scanning, the fluorescent materials are selectively ejected from the heads to thereby form phosphors in a multiplicity of respective concave portions of a back substrate.

In the method of manufacturing an electrophoresis display device, materials for forming migration elements of the colors R, G, and B are introduced into a plurality of liquid droplet ejection heads, and while moving the plurality of heads through the head unit for main scanning and sub-scanning, ink materials are selectively ejected from the heads to thereby form migration elements in a multiplicity of respective concave portions of electrodes. It should be noted that a migration element is made up of an electrically charged particle and a dye, and is preferably enclosed in a microcapsule.

On the other hand, the head unit according to this embodiment can also be applied to a spacer-forming method, a metal wiring-forming method, a lens-forming method, a resist-forming method, and a light diffuser-forming method.

The spacer-forming method is employed for forming a multiplicity of particulate spacers to form very small cell gaps between two substrates. A particle material for forming the spacers is introduced into a plurality of liquid droplet ejection heads, and while moving the plurality of heads through the head unit, for main scanning and sub-scanning, the material is selectively ejected from the heads to thereby form the spacers on at least one of the two substrates. For instance, the spacer-forming method is useful in forming cell gaps between two substrates in the liquid crystal display device and the electrophoresis display device, described above. It goes without saying that the spacer-forming method can be applied to techniques of manufacturing semiconductor devices which require very small gaps of the above-mentioned kind.

In the metal wiring-forming method, a metal material in a liquid form is introduced into a plurality of liquid droplet ejection heads, and while moving the plurality of heads through the head unit, for main scanning and sub-scanning, the metal material in the liquid form is selectively ejected from the heads to thereby form metal wiring on a substrate. The metal wiring-forming method can be employed to form, for instance, metal wiring connecting between a driver and electrodes of the above liquid crystal display device, and metal wiring connecting between TFTs or the like and electrodes of the above organic EL device. Further, it goes without saying that the metal wiring-forming method can be applied not only to the flat displays of the above-mentioned kinds but also to the general semiconductor manufacturing technique.

In the lens-forming method, a lens material is introduced into a plurality of liquid droplet ejection heads, and while moving the plurality of heads through the head unit, for main scanning and sub-scanning, the lens material is selectively ejected from the heads to thereby form a lot of microlenses on a transparent substrate. The lens-forming method can be applied e.g. to a beam converging device in the above FED device. Of course, the method can be allied to various optical devices.

In the resist-forming method, a resist material is introduced into a plurality of liquid droplet ejection heads, and while moving the plurality of heads through the head unit, for main scanning and sub-scanning, the resist material is selectively ejected from the heads to thereby form a photo-resist having a desired shape on a substrate. The resist-forming method can be widely applied, for instance, to the coating of a photoresist necessitated in a photo-lithographic method which forms a major portion of the semiconductor manufacturing technique, let alone to the forming of banks in the above display devices.

In the light diffuser-forming method for forming a multiplicity of light diffusers on a board, a light diffusing material is introduced into a plurality of liquid droplet ejection heads, and while moving the plurality of heads through the head unit, for main scanning and sub-scanning, the light diffusing material is selectively ejected from the heads to thereby form a multiplicity of light diffusers. Needless to say, this method as well can be applied to various optical devices.

As described heretofore, according to the head unit of this invention, it is possible to connect main cables to a head board through a wiring connection assembly, and at the same time, main pipes to functional liquid introducing ports through a piping connection assembly. Therefore, the operations for mounting and removing the main cables and main pipes can be easily and smoothly without causing any trouble to the functional liquid droplet ejection head. Therefore, the replacement work for the head unit can be carried out properly and efficiently.

Further, according to the method of setting the head unit and the drawing system of the invention, the operations for connecting the main cables and main pipes are carried out at temporary-setting locations in front of setting locations. This makes it possible to smoothly carry out the operations for mounting and removing the main cables and main pipes, without providing a work space for setting the drawing system. Therefore, it is possible to properly and efficiently carry out the operations for replacing head unit.

On the other hand, according to the liquid crystal display device manufacturing method, the organic EL device manufacturing method, the electron emitting device-manufacturing method, the PDP device manufacturing method, and the electrophoresis display device manufacturing method, of this invention, it is possible to easily introduce the head unit (functional liquid droplet ejection heads) suitable for filter materials and light-emitting materials used in the above devices. This makes it possible to enhance the manufacturing efficiency.

Further, according to the color filter-manufacturing method, the organic EL manufacturing method, the spacer-forming method, the metal wiring-forming method, the lens-forming method, the resist-forming method, and the light diffuser-forming method, of this invention, it is possible to easily introduce the head unit (functional liquid droplet ejection heads) suitable for filter materials and light-emitting materials used in the electronic devices and the optical devices. This makes it possible to enhance the manufacturing efficiency.

What is claimed is:

1. A head unit having a plurality of functional liquid droplet ejection heads for selectively ejecting an introduced functional liquid from ejection nozzles, and a carriage for carrying the plurality of functional liquid droplet ejection heads, wherein a plurality of main cables connected to a head driver and a plurality of main pipes connected to a functional liquid tank are connected to the respective functional liquid droplet ejection heads, the head unit comprising:

a wiring connection assembly carried on the carriage and comprising: a plurality of wiring connectors to which the respective main cables are connected; and a plurality of separate cables one end of each being connected to a head board of the respective functional liquid droplet ejection heads and an opposite end of each being connected to the respective wiring connectors; and a piping connection assembly carried on the carriage and comprising: a plurality of piping joints to which the respective main pipes are connected; and a plurality of separate pipes one end of each being connected to a functional liquid introducing port of the respective functional liquid droplet ejection heads and an opposite end of each being connected to the respective piping joints, wherein the plurality of piping joints are disposed in a position free from overlapping in a vertical direction with the plurality of functional liquid droplet ejection heads.

2. The head unit according to claim 1, wherein the plurality of wiring connectors are intensively arranged in at least one location.

3. The head unit according to claim 2, wherein the wiring connection assembly further comprises a junction board on which a wiring pattern is formed for connecting the plurality of separate cables and the plurality of wiring connectors, and to which the wiring connectors are mounted.

4. The head unit according to claim 3, wherein the wiring pattern collectively connects a plurality of ones of the plurality of separate cables to the respective wiring connectors.

5. The head unit according to claim 3, wherein the junction board is arranged above the plurality of functional liquid droplet ejection heads through a stand fixed to the carriage.

6. The head unit according to claim 3, wherein each of the separate cables has one end thereof connected to the head board through a head-side connector, and opposite end thereof connected to the junction board through a junction-side connector.

7. The head unit according to claim 6, wherein each of the separate cables is formed by a flat flexible cable, and
   wherein the head-side connector and the junction-side connector are arranged in a posture parallel to each other.

8. The head unit according to claim 7, wherein the junction-side connector is mounted on an upper surface of the junction board in a manner directed upward, and
   wherein each of the separate cables is routed through a hole formed through the junction board.

9. The head unit according to claim 1, wherein the plurality of piping joints are intensively arranged in at least one location.

10. The head unit according to claim 1, wherein the piping connection assembly is connected to the plurality of separate pipes through a plurality of piping adapters connected to the respective functional liquid introducing ports.

11. The head unit according to claim 10, further comprising an adapter holding member for collectively holding the plurality of piping adapters, and
   wherein the adapter holding member is fixed to the carriage in a state connecting each of the piping adapters to each of the functional liquid introducing ports.

12. The head unit according to claim 11, wherein the adapter holding member incorporates springs for urging the respective piping adapters toward the functional liquid introducing ports.

13. The head unit according to claim 10, further comprising a joint holding member for collectively holding the plurality of piping joints, and
   wherein the joint holding member is fixed to an end of the carriage.

14. The head unit according to claim 13, wherein the head unit is set by being slidingly moved in one direction, and
   wherein the joint holding member is fixed to a rear end of the carriage in the sliding direction, with the plurality of piping joints directed rearward in the sliding direction.

15. The head unit according to claim 10, wherein each of the separate pipes branches in a path from the piping joint to the piping adapter.

16. The head unit according to claim 1, further comprising a pair of handles fixed to the carriage, for being held by hand.

17. The head unit according to claim 1, further comprising a carriage cover covering the wiring connection assembly and the piping connection assembly.

18. A method of setting the head unit as set forth in claim 1, to a drawing system, comprising:

a temporary setting step for temporarily setting the head unit in front of a setting position in the drawing system;

a piping/wiring connection step for connecting the respective main cables to the respective wiring connectors and connecting the respective main pipes to the respective piping joints, after the temporary setting; and a final setting step for advancing the head unit from a temporary setting position into the setting position, thereby finally setting the head unit.

19. A drawing system including the head unit as set forth in claim 1, comprising:

a temporary-placing rest for temporarily setting the head unit, in front of a setting table on which the head unit is set.

20. A method of manufacturing a liquid crystal display device, wherein the head unit as set forth in claim 1 is used, and a multiplicity of filter elements are formed on a substrate of a color filter, the method comprising:

introducing filter materials of respective colors into a plurality of the functional liquid droplet ejection heads; and forming the multiplicity of filter elements by causing, through the head unit, the functional liquid droplet ejection heads to scan relative to the substrate and selectively eject the filter materials.

21. A method of manufacturing an organic EL device, wherein the head unit as set forth in claim 1 is used, and EL light-emitting layers are formed on a multiplicity of pixels on a substrate, the method comprising:

introducing light-emitting materials of respective colors into a plurality of the functional liquid droplet ejection heads; and forming a multiplicity of the EL light-emitting layers by causing, through the head unit, the functional liquid droplet ejection heads to scan relative to the substrate and selectively eject the light-emitting materials.

22. A method of manufacturing an electron emitting device, wherein the head unit as set forth in claim 1 is used, and a multiplicity of phosphors are formed on electrodes, the method comprising:

introducing fluorescent materials into a plurality of the functional liquid droplet ejection heads; and forming the multiplicity of phosphors by causing, through the head unit, the functional liquid droplet ejection heads to scan relative to the electrodes and selectively eject the fluorescent materials.

23. A method of manufacturing a PDP device, wherein the head unit as set forth in claim 1 is used, and phosphors are formed in a multiplicity of respective concave portions of a back substrate, the method comprising:

introducing fluorescent materials into a plurality of the functional liquid droplet ejection heads; and forming a multiplicity of the phosphors by causing, through the head unit, the functional liquid droplet ejection heads to scan relative to the back substrate and selectively eject the fluorescent materials.

24. A method of manufacturing an electrophoresis display device, wherein the head unit as set forth in claim 1 is used, and migration elements are formed in a multiplicity of concave portions of electrodes, the method comprising:

introducing migration element materials into a plurality of the functional liquid droplet ejection heads; and forming a multiplicity of the migration elements by causing, through the head unit, the functional liquid droplet ejection heads to scan relative to the electrodes and selectively eject the migration element materials.

25. A method of manufacturing a color filter comprising a multiplicity of filter elements arranged on a substrate, by using the head unit as set forth in claim 1, the method comprising:
   introducing filter materials into a plurality of the functional liquid droplet ejection heads; and
   forming the multiplicity of filter elements by causing, through the head unit, the functional liquid droplet ejection heads to scan relative to the substrate and selectively eject the filter materials.

26. The method according to claim 25, wherein an overcoating layer covering the multiplicity of filter elements is formed, the method further comprising, subsequent to forming of the filter elements:
   introducing a transparent coating material into the plurality of the functional liquid droplet ejection heads; and
   forming the overcoating layer by causing, through the head unit, the functional liquid droplet ejection heads to scan relative to the substrate and selectively eject the coating material.

27. A method of manufacturing an organic EL comprising a multiplicity of pixels, including EL light-emitting layers, arranged on a substrate, by using the head unit as set forth in claim 1, the method comprising:
   introducing light-emitting materials of respective colors into a multiplicity of the functional liquid droplet ejection heads; and
   forming a multiplicity of the EL light-emitting layers by causing, through the head unit, the functional liquid droplet ejection heads to scan relative to the substrate and selectively eject the light-emitting materials.

28. The method according to claim 27, wherein a multiplicity of pixel electrodes are formed between the multiplicity of the EL light-emitting layers and the substrate in a manner associated with the EL light-emitting layers, the method further comprising:
   introducing a liquid-state electrode material into a plurality of the functional liquid droplet ejection heads; and
   forming the multiplicity of pixel electrodes, by causing, through the head unit, the functional liquid droplet ejection heads to scan relative to the substrate and selectively eject the liquid-state electrode material.

29. The method according to claim 28, wherein opposed electrodes are formed in a manner covering the multiplicity of the EL light-emitting layers, the method further comprising, subsequent to forming of the EL light-emitting layers:
   introducing a liquid-state electrode material into a plurality of the functional liquid droplet ejection heads; and
   forming the opposed electrodes, by causing, through the head unit, the functional liquid droplet ejection heads to scan relative to the substrate and selectively eject the liquid-state electrode material.

30. A spacer-forming method for forming a multiplicity of particulate spacers to form very small cell gaps between two substrates, by using the head unit as set forth in claim 1, the method comprising:
   introducing a particle material for forming the spacers into a plurality of the functional liquid droplet ejection heads; and
   causing, through the head unit, the functional liquid droplet ejection heads to scan relative to at least one of the two substrates and selectively eject the particle material, thereby forming the spacers on the substrate.

31. A metal wiring-forming method for forming metal wiring on a substrate, by using the head unit as set forth in claim 1, the method comprising:
   introducing a liquid-state metal material into a plurality of the functional liquid droplet ejection heads; and
   forming the metal wiring by causing, through the head unit, the functional liquid droplet ejection heads to scan relative to the substrate and selectively eject the metal material.

32. A lens-forming method for forming a multiplicity of microlenses on a substrate, by using the head unit as set forth in claim 1, the method comprising:
   introducing a lens material into a plurality of the functional liquid droplet ejection head; and
   forming the multiplicity of microlenses by causing, through the head unit, the functional liquid droplet ejection heads to scan relative to the substrate and selectively eject the lens material.

33. A resist-forming method for forming a resist of a desired shape on a substrate, by using the head unit as set forth in claim 1, the method comprising:
   introducing a resist material into the functional liquid droplet ejection head; and
   forming the resist by causing a plurality of the functional liquid droplet ejection heads to scan relative to the substrate and selectively eject the resist material.

34. A light diffuser-forming method for forming a multiplicity of light diffusers on a substrate, by using the head unit as set forth in claim 1, the method comprising:
   introducing a light diffusing material into a plurality of the functional liquid droplet ejection heads; and
   forming the multiplicity of light diffusers by causing, through the head unit, the functional liquid droplet ejection heads to scan relative to the substrate and selectively eject the light diffusing material.

35. A head unit having a plurality of functional liquid droplet ejection heads for selectively ejecting an introduced functional liquid from ejection nozzles, and a carriage for carrying the plurality of functional liquid droplet ejection heads, wherein a plurality of main cables connected to a head driver and a plurality of main pipes connected to a functional liquid tank are connected to the respective functional liquid droplet ejection heads, the head unit comprising:
   a piping connection assembly carried on the carriage and comprising: a plurality of piping joints to which the respective main pipes are connected; and a plurality of separate pipes one end of each being connected to a functional liquid introducing port of the respective functional liquid droplet ejection heads and an opposite end of each being connected to the respective piping joints, wherein the plurality of piping joints are disposed in a position free from overlapping in a vertical direction with the plurality of functional liquid droplet ejection heads.

* * * * *